(12) United States Patent
Tien et al.

(10) Patent No.: US 12,040,287 B2
(45) Date of Patent: *Jul. 16, 2024

(54) SEMICONDUCTOR DEVICE PACKAGE AND METHOD FOR MANUFACTURING THE SAME

(71) Applicant: Advanced Semiconductor Engineering, Inc., Kaohsiung (TW)

(72) Inventors: Hsing Kuo Tien, Kaohsiung (TW); Chih-Cheng Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/963,067

(22) Filed: Oct. 10, 2022

(65) Prior Publication Data
US 2023/0033515 A1    Feb. 2, 2023

Related U.S. Application Data

(63) Continuation of application No. 16/938,818, filed on Jul. 24, 2020, now Pat. No. 11,469,186.

(51) Int. Cl.
*H01L 23/00* (2006.01)
*H01L 21/48* (2006.01)
(Continued)

(52) U.S. Cl.
CPC ........ *H01L 23/562* (2013.01); *H01L 21/4857* (2013.01); *H01L 23/5383* (2013.01);
(Continued)

(58) Field of Classification Search
CPC ............... H01L 23/562; H01L 21/4857; H01L 23/5383; H01L 23/5385; H01L 23/5389; H01L 25/16
See application file for complete search history.

(56) References Cited

U.S. PATENT DOCUMENTS 9,167,692 B2   10/2015 Shimizu et al.
11,469,186 B2 * 10/2022 Tien .................... H01L 21/6835
(Continued)

OTHER PUBLICATIONS

Final Office Action for U.S. Appl. No. 16/938,818, issued Mar. 18, 2022, 6 pages.
(Continued)

*Primary Examiner* — Fernando L Toledo
*Assistant Examiner* — Neil R Prasad
(74) *Attorney, Agent, or Firm* — FOLEY & LARDNER LLP

(57) ABSTRACT

A semiconductor device package and method for manufacturing the same are provided. The semiconductor device package includes a first conductive structure, a stress buffering layer and a second conductive structure. The first conductive structure includes a substrate, and a first circuit layer disposed on the substrate. The first circuit layer includes a conductive wiring pattern, and the conductive wiring pattern is an uppermost conductive pattern of the first circuit layer. The stress buffering structure is disposed on the first conductive structure. The second conductive structure is disposed over the stress buffering structure. The conductive wiring pattern extends through the stress buffering structure and electrically connected to the second conductive structure, and an upper surface of the conductive wiring pattern is substantially coplanar with an upper surface of the stress buffering structure.

20 Claims, 54 Drawing Sheets

(51) Int. Cl.
*H01L 23/538* (2006.01)
*H01L 25/16* (2023.01)
(52) U.S. Cl.
CPC ...... *H01L 23/5385* (2013.01); *H01L 23/5389* (2013.01); *H01L 25/16* (2013.01)

(56) References Cited

U.S. PATENT DOCUMENTS

| | | | |
|---|---|---|---|
| 2012/0074562 A1* | 3/2012 | Yu | H01L 23/49894 257/737 |
| 2015/0001738 A1* | 1/2015 | Shimizu | H05K 1/181 257/778 |
| 2017/0194248 A1 | 7/2017 | Das | |
| 2018/0366437 A1 | 12/2018 | Chen et al. | |
| 2021/0050306 A1 | 2/2021 | Link et al. | |

OTHER PUBLICATIONS

Non-Final Office Action for U.S. Appl. No. 16/938,818, issued Sep. 1, 2021, 10 pages.
Notice of Allowance for U.S. Appl. No. 16/938,818, issued Jun. 3, 2022, 7 pages.

\* cited by examiner

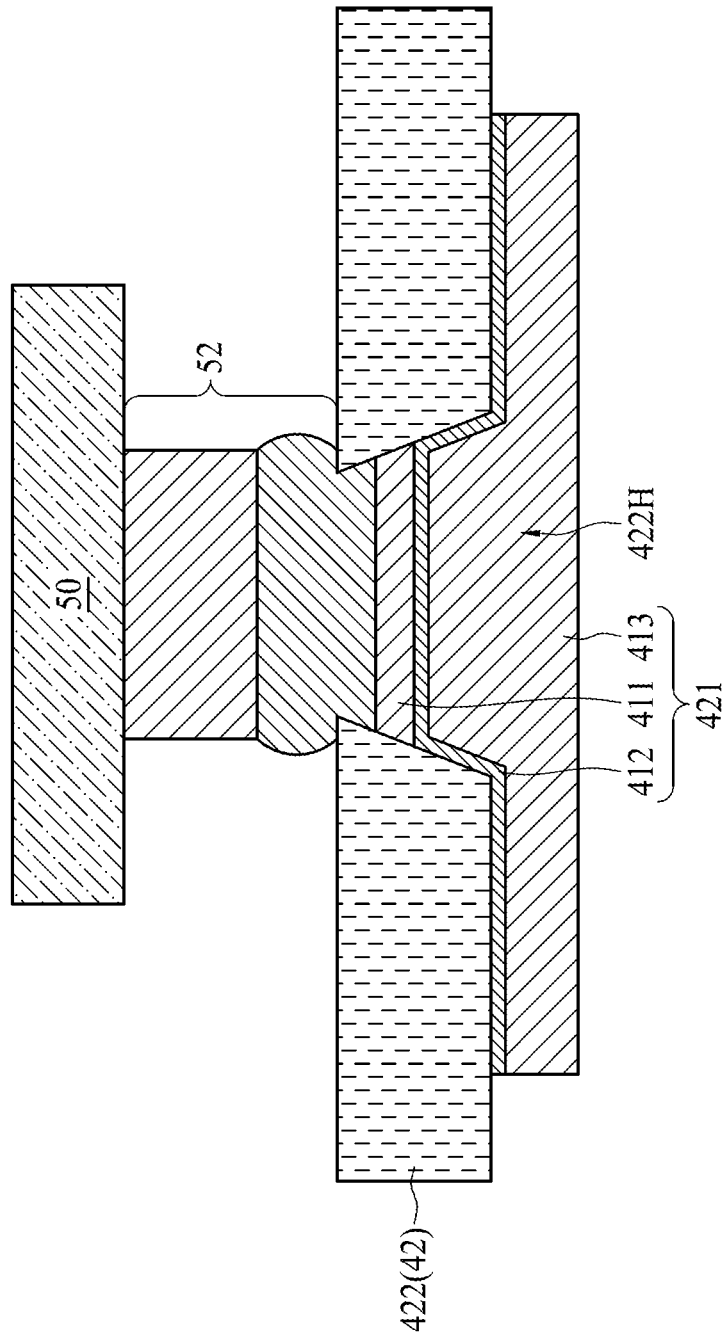

SEMICONDUCTOR DEVICE PACKAGE AND METHOD FOR MANUFACTURING THE SAME

CROSS-REFERENCE TO RELATED APPLICATION

This application is a continuation of U.S. patent application Ser. No. 16/938,818 filed Jul. 24, 2020, now issued as U.S. Pat. No. 11,469,186, the contents of which is incorporated herein by reference in its entirety.

BACKGROUND

1. Technical Field

The present disclosure relates to a semiconductor device package and a method for manufacturing the same, and to a semiconductor device package including a stress buffering layer or a patterned passivation layer and a method for manufacturing the same.

2. Description of the Related Art

Along with the rapid development in electronics industry and the progress of semiconductor processing technologies, semiconductor chips are integrated with an increasing number of electronic components to achieve improved electrical performance and additional functions. Accordingly, the semiconductor chips are provided with more input/output (I/O) connections. To manufacture semiconductor packages including semiconductor chips with an increased number of I/O connections, circuit layers of semiconductor substrates used for carrying the semiconductor chips may correspondingly increase in size. Thus, a thickness and a warpage of a semiconductor device package may correspondingly increase, and a yield of the semiconductor device package may decrease.

SUMMARY

In some embodiments, a semiconductor device package includes a first conductive structure, a stress buffering layer and a second conductive structure. The first conductive structure includes a substrate, and a first circuit layer disposed on the substrate. The first circuit layer includes a conductive wiring pattern, and the conductive wiring pattern is an uppermost conductive pattern of the first circuit layer. The stress buffering structure is disposed on the first conductive structure. The second conductive structure is disposed over the stress buffering structure. The conductive wiring pattern extends through the stress buffering structure and electrically connected to the second conductive structure, and an upper surface of the conductive wiring pattern is substantially coplanar with an upper surface of the stress buffering structure.

In some embodiments, a semiconductor device package includes a first conductive structure, a stress buffering structure and a second conductive structure. The first conductive structure includes a substrate, and a first circuit layer disposed on the substrate. The first circuit layer includes a conductive wiring pattern. The stress buffering structure is disposed on the first conductive structure. The second conductive structure is disposed over the stress buffering structure. The conductive wiring pattern includes a via portion including an edge surrounded by the stress buffering structure, and a pad portion disposed on the stress buffering structure. A height difference between an upper surface of the pad portion and an upper surface of the stress buffering structure is less than or equal to 4 micrometers.

In some embodiments, a method of manufacturing a semiconductor device package includes the following operations. A substrate is provided. A conductive wiring pattern is formed on the substrate. A stress buffering layer is formed on the substrate to cover the conductive wiring pattern. The stress buffering layer is thinned to expose an upper surface of the conductive wiring pattern. A circuit layer is formed on the stress buffering layer and electrically connected to the conductive wiring pattern.

In some embodiments, a method of manufacturing a semiconductor device package includes the following operations. A substrate is provided. A stress buffering structure is formed on the substrate. The stress buffering structure is perforated to form a hole. The conductive wiring pattern including a via portion in the hole, and a dummy pad pattern on the stress buffering structure is formed. The dummy pad portion is removed. A replacing pad portion is formed on the via portion.

BRIEF DESCRIPTION OF THE DRAWINGS

Aspects of some embodiments of the present disclosure are readily understood from the following detailed description when read with the accompanying figures. Various structures may not be drawn to scale, and the dimensions of the various structures may be arbitrarily increased or reduced for clarity of discussion.

FIG. 5A, FIG. 5B, FIG. 5C, FIG. 5D and FIG. 5E illustrate sub-operations of manufacturing a semiconductor device package in accordance with some embodiments of the present disclosure.

DETAILED DESCRIPTION

Figure 1:
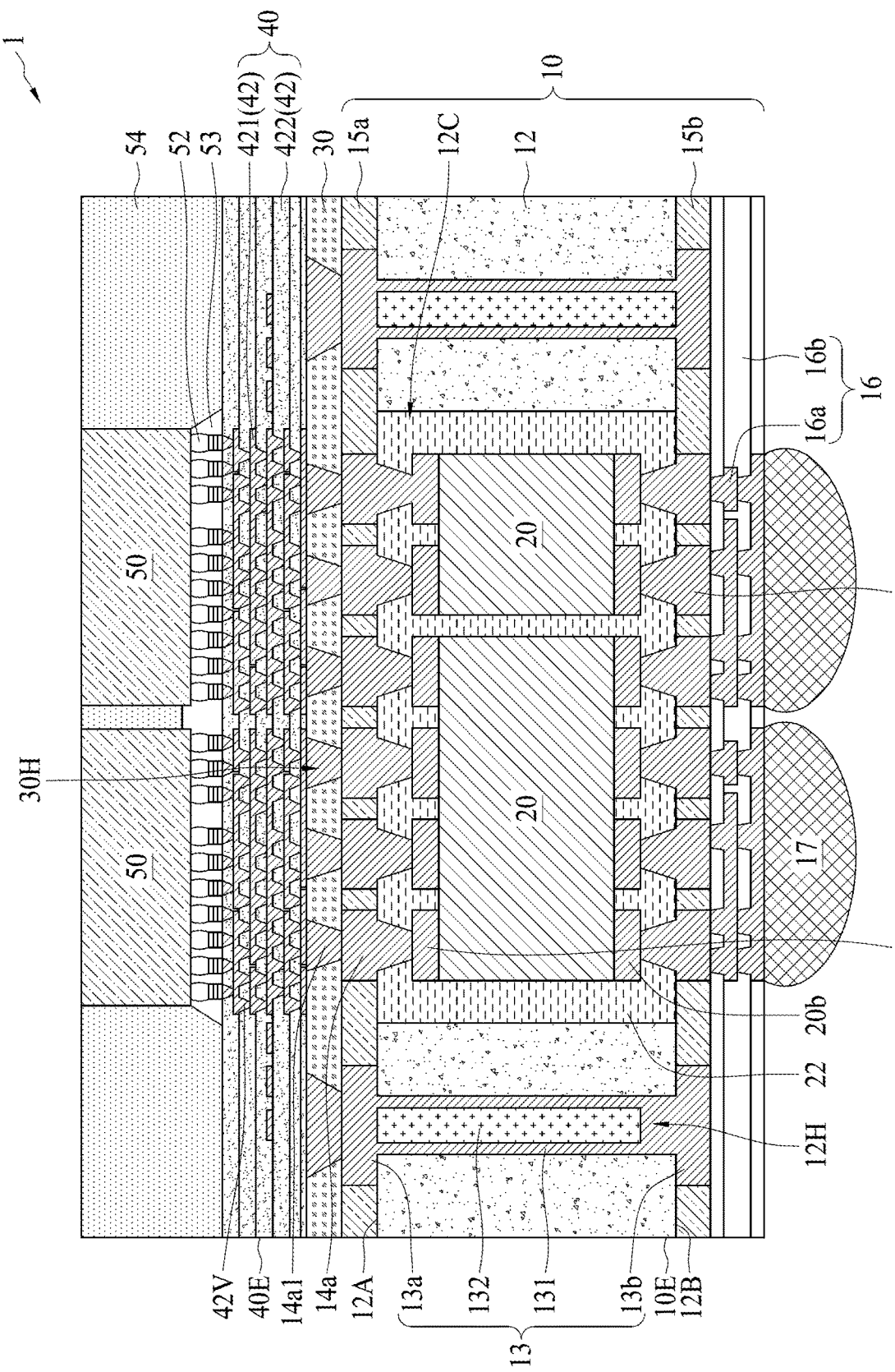
FIG. 1 is a cross-sectional view of a semiconductor device package in accordance with some embodiments of the present disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

The present disclosure provides a solution to integrating low-density conductive structure such as conductive substrate, passive electronic component such as capacitor, high-density conductive structure such as fan-out circuit, and active electronic component such as ASIC component or memory component. The passive electronic component is embedded in the substrate, which can reduce overall thickness of the semiconductor device package. The active electronic component is vertically stacked on the passive electronic component, and thus signal transmission path between the passive electronic component and the active electronic component can be shortened. The semiconductor device package further includes a stress buffering layer disposed between the first conductive structure and the second conductive structure. The CTE of the stress buffering layer is between the CTE of the first conductive structure and the CTE of the second conductive structure such that warpage and delamination issue can be alleviated. The stress buffering layer can also be configured as a planarization layer for the first conductive structure, and thus the second conductive structure can be directly fabricated on the first conductive structure without requiring large-size solder balls. Accordingly, electric performance can be improved. The semiconductor device package further includes a patterned passivation layer disposed between the first conductive structure and the second conductive structure. The openings of the passivation layer allow conductive bumps of the second conductive structure to insert, and thus the robustness of bonding between the second conductive structure and the first conductive structure can be enhanced. The passivation layer may be a photo-sensitive passivation layer, which can be patterned by photolithography operation, and thus the dimension of the opening can be minimized to for example lower than 50 micrometers. According, the number of I/O connections can be increased.

Figure 1A:
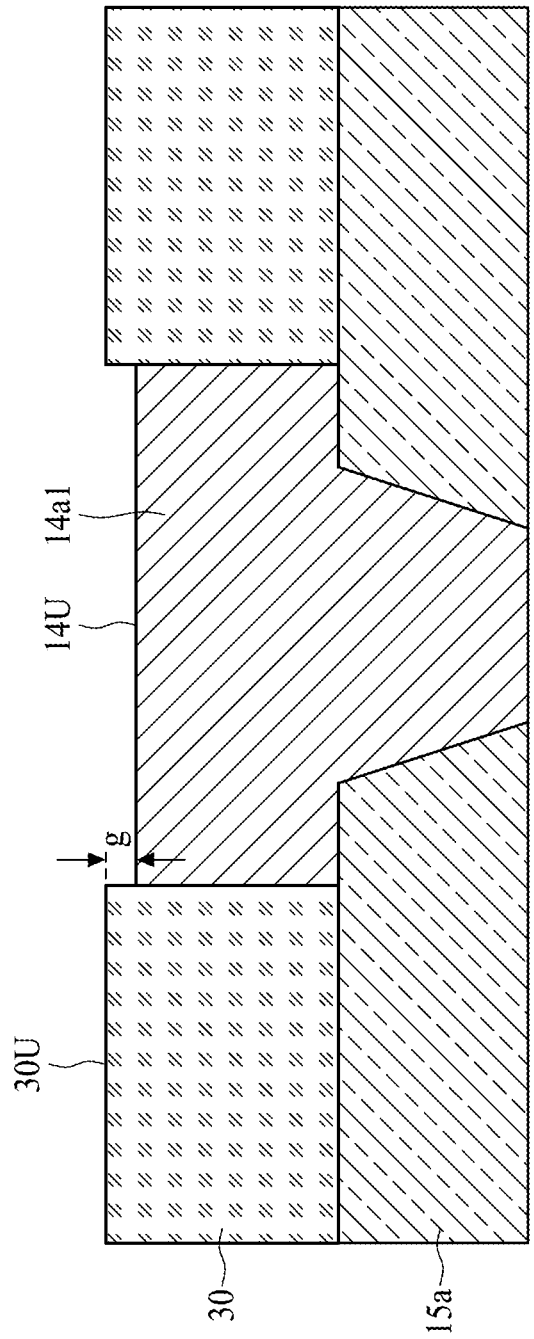
FIG. 1A is an enlarged view of a semiconductor device package in FIG. 1.

FIG. 1 is a cross-sectional view of a semiconductor device package 1 in accordance with some embodiments of the present disclosure, and FIG. 1A is an enlarged view of a semiconductor device package 1 in FIG. 1. As shown in FIG. 1, the semiconductor device package 1 includes a first conductive structure 10, a stress buffering layer 30, and a second conductive structure 40. The first conductive structure 10 may include a substrate 12 having an upper surface 12A, and a bottom surface 12B opposite to the upper surface 12A. The material of the substrate 12 may include dielectric material or insulating material. The substrate 12 may be a core substrate, a coreless substrate, or other suitable substrate. The substrate 12 may define at least one through hole 12H. At least one interconnection via 13 is disposed in the through hole 12H. The interconnection via 13 may include a base conductive layer 131 and an insulation material 132. The base conductive layer 131 is disposed or formed on a side wall of the through hole 12H, and defines a central through hole. The insulation material 132 fills the central through hole defined by the base conductive layer 131. In some embodiments, the insulation material 132 may be omitted, and a bulk conductive material may fill the through hole 12H to form the interconnection via. In some embodiments, the interconnection via 13 may further include an upper electrode 13a and a bottom electrode 13b respectively disposed on the upper surface 12A and the bottom surface 12B, and electrically connected to the base conductive layer 131.

The substrate 12 may define at least one cavity 12C. The cavity 12C may be a through cavity that penetrates the substrate 12, or a recess that recesses from the upper surface 12A without penetrating the substrate 12. The first conductive structure 10 includes at least one first electronic component 20 embedded in the substrate 12. The first electronic component 20 may be disposed in the cavity 12C, and lower than the upper surface 12A of the substrate 12. In some other embodiments, the first electronic component 20 may be leveled with or higher than the upper surface 12A of the substrate 12. The first electronic component 20 may include a passive electronic component such as a capacitor, a resistor, an inductor or a combination thereof. The first electronic component 20 may include at least one upper electrode 20*a* and at least one bottom electrode 20*b*.

The first conductive structure 10 may include a filling material 22 in the cavity 12C encapsulating the first electronic component 20. The filling material 22 may encapsulate sidewalls of the first electronic component 20. The filling material 22 may further encapsulate upper surface and/or bottom surface of the first electronic component 20. The filling material 22 may partially encapsulate the upper electrode 20*a* and the bottom electrode 20*b*. The material of the filling material 22 may include resin, ink (e.g. Ajinomoto build-up film (ABF) ink), or molding compound. The filling material 22 may have no fillers. Alternatively, the filling material 22 may have fillers with a size of 1-2 micrometers or less. In addition, a film loss of the filling material 22 may be less than 0.4% so as to resist the chemical etching.

The first conductive structure 10 further includes at least one upper circuit layer (also referred to as first circuit layer) 14*a* disposed on the upper surface 12A of the substrate 12, and electrically connected to the first electronic component 20 through the upper electrode 20*a*. In some embodiments, at least one upper dielectric layer 15*a* may be disposed on the upper surface 12A. In some embodiments, the upper circuit layer 14*a* may penetrate the upper dielectric layer 15*a*. The upper circuit layer 14*a* may be disposed on, adjacent to, or embedded in and exposed by the upper dielectric layer 15*a*. In some embodiments, the upper circuit layer 14*a* may include a substrate-level circuit layer, which is a low-density circuit layer with wider line width/line space (L/S). For example, the L/S of the upper circuit layer 14*a* may be equal to or greater than about 10 µm/about 10 µm.

In some embodiments, the first conductive structure 10 may further include at least one bottom circuit layer 14*b* disposed on the bottom surface 12B of the substrate 12, and electrically connected to the first electronic component 20 through the bottom electrode 20*b*. In some embodiments, at least one bottom dielectric layer 15*b* may be disposed on the bottom surface 12B. In some embodiments, the bottom circuit layer 14*b* may penetrate the bottom dielectric layer 15*b*. In some embodiments, the bottom circuit layer 14*b* may include a substrate-level RDL, which is a low-density RDL with wider L/S. For example, the L/S of the bottom RDL 16 may be equal to or greater than about 10 µm/about 10 µm. The L/S of the bottom circuit layer 14*b* may be equal to that of the upper circuit layer 14*a*.

In some embodiments, a bottom redistribution layer (RDL) 16 may be disposed on the bottom surface 12B, and electrically connected to the bottom circuit layer 14*b*. The bottom RDL 16 may include one or more wiring layers 16*a*, and one or more dielectric layers 16*b* stacked to each other. The L/S of the bottom RDL 16 may be substantially equal to or larger than that of the upper circuit layer 14*a* or the bottom circuit layer 14*b*. In some embodiments, the bottom RDL 16 includes a substrate-level RDL, which is a low-density RDL with wider L/S. For example, the L/S of the bottom RDL 16 may be equal to or greater than about 10 µm/about 10 µm. In some embodiments, one or more electrical conductors 17 such as solder balls may be disposed on and electrically connected to the bottom RDL 16 to facilitate external electrical connection. For example, the electrical conductors 17 may be further bonded to a circuit board such as a printed circuit board (PCB) or the like.

In some embodiments, an uppermost layer of the upper circuit layer 14*a* may include at least one conductive wiring pattern 14*a*1 protruding out from the upper dielectric layer 15*a*. The cross-section shape of the conductive wiring pattern 14*a*1 may be an inversed trapezoid shape, a rectangular shape, a barrel shape or other geometric shape.

The stress buffering layer 30 is disposed on the substrate 12. The material of the stress buffering layer 30 may be insulating or dielectric. The material of the stress buffering layer 30 may include organic material, inorganic material or a hybrid material. The conductive wiring pattern 14*a*1 extends through the stress buffering layer 30, and at least a portion of the conductive wiring pattern 14*a*1 such as an upper surface is exposed from the stress buffering layer 30.

The second conductive structure 40 is disposed on the stress buffering layer 30 and the conductive wiring pattern 14*a*1 of the upper circuit layer 14*a*. The second conductive structure 40 includes at least one circuit layer (also referred to as second circuit layer) 42 electrically connected to the upper circuit layer 14*a*. In some embodiments, the circuit layer 42 may include at least one conductive wiring pattern 421 and at least one dielectric layer 422 stacked to each other. In some embodiments, the conductive wiring pattern 421 may include a plurality of conductive vias 42V. The conductive via 42V may, but is not limited to, have an inversed trapezoid cross-sectional shape. A bottommost conductive wiring pattern 421 may be exposed from a bottommost dielectric layer 422, and electrically connected to the conductive wiring pattern 14*a*1 of the upper circuit layer 14*a* of the first conductive structure 10. In some embodiments, the circuit layer 42 may be built up on the upper circuit layer 14*a* layer by layer. For example, the upper circuit layer 14*a* may be formed on the upper circuit layer 14*a* by various operations including deposition such as electroplating, patterning such as photolithography and/or etching, planarization such as grinding, and the like. In some embodiments, the material of the conductive wiring pattern 421 may include metal such as copper, which can be formed by electroplating. The material of the dielectric layer 422 may include photo-sensitive material, which can be patterned by photolithography. The joint between the conductive wiring pattern 14*a*1 of the upper circuit layer 14*a* and the bottommost conductive wiring pattern 421 of the circuit layer 42 may be a solder-free joint. By way of example, the bottommost conductive wiring pattern 421 of the circuit layer 42 may be directly extended from the conductive wiring pattern 14*a*1 of the upper circuit layer 14*a*. In other words, the circuit layer 42 of some embodiments is not a pre-formed circuit layer bonded to the upper circuit layer 14*a*. An uppermost conductive wiring pattern 421 may be disposed on, adjacent to, or embedded in and exposed by an uppermost dielectric layer 422 for further electrical connection. In some embodiments, an edge 10E of the first conductive structure 10 is substantially aligned with an edge 40E of the second conductive structure 40. The L/S of the circuit layer 42 of the second conductive structure 40 may be lower than that of the upper circuit layer 14*a* of the first conductive structure 10. The circuit layer 42 may include a bumping-level circuit layer, which is a high-density circuit layer with narrower L/S. For example, the L/S of the circuit layer 42 may be between about 2 µm/about 2 µm and about 10 µm/about 10 or less than about 2 µm/about 2 µm. By way of example, the second conductive structure 40 may be a fan-out (FO) structure.

The semiconductor device package 1 may further include at least one second electronic component 50 disposed on and electrically connected to the second conductive structure 40 through, for example the uppermost conductive wiring pattern 421. In some embodiments, the second electronic component 50 may include an active electronic component. By way of example, the active electronic component may include an integrated circuit (IC) component such as an application specific IC (ASIC), a memory component or a combination thereof. Conductive bumps 52 may be disposed between the second electronic component 50 and the second conductive structure 40 to electrically connect the second electronic component 50 to the circuit layer 42. The conductive bumps 52 may include solder bumps or other suitable conductors. In some embodiments, an underfill layer 53 may be disposed between the second electronic component 50 and the second conductive structure 40, surrounding the conductive bumps 52. The active electronic component such as the second electronic component 50 is vertically stacked on the passive electronic component such as the first electronic component 20. Accordingly, signal transmission path between the passive electronic component and the active electronic component can be shortened, and energy loss during signal transmission can be reduced. In addition, power consumption can be lowered, and performance can be improved.

An encapsulation layer 54 may be disposed on the second conductive structure 40 to encapsulate the second electronic component 50. In some embodiments, the encapsulation layer 54 may encapsulate sidewalls of the second electronic component 50, and expose upper surface of the second electronic component 50. Alternatively, the encapsulation layer 54 may encapsulate sidewalls and upper surface of the second electronic component 50.

In some embodiments, the first conductive structure 10 may be also referred to as "a low-density conductive structure" or "a low-density stacked structure", and the second conductive structure 40 may be also referred to as "a high-density conductive structure" or "a high-density stacked structure." The line width/line space (L/S) of the circuit layer 42 of the second conductive structure 40 may be less than an L/S of the upper circuit layer 14a of the first conductive structure 10. By way of example, the L/S of the circuit layer 42 may be between about 2 μm/about 2 μm and about 10 μm/about 10 μm, and the L/S of the upper circuit layer 14a may be equal to or greater than about 10 μm/about 10 μm. The high-density second conductive structure 40 may be configured as fan-out circuit to electrically connect the second electronic component 50 with more I/O connections, and to redistribute the I/O connections to the low-density first conductive structure 10. The low-density first conductive structure 10 may be configured to transmit the redistributed I/O connections from the second conductive structure 40 to a PCB.

The stress buffering layer 30 is disposed between the first conductive structure 10 and the second conductive structure 40 to help balance stress variation. The coefficient of thermal expansion (CTE) of the stress buffering layer 30 is selected to be between the CTE of the first conductive structure 10 and the CTE of the second conductive structure 40 to help balance stress variation between the first conductive structure 10 and the second conductive structure 40 to alleviate warpage of the semiconductor device package 1. By way of example, the CTE of the stress buffering layer 30 is about 20 ppm/° C., the CTE of the first conductive structure 10 is about 15 ppm/° C., and the CTE of the second conductive structure 40 is about 40 ppm/° C. The stress buffering layer 30 may also be configured as a planarization layer for improve yield of building up the circuit layer 42. In some embodiments, an upper surface 30U of the stress buffering layer 30 and an upper surface 14U of the conductive wiring pattern 14a1 are substantially coplanar. Due to process limits or other unexpected reasons, the upper surface 14U of the conductive wiring pattern 14a1 may be slightly lower than the upper surface 30U of the stress buffering layer 30 as shown in FIG. 1A. When the degree of recession of the upper surface 14U is acceptable, which would not affect formation of the circuit layer 42, the upper surface 30U of the stress buffering layer 30 and the upper surface 14U of the conductive wiring pattern 14a1 can be considered coplanar. For example, a height difference "g" between the upper surface 30U of the stress buffering layer 30 and the upper surface 14U of the conductive wiring pattern 14a1 is less than about 5 micrometers, such that the circuit layer 42 of the second conductive structure 40 can be easily built up on the conductive wiring pattern 14a1 and the stress buffering layer 30.

Figure 2A:
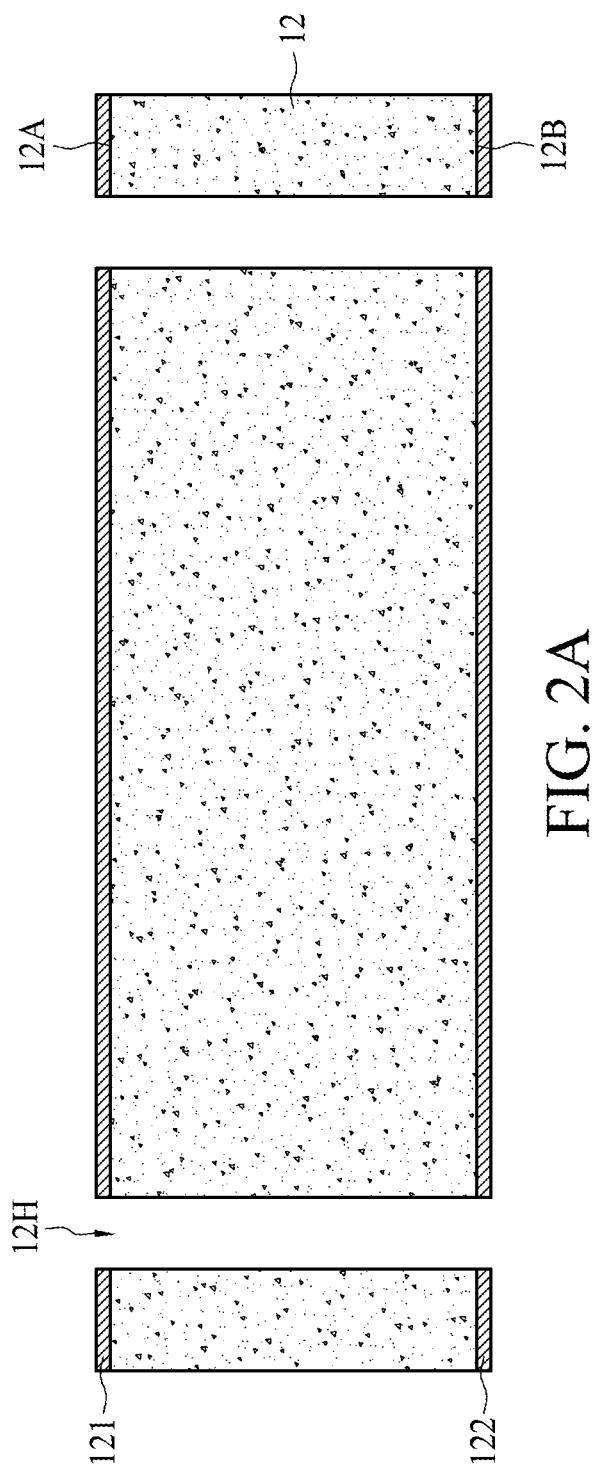
FIG. 2A, FIG. 2B, FIG. 2C, FIG. 2D, FIG. 2E, FIG. 2F, FIG. 2G, FIG. 2H, FIG. 2I, FIG. 2J, FIG. 2K, FIG. 2L and FIG. 2M illustrate operations of manufacturing a semiconductor device package in accordance with some embodiments of the present disclosure.
Figure 2B:
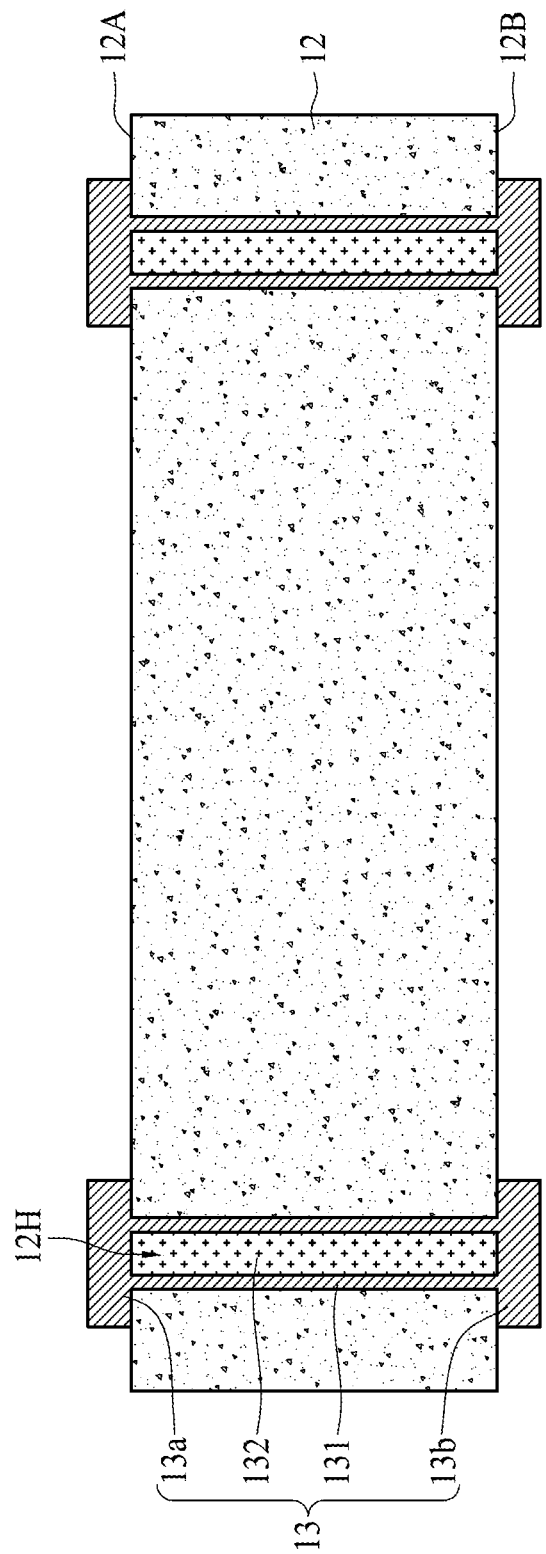

FIG. 2A, FIG. 2B, FIG. 2C, FIG. 2D, FIG. 2E, FIG. 2F, FIG. 2G, FIG. 2H, FIG. 2I, FIG. 2J, FIG. 2K, FIG. 2L and FIG. 2M illustrate operations of manufacturing a semiconductor device package 1 in accordance with some embodiments of the present disclosure. As shown in FIG. 2A, a substrate 12 is received. In some embodiments, an upper copper foil 121 and a bottom copper foil 122 may be formed on the upper surface 12A and the bottom surface 12B, respectively. A through hole 12H is formed to penetrate the substrate 12. As shown in FIG. 2B, an interconnection via 13 is formed in the through hole 12H. The interconnection via 13 may include a base conductive layer 131 and an insulation material 132. The base conductive layer 131 is disposed or formed on a side wall of the through hole 12H. The insulation material 132 fills in the through hole 12H. In some embodiments, the interconnection via 13 may further include an upper electrode 13a and a bottom electrode 13b respectively disposed on the upper surface 12A and the bottom surface 12B, and electrically connected to the base conductive layer 131.

Figure 2C:
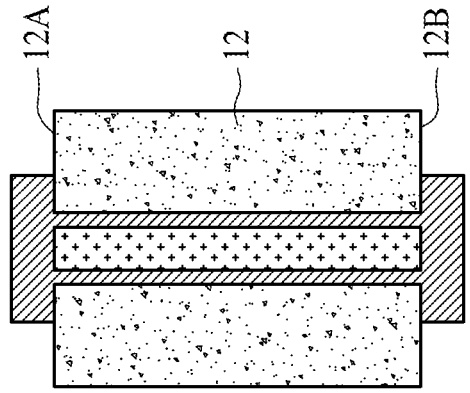
Figure 2C:
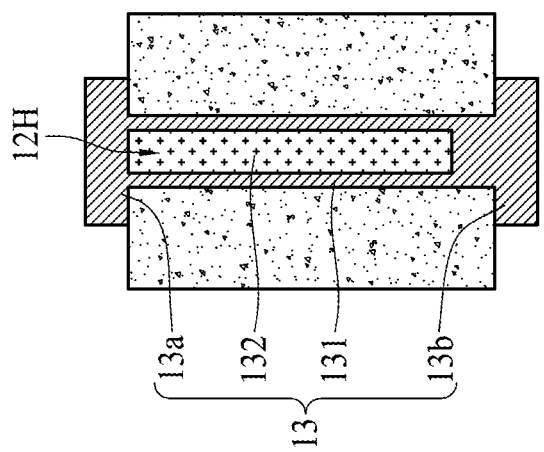
Figure 2D:
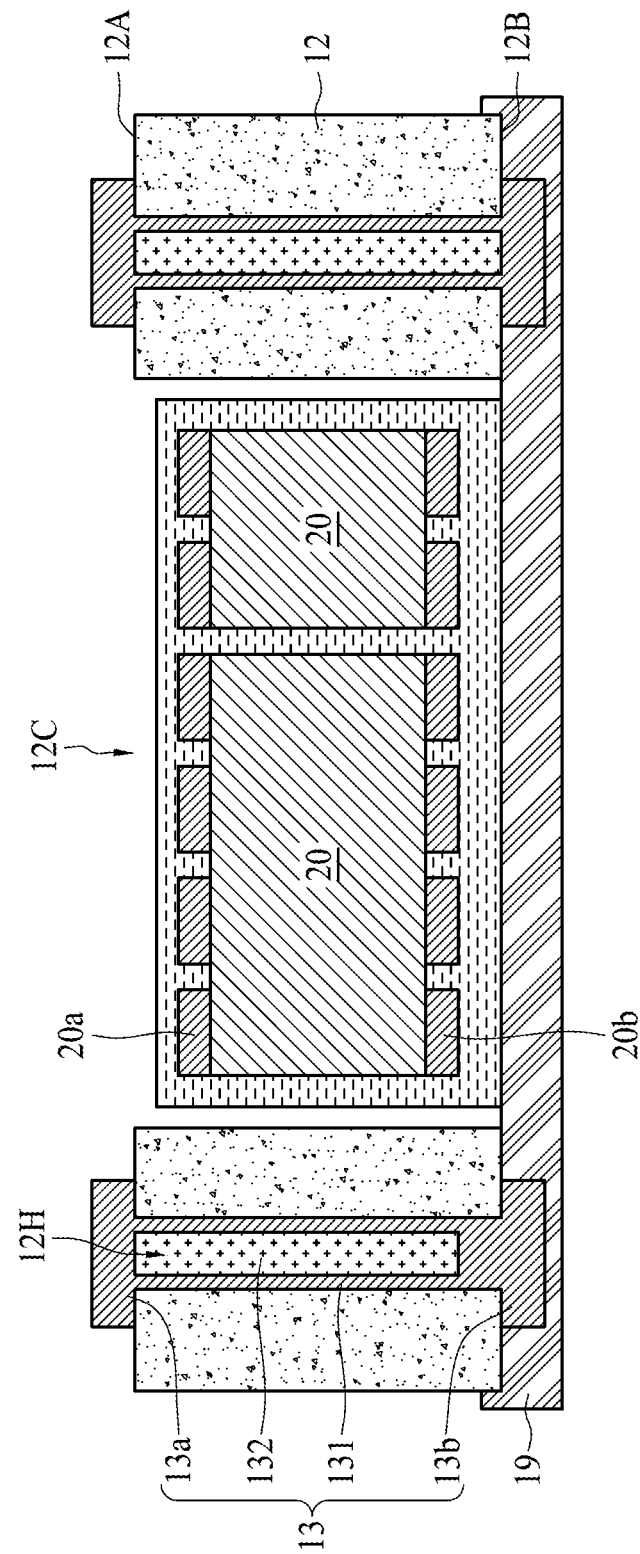
Figure 2E:
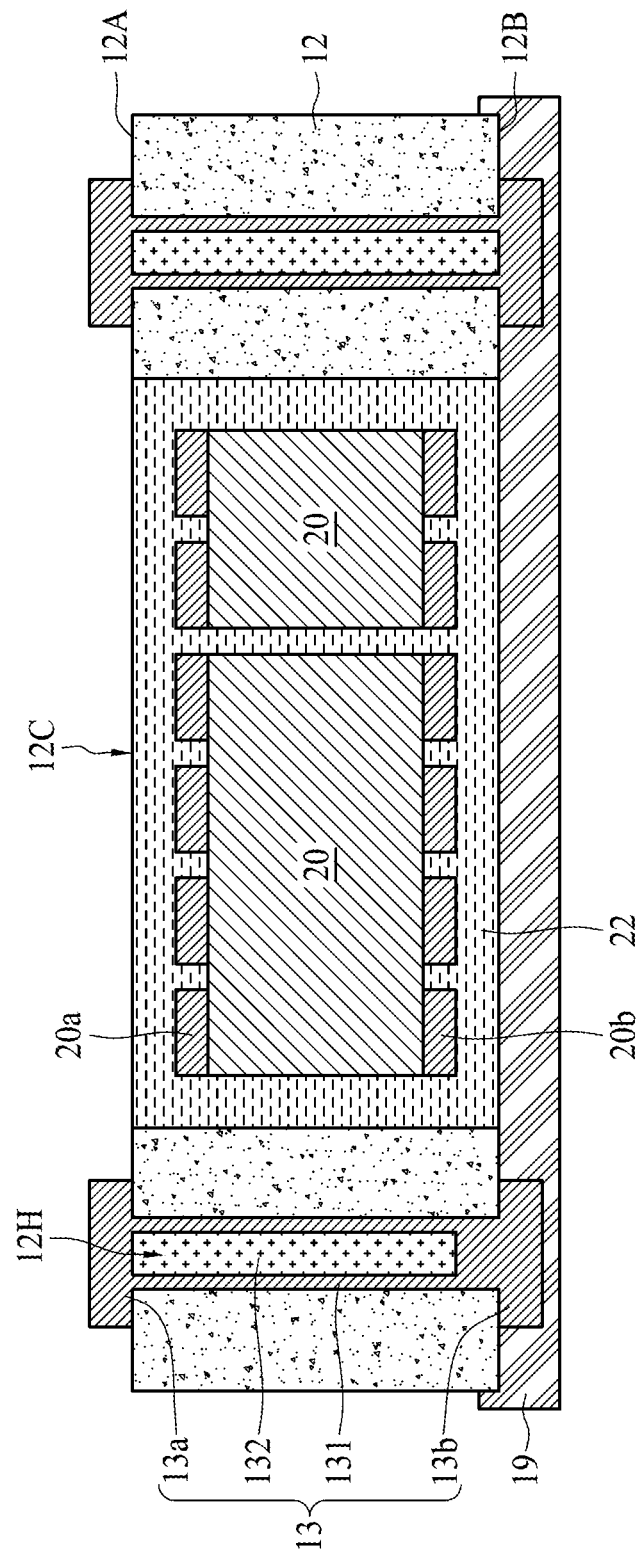

As shown in FIG. 2C, a cavity 12C is formed in the substrate 12. In some embodiments, the cavity 12C is a through cavity that penetrates the substrate 12. In some alternative embodiments, the cavity 12C may be a recess that recesses from the upper surface 12A without penetrating the substrate 12. As shown in FIG. 2D, the substrate 12 is bonded to a temporary substrate 19 such as a tape. At least one first electronic component 20 is placed in the cavity 12C. In some embodiments, a plurality of first electronic component 20 are fixed with a glue, for example, before being placed in the cavity 12C. As shown in FIG. 2E, a filling material 22 is filled in the cavity 12C to encapsulate the first electronic component 20.

Figure 2F:
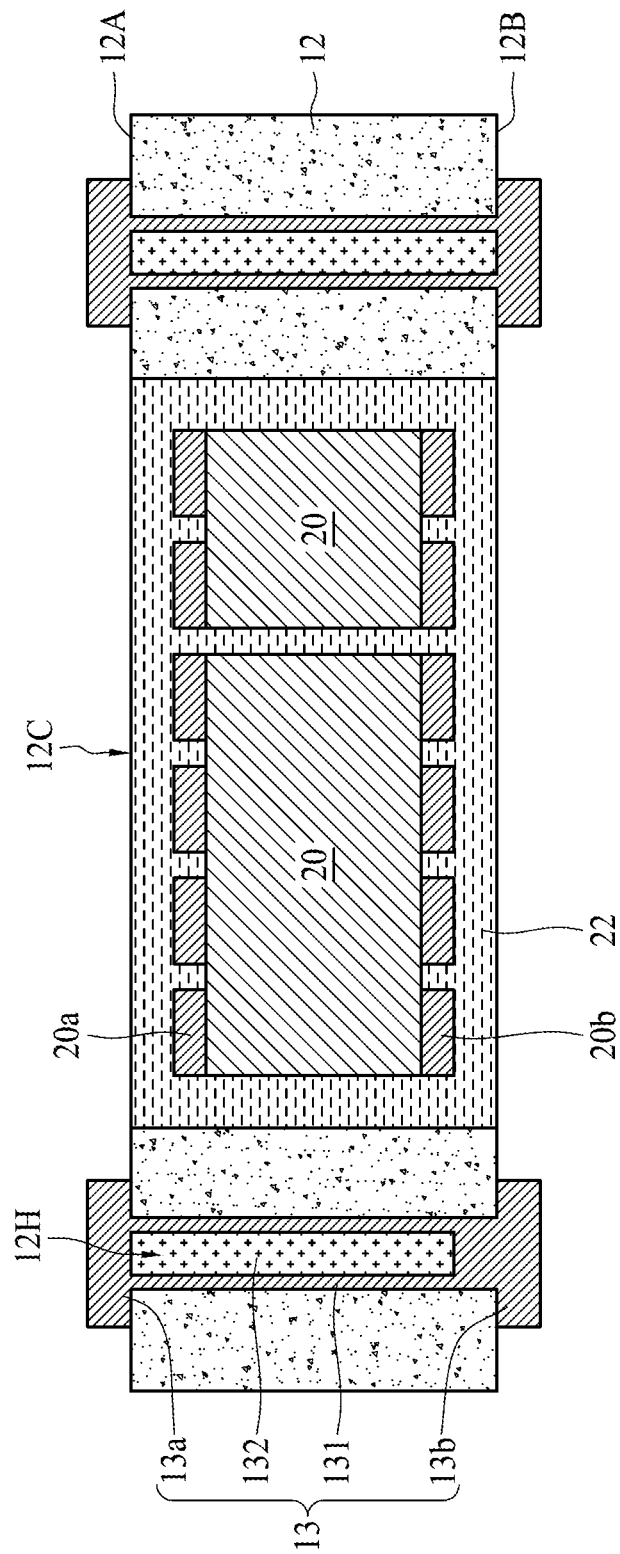
Figure 2G:
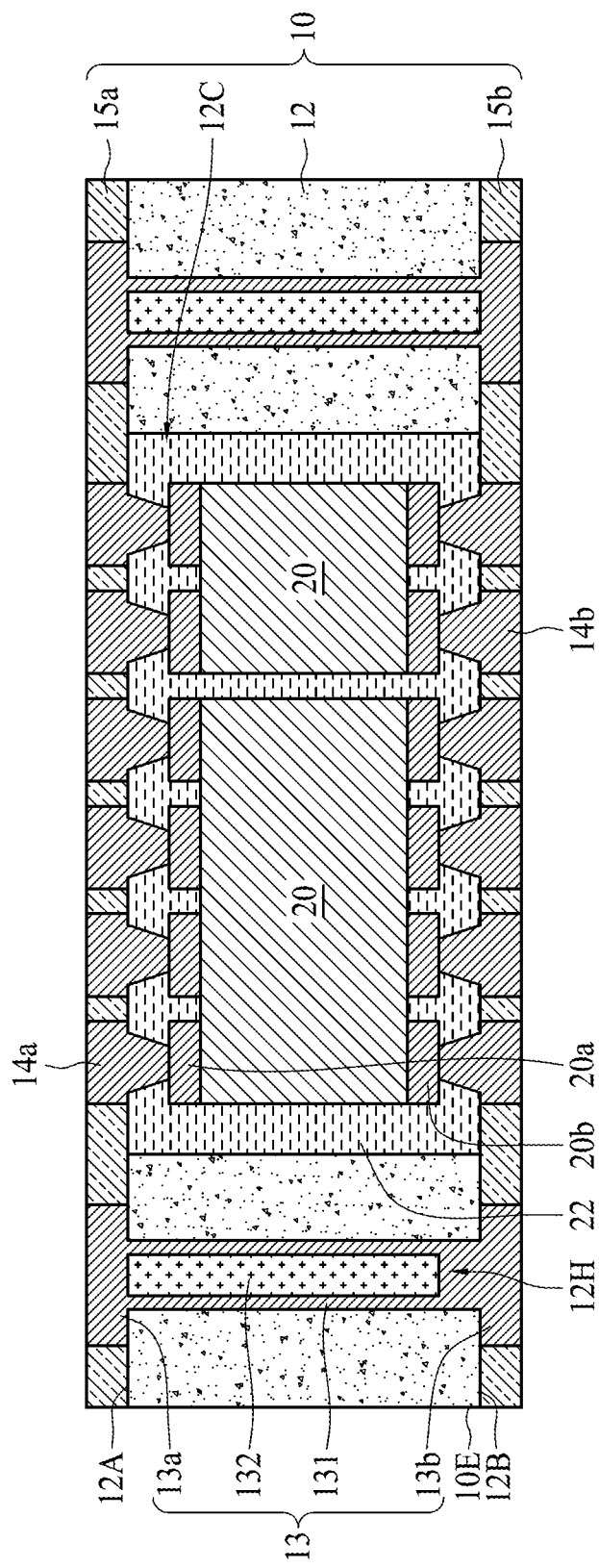
Figure 2H:
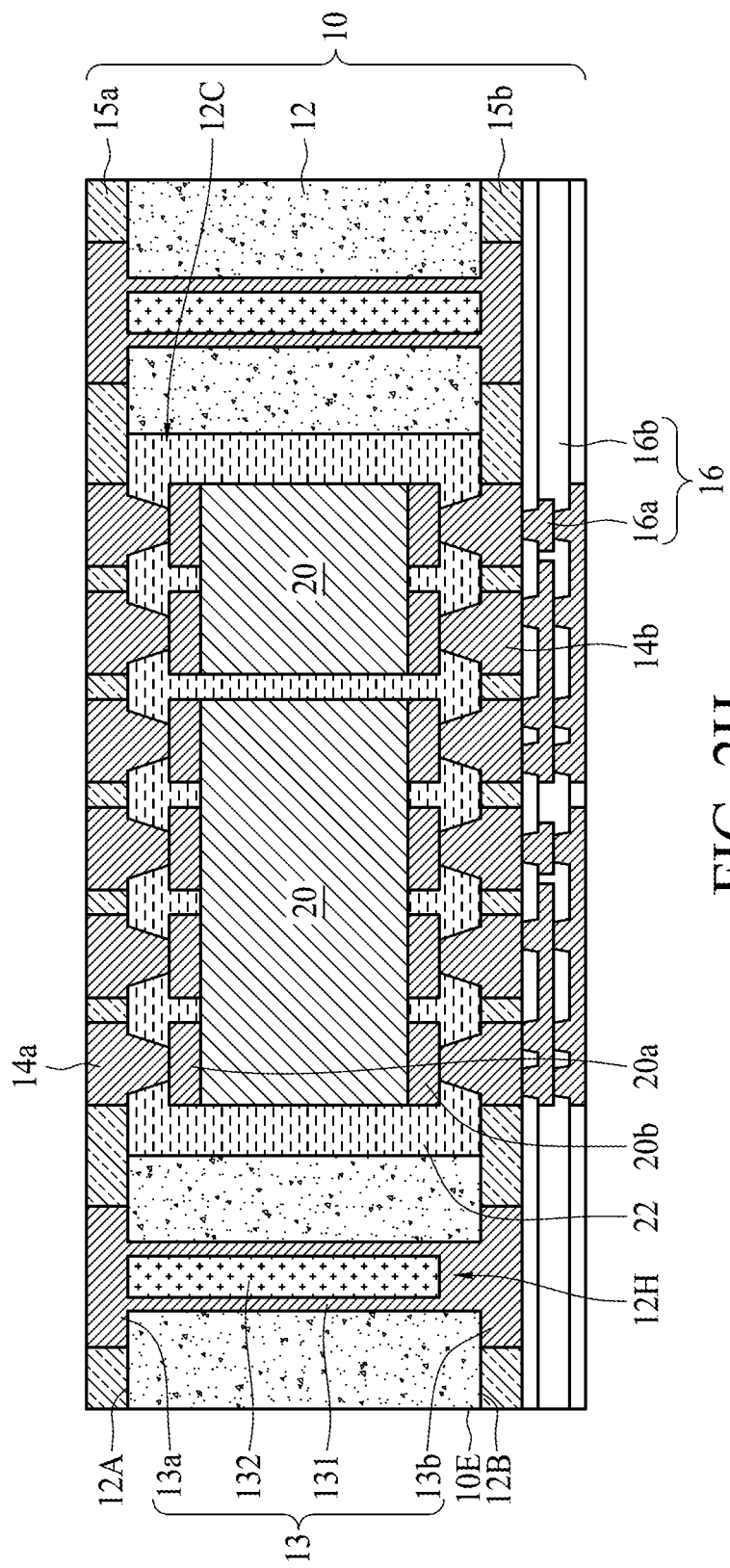

As shown in FIG. 2F, the temporary substrate 19 is released from the substrate 12. As shown in FIG. 2G, at least one upper circuit layer (also referred to as first circuit layer) 14a and at least one upper dielectric layer 15a are formed on the upper surface 12A of the substrate 12. In some embodiments, at least one bottom circuit layer 14b and at least one bottom dielectric layer 15b are formed on the bottom surface 12B of the substrate 12. As shown in FIG. 2H, a bottom redistribution layer (RDL) 16 is formed on the bottom surface 12B, and electrically connected to the bottom circuit layer 14b. The bottom RDL 16 may include one or more wiring layers 16a, and one or more dielectric layers 16b stacked to each other. In some embodiments, the wiring layer 16a may be disposed on, adjacent to, or embedded in and exposed by the dielectric layer 16b. In some embodiments, the upper circuit layer 14a, the bottom circuit layer 14b and the bottom RDL 16 each may include a substrate-level circuit layer, which is a low-density circuit layer with wider L/S. Thus, manufacturing costs can be reduced. The upper circuit layer 14a, the bottom circuit layer 14b and the bottom RDL 16 each may be formed by various operations including deposition such as electroplating, patterning such as photolithography and/or etching, planarization such as grinding, and the like.

Figure 2I:
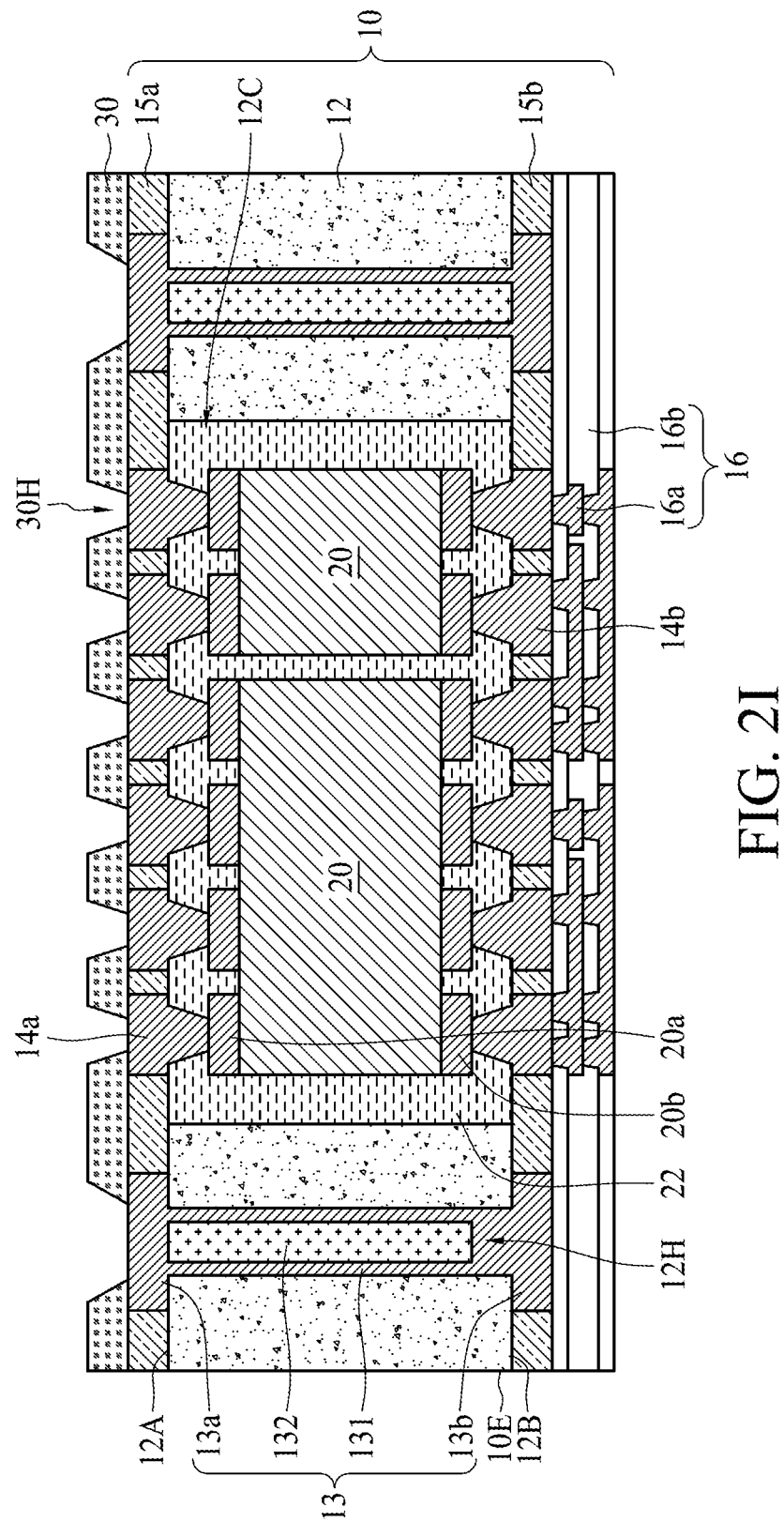
Figure 2J:
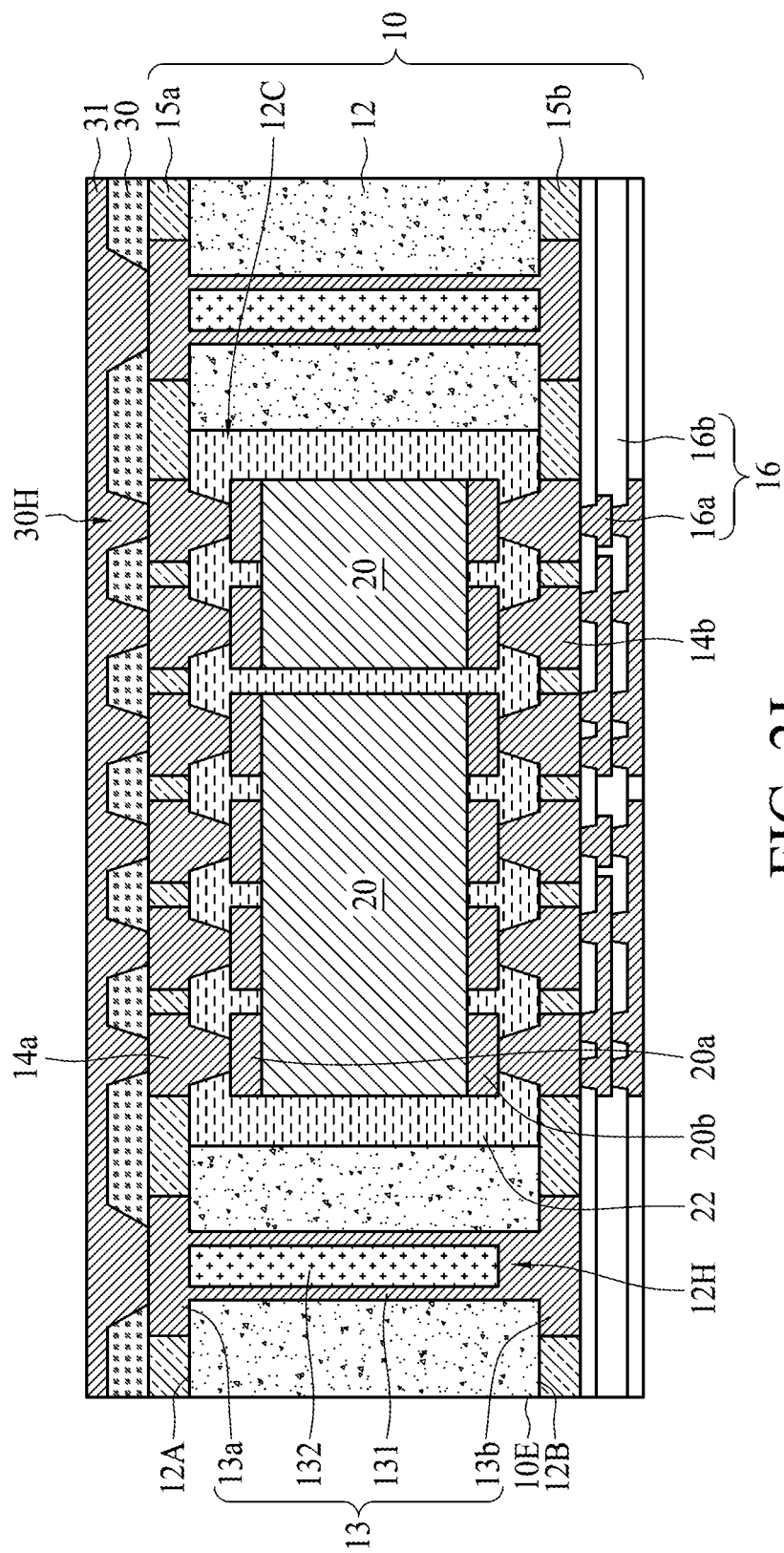
Figure 2K:
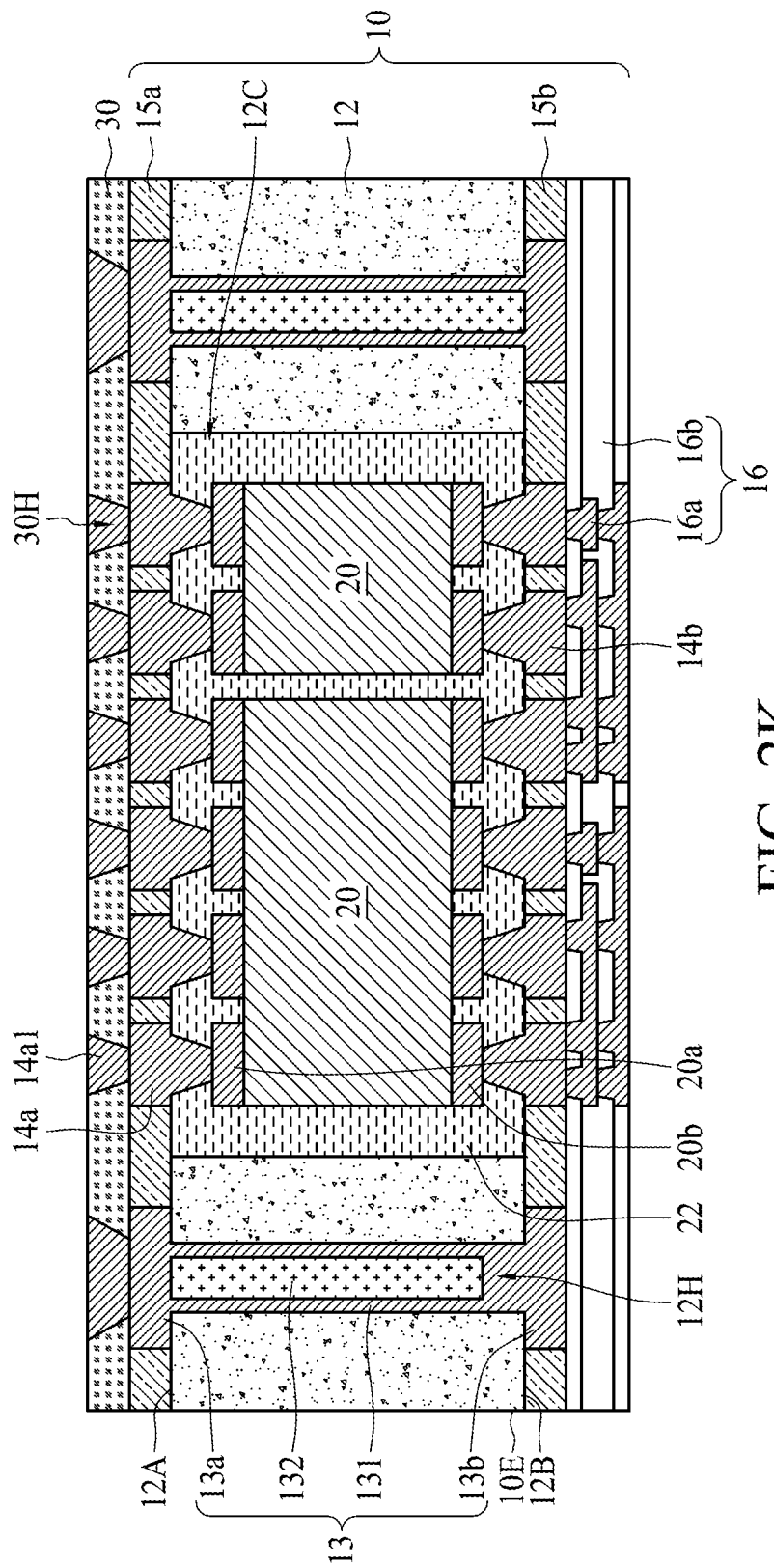

As shown in FIG. 2I, a stress buffering layer 30 is formed on the substrate 12. A plurality of openings 30H may be formed but not limited to, by for example laser drilling. As shown in FIG. 2J, a conductive layer 31 is formed on the stress buffering layer 30 and in the openings 30H. The material of the conductive layer 31 may include metal such as copper, but is not limited thereto. The conductive layer 31 may be formed by electroplating, for example. As shown in FIG. 2K, the conductive layer 31 outside the openings 30H of the stress buffering layer 30 is removed by etching, grinding or the like to form a conductive wiring pattern 14a1 substantially coplanar with the stress buffering layer 30. As shown in FIG. 2J and FIG. 2K, the conductive layer 31 is formed to fill the openings 30H and on the stress buffering layer 30, and the conductive layer 31 on the stress buffering layer 30 is then etched. Accordingly, the manufacturing operation is simplified and the surface uniformity can be increased. In some embodiments, the conductive layer 31 may be slightly over etched, and the upper surface of the conductive wiring pattern 14a1 may be slightly lower than the upper surface of the stress buffering layer 30 as shown in FIG. 1A.

Figure 2L:
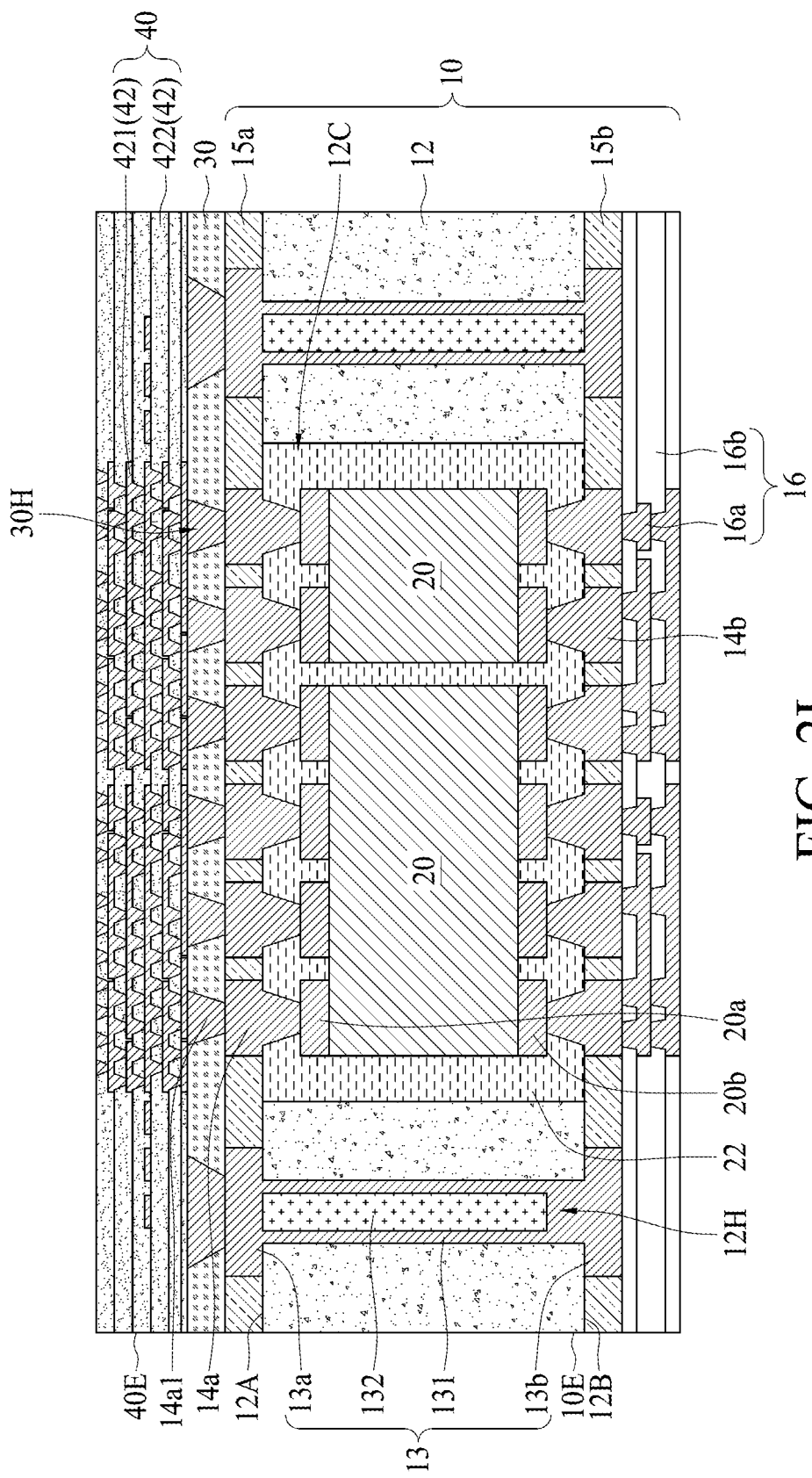

As shown in FIG. 2L, a second conductive structure 40 is formed on the stress buffering layer 30 and the conductive wiring pattern 14a1 of the upper circuit layer 14a. The second conductive structure 40 includes at least one circuit layer (also referred to as second circuit layer) 42 electrically connected to the upper circuit layer 14a. In some embodiments, the circuit layer 42 may include at least one conductive wiring pattern 421 and at least one dielectric layer 422 stacked to each other. In some embodiments, the circuit layer 42 is directly built up on the upper circuit layer 14a, and a joint between the conductive wiring pattern 14a1 of the upper circuit layer 14a and the bottommost conductive wiring pattern 421 of the circuit layer 42 may be a solder-free joint. The circuit layer 42 may include a bumping-level circuit layer, which is a high-density circuit layer with narrower L/S. The high-density second conductive structure 40 may be configured as fan-out circuit to electrically connect the second electronic component 50 to be formed with more I/O connections, and to redistribute the I/O connections to the low-density first conductive structure 10. The bumping-level circuit layer is a high-density circuit with narrower L/S, and thus the surface uniformity of underlying layer is critical to the yield and reliability of the bumping-level circuit layer. The stress buffering layer 30 and the conductive wiring pattern 14a1 collectively form a uniform planar surface, and thus help formation of the circuit layer 42.

Figure 2M:
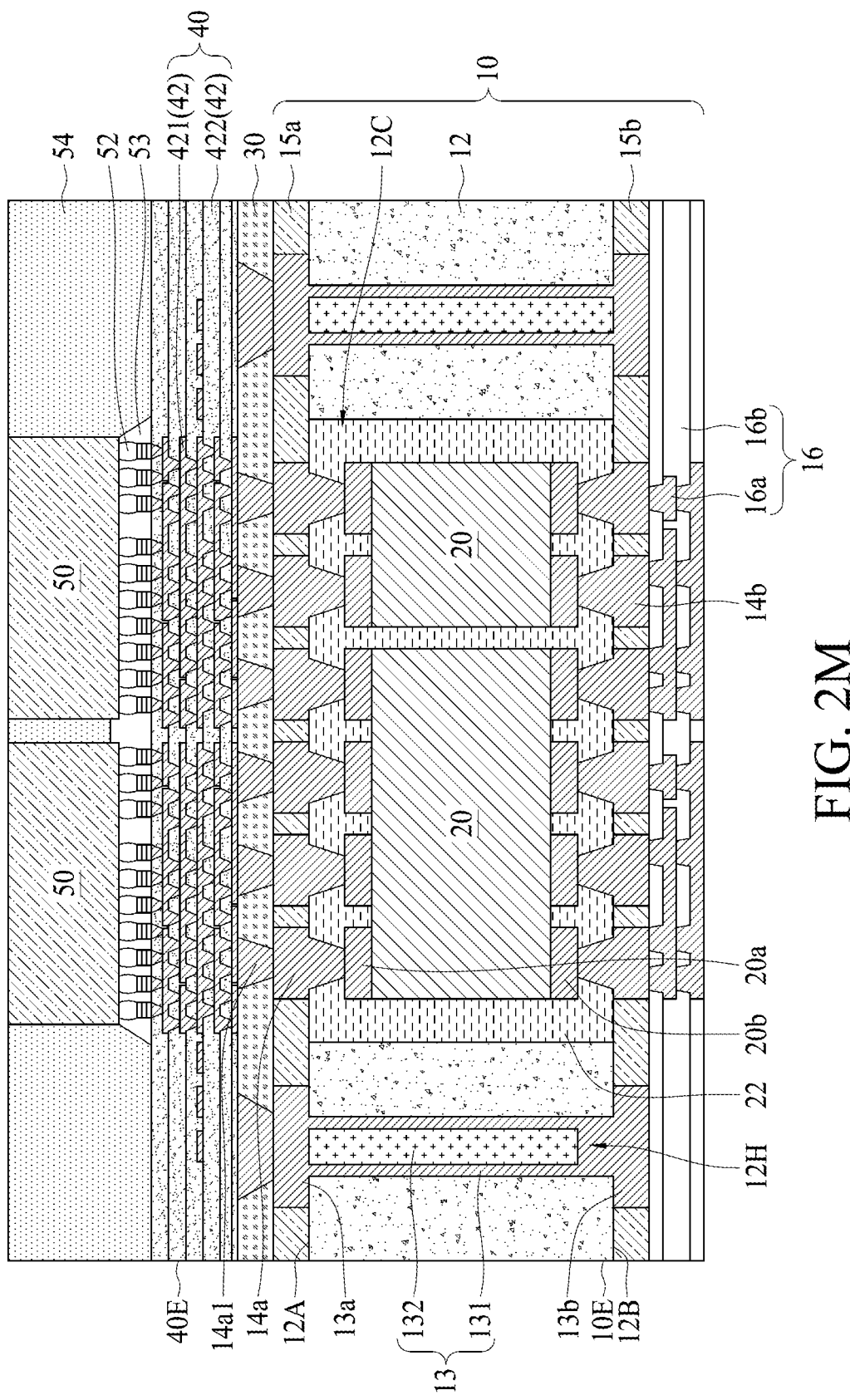

As shown in FIG. 2M, at least one second electronic component 50 is bonded to the second conductive structure 40. In some embodiments, conductive bumps 52 such as solder bumps or the like are used to bond the second electronic component 50 to the second conductive structure 40. In some embodiments, an underfill layer 53 may be formed between the second electronic component 50 and the second conductive structure 40, surrounding the conductive bumps 52. An encapsulation layer 54 is formed on the second conductive structure 40 to encapsulate the second electronic component 50. In some embodiments, the encapsulation layer 54 may encapsulate sidewalls and upper surface of the second electronic component 50. The encapsulation layer 54 may be grinded to expose the upper surface of the second electronic component 50. Electrical conductors 17 such as solder balls are formed on the bottom RDL 16 to form the semiconductor device package 1 as illustrated in FIG. 1. It is contemplated that the second electronic component 50 is bonded to the second conductive structure 40 after the second conductive structure 40 is bonded to the first conductive structure 10, which is a chip-last operation. Accordingly, the risk of damaging the second electronic component 50 can be lowered.

The semiconductor device packages and manufacturing methods of the present disclosure are not limited to the above-described embodiments, and may be implemented according to other embodiments. To streamline the description and for the convenience of comparison between various embodiments of the present disclosure, similar components of the following embodiments are marked with same numerals, and may not be redundantly described.

Figure 3:
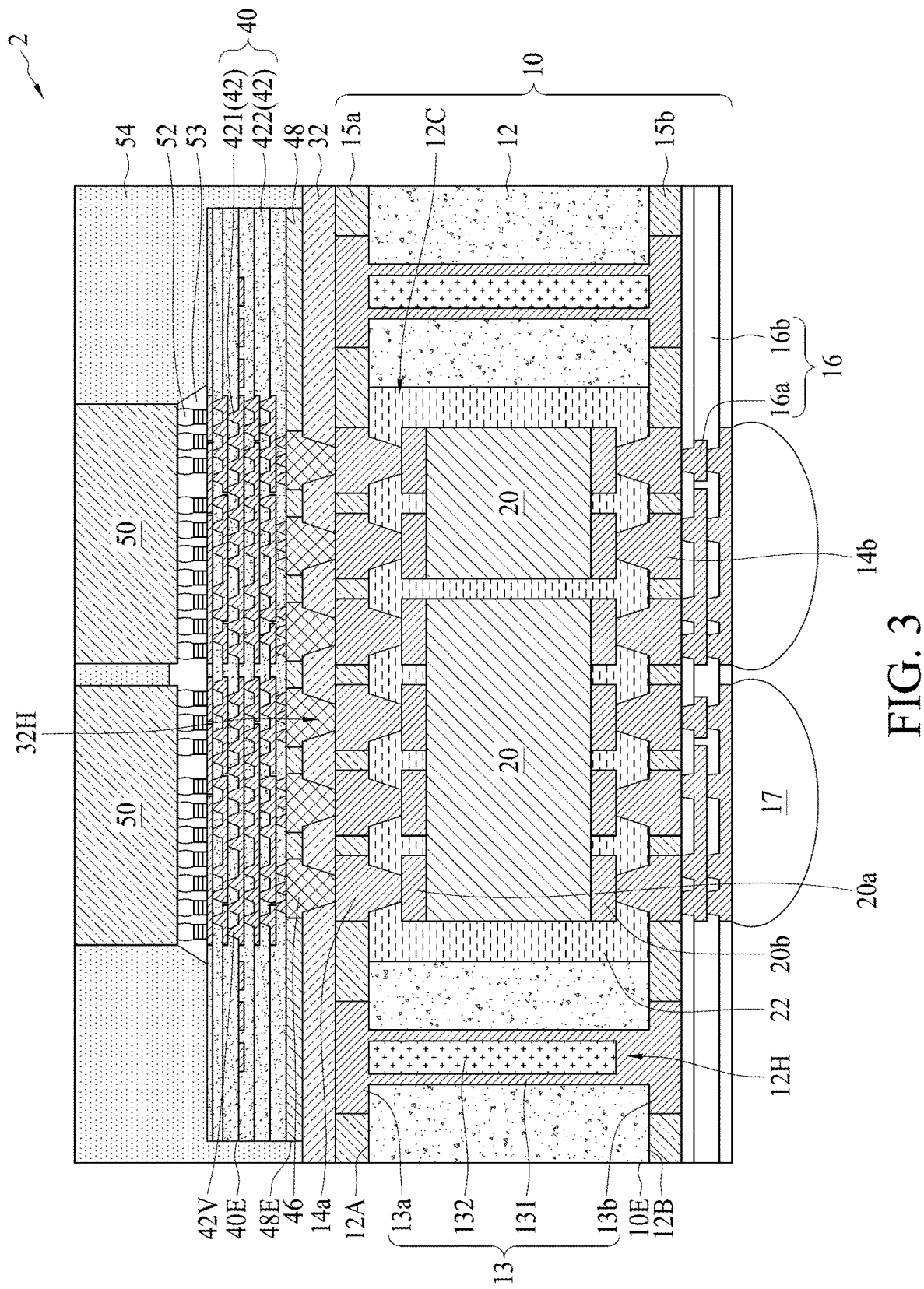
FIG. 3 is a cross-sectional view of a semiconductor device package in accordance with some embodiments of the present disclosure.

FIG. 3 is a cross-sectional view of a semiconductor device package 2 in accordance with some embodiments of the present disclosure. As shown in FIG. 3, the semiconductor device package 2 includes a first conductive structure 10, a passivation layer 32, and a second conductive structure 40. The passivation layer 32 is disposed on the upper circuit layer 14a of the first conductive structure 10. The passivation layer 32 includes a plurality of openings 32H partially exposing the upper circuit layer 14a. The second conductive structure 40 further includes a plurality of conductive bumps 46 electrically connected to the upper circuit layer 14a. The conductive bumps 46 extend into the openings 32H of the passivation layer 32 to enhance the robustness of bonding between the second conductive structure 40 and the first conductive structure 10. The conductive bumps 46 may include solders such as solder balls or solder pastes, metal connectors such as metal pillars, or other suitable conductive bumps. In some embodiments, the conductive wiring pattern 421 of the circuit layer 42 may include a plurality of conductive vias 42V. The conductive via 42V may, but is not limited to, have a trapezoid cross-sectional shape.

In some embodiments, the material of the passivation layer 32 includes a cured photo-sensitive material, such that the openings 32H can be patterned by an exposure and development operation, and the width and spacing of the openings 32H can be minimized. For example, the width of the opening 32H can be reduced to less than 80 micrometers, 50 micrometers or less. In some alternative embodiments, the material of the passivation layer 32 may include solder mask or other material that can be patterned. In some embodiments, the second conductive structure 40 is formed and singulated before bonding to the first conductive structure 10, and thus the edge 10E of the first conductive structure 10 may protrude out from the edge 40E of the second conductive structure 40. The semiconductor device package 2 may further include an underfill layer 48 disposed between the passivation layer 32 and the second conductive structure 40, and surrounding the conductive bumps 46. In some embodiments, the edge of the underfill layer 48 may be substantially aligned with the edge 40E of the second electronic component 40.

FIG. 4A, FIG. 4B, FIG. 4C, FIG. 4D, FIG. 4E and FIG. 4F illustrate operations of manufacturing a semiconductor device package 2 in accordance with some embodiments of the present disclosure. The manufacturing operation of the semiconductor device package 2 may be performed subsequent to the manufacturing operation illustrated in FIG. 2H. As shown FIG. 4A, a passivation layer 32 is performed on the first conducive structure 10, and a plurality of openings 32H are formed in the passivation layer 32 to exposed the upper circuit layer 14a. In some embodiments, the material of the passivation layer 32 includes a cured photo-sensitive material, and the openings 32H can be patterned by an exposure and development operation. Accordingly, the width and spacing of the openings 32H can be minimized.

Figure 4A:
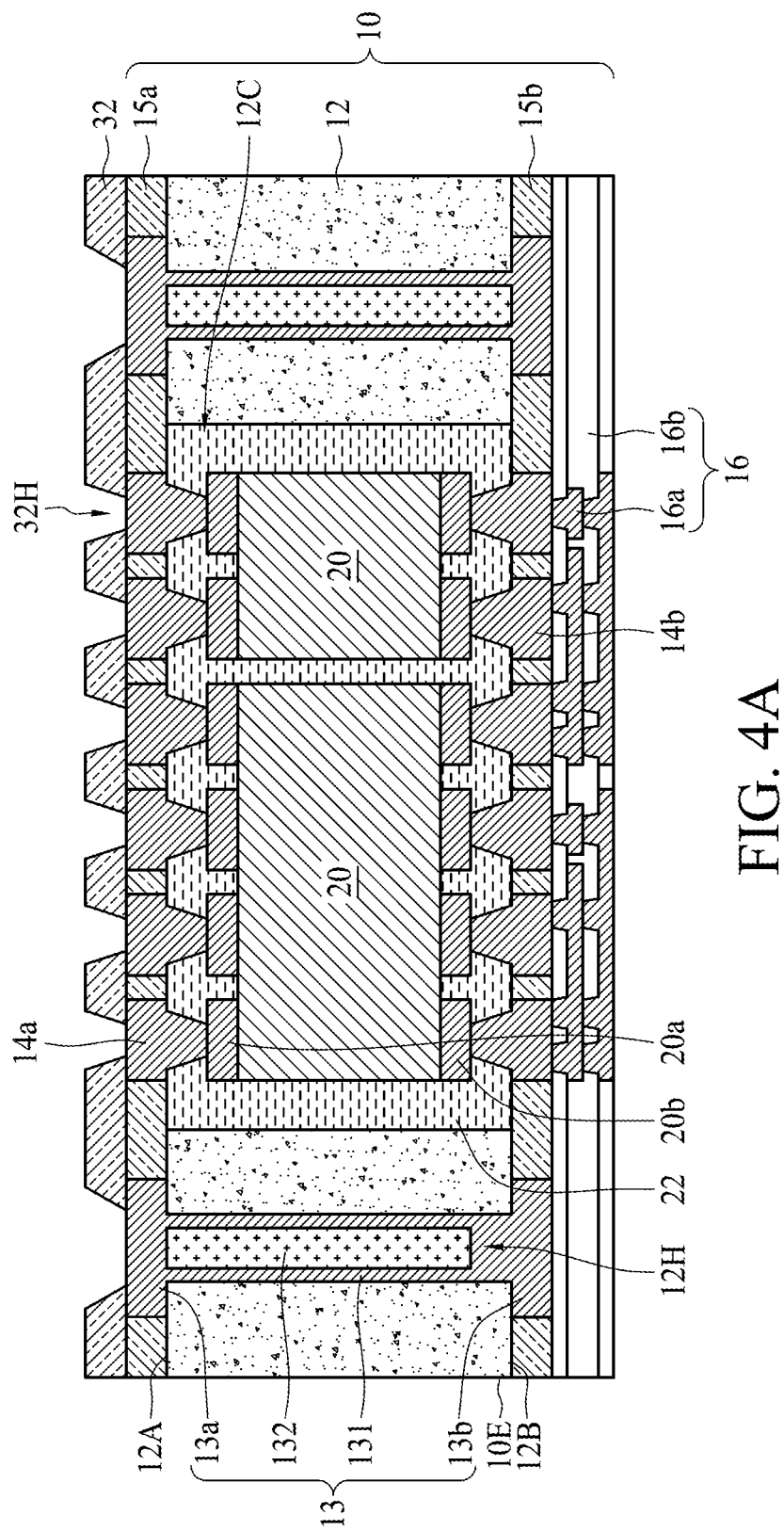
FIG. 4A, FIG. 4B, FIG. 4C, FIG. 4D, FIG. 4E and FIG. 4F illustrate operations of manufacturing a semiconductor device package in accordance with some embodiments of the present disclosure.
Figure 4B:
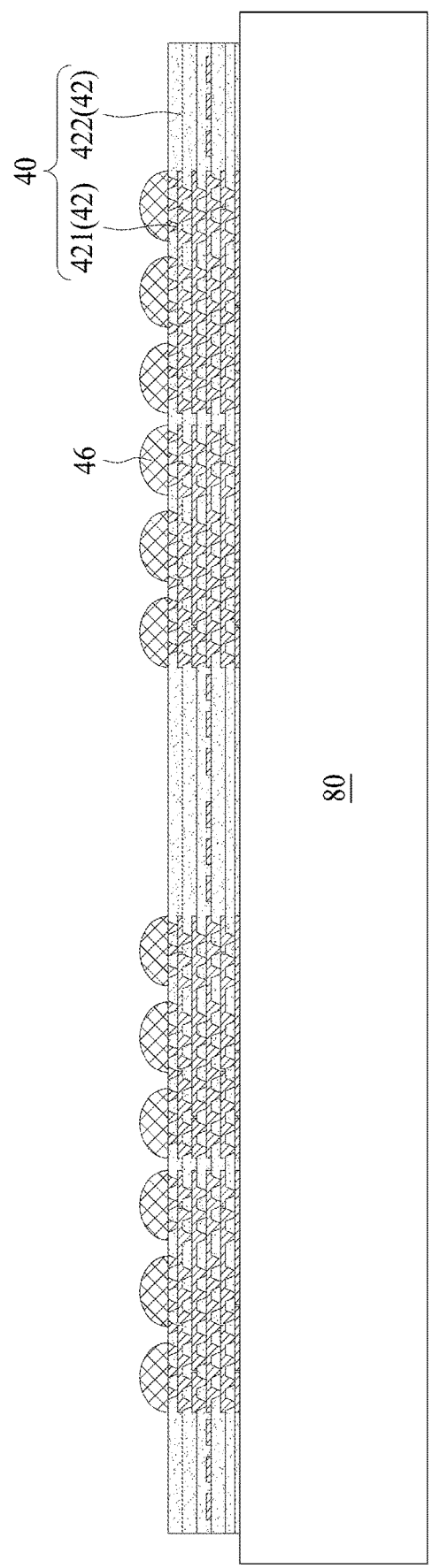

As shown in FIG. 4B, a plurality of second conductive structures 40 are formed on a carrier 80. The second conductive structures 40 may include at least one circuit layer 42 including a plurality of conductive wiring patterns 421 and a plurality of dielectric layers 422. The conductive wiring patterns 421 and the dielectric layers 422 can be formed by alternately forming dielectric material layers and conductive layers on the carrier 80. In some embodiments, the conductive wiring pattern 421 may include a plurality of conductive vias 42V. The conductive via 42V may, but is not limited to, have an inversed trapezoid cross-sectional shape. In some embodiments, a plurality of conductive bumps 46 are formed on the circuit layer 42 to electrically connect the circuit layer 42.

Figure 4C:
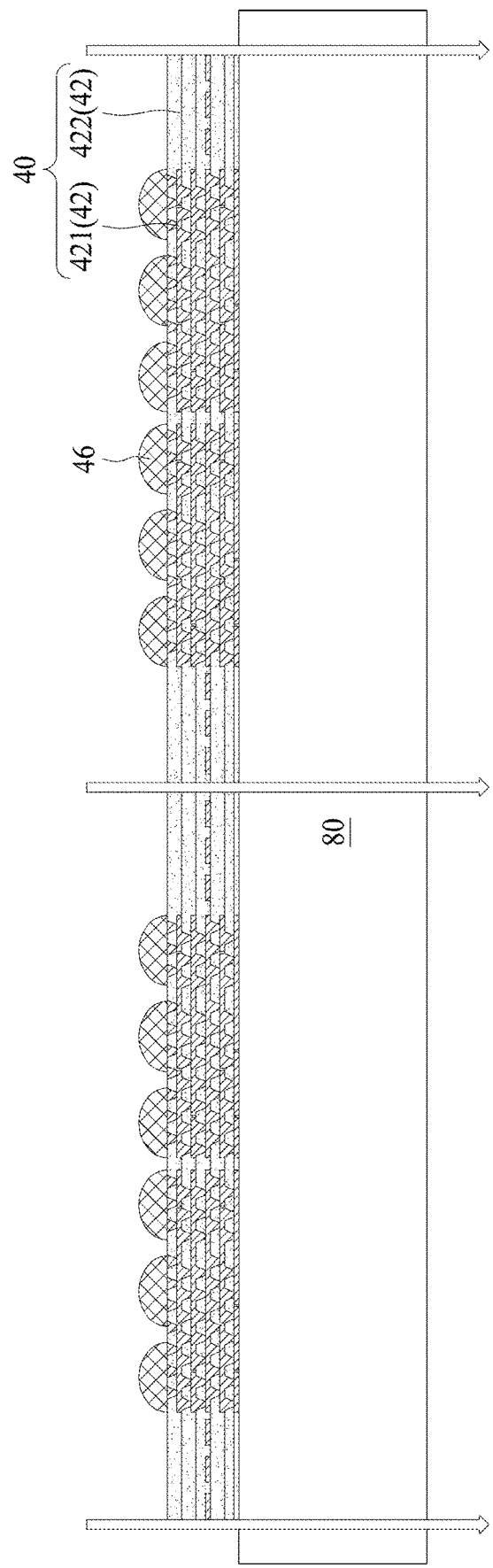
Figure 4D:
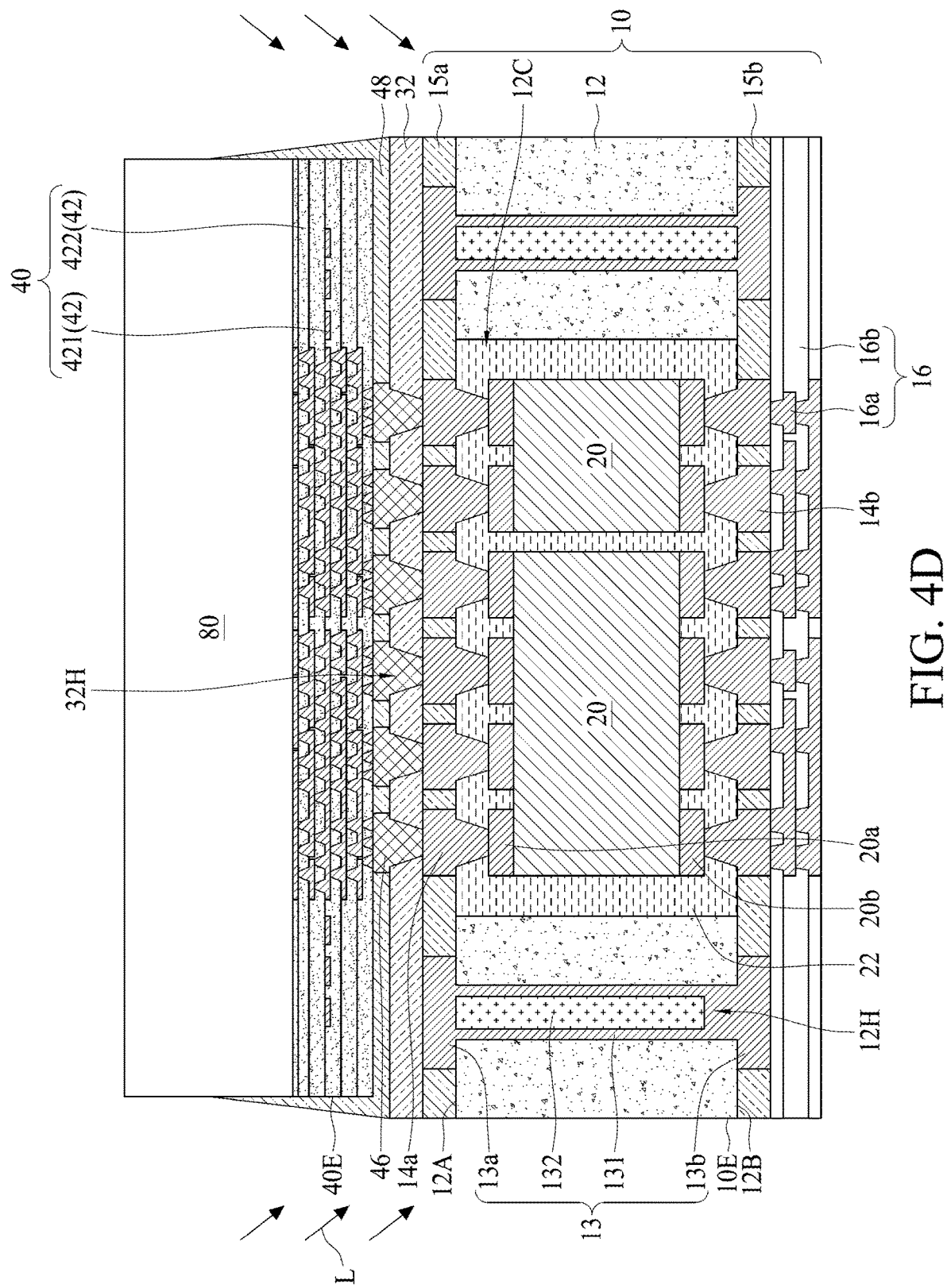

As shown in FIG. 4C, the second conductive structures 40 are singulated. As shown in FIG. 4D, the singulated second conductive structure 40 supported by the singulated carrier 80 is flipped over, and bonded to the first conductive structure 10 with the conductive bumps 46 inserting into the openings 32H of the passivation layer 32 and electrically connecting the upper circuit layer 14a. As the second conductive structure 40 is flipped over and bonded to the first conductive structure 10, the conductive wiring pattern 421 may include a plurality of conductive vias having a trapezoid cross-sectional shape. An underfill layer 48 is then formed between the passivation layer 32 and the second conductive structure 40, and surrounding the conductive bumps 46. In some embodiments, a trimming operation may be performed to trim the second conductive structure 40 and the underfill layer 48 to remove excessive underfill material climbing up the edge 40E of the second conductive structure 40 and that of the carrier 80. The trimming operation may be carried out by laser L, blade or the like.

Figure 4E:
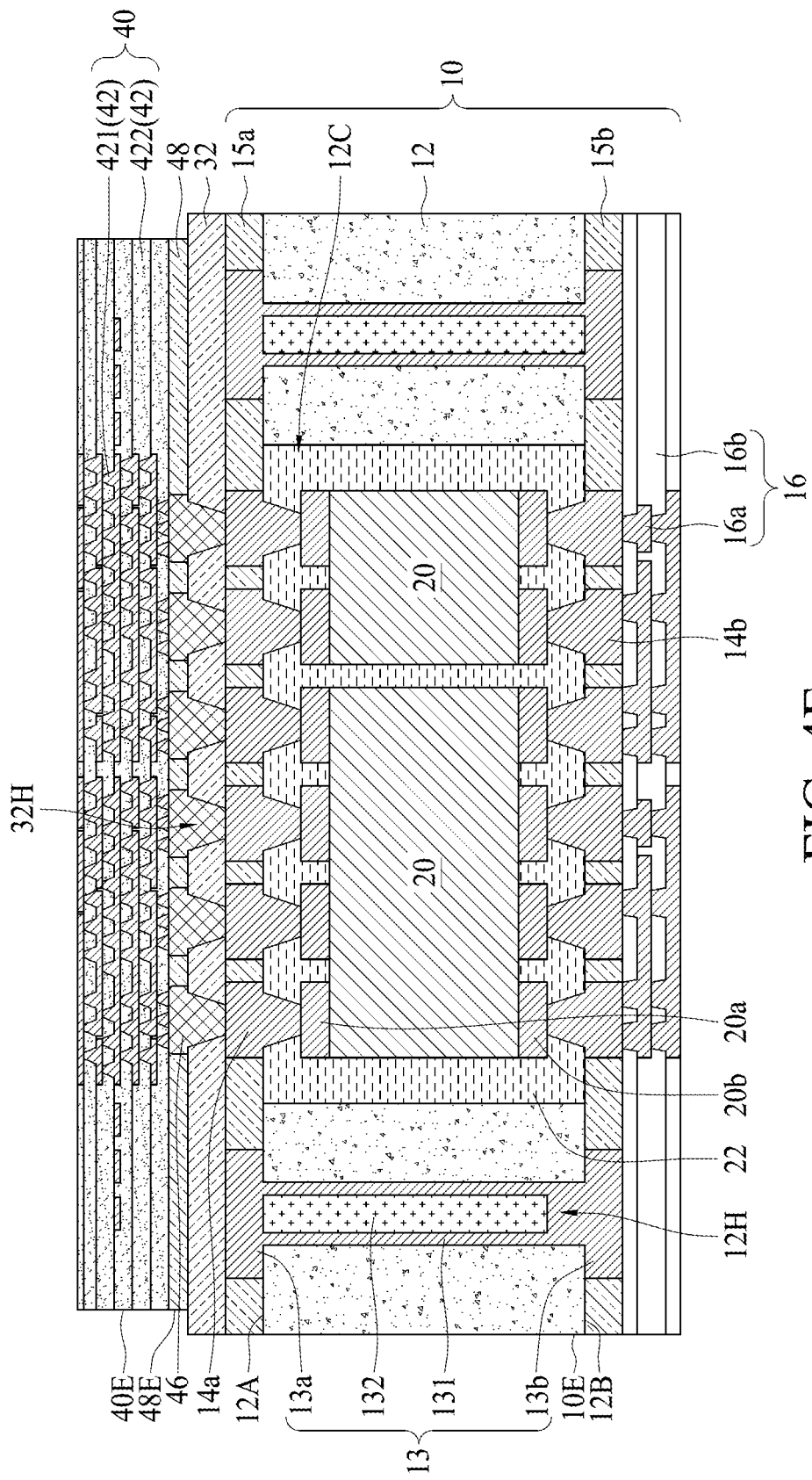

As shown in FIG. 4E, the carrier 80 is removed from the second conductive structure 40. Since the overflowing underfill material is removed, the carrier 80 can be easily removed from the second conductive structure 40, and the edge 48E of the underfill layer 48 is substantially aligned with the edge 40E of the second conductive structure 40. In addition, the edge 10E of the first conductive structure 10 may protrude out from the edge 40E of the second conductive structure 40.

Figure 4F:
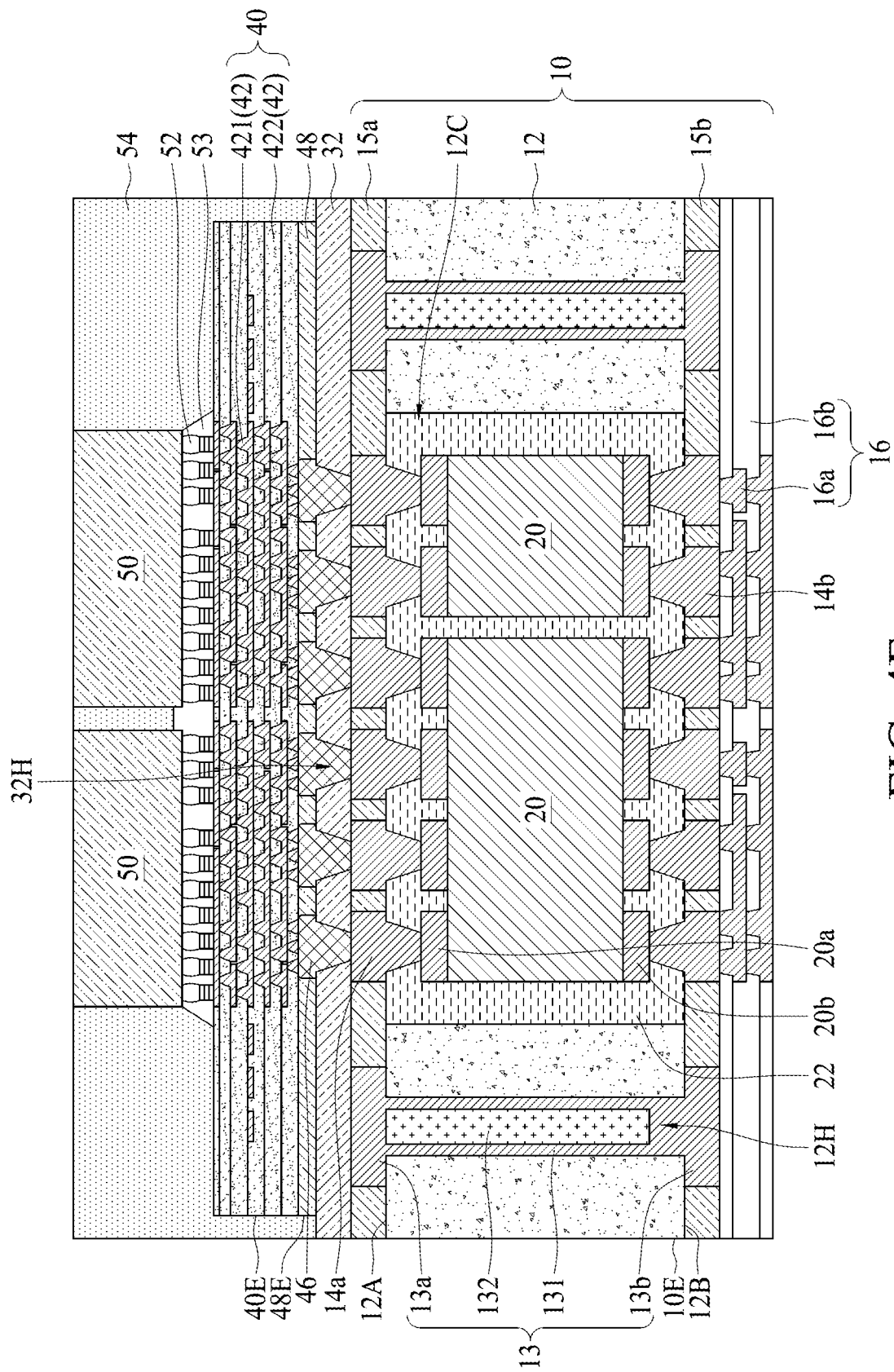

As shown in FIG. 4F, at least one second electronic component 50 is bonded to the second conductive structure 40. In some embodiments, conductive bumps 52 such as solder bumps or the like are used to bond the second electronic component 50 to the second conductive structure 40. In some embodiments, an underfill layer 53 may be formed between the second electronic component 50 and the second conductive structure 40, surrounding the conductive bumps 52. An encapsulation layer 54 is formed on the second conductive structure 40 to encapsulate the second electronic component 50. In some embodiments, the encapsulation layer 54 may encapsulate sidewalls and upper surface of the second electronic component 50. The encapsulation layer 54 may be grinded to expose the upper surface of the second electronic component 50. The encapsulation layer 54 may further cover the edge 40E of the second conductive structure 40 and the edge 48E of the underfill layer 48. Electrical conductors 17 such as solder balls are formed on the bottom RDL 16 to form the semiconductor device package 2 as illustrated in FIG. 3. It is contemplated that the second electronic component 50 is bonded to the second conductive structure 40 after the second conductive structure 40 is bonded to the first conductive structure 10, which is a chip-last operation. Accordingly, the risk of damaging the second electronic component 50 can be lowered.

Figure 5A:
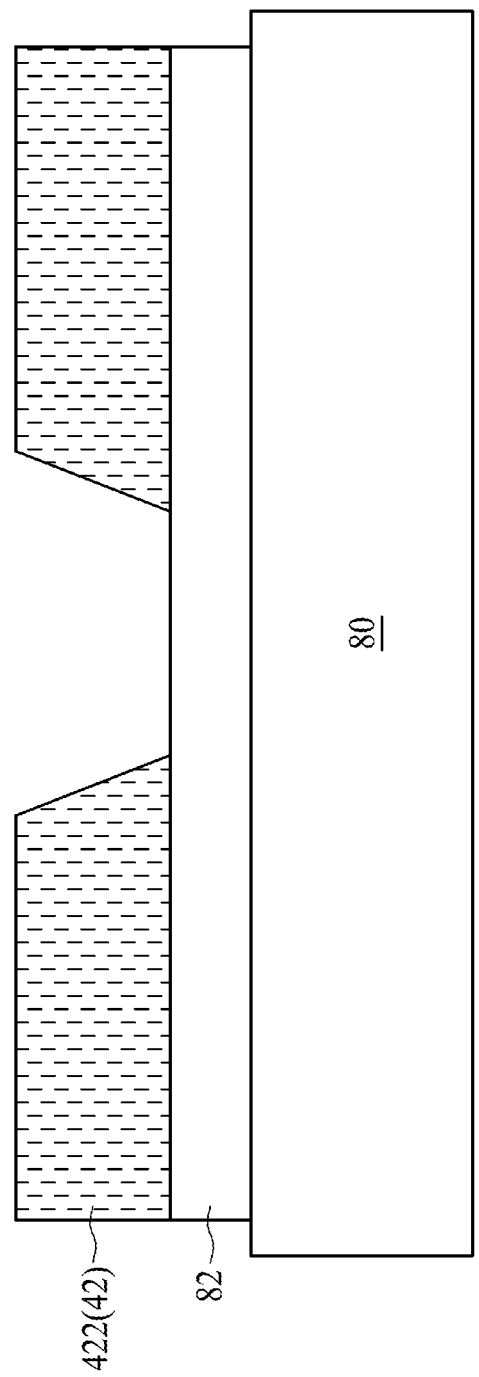

FIG. 5A, FIG. 5B, FIG. 5C, FIG. 5D and FIG. 5E illustrate sub-operations of manufacturing a semiconductor device package 2 in accordance with some embodiments of the present disclosure. In some embodiments, the manufacturing operations of the conductive wiring pattern 421 and the dielectric layer 422 may include sub-operations as illustrated in FIG. FIG. 5A, FIG. 5B, FIG. 5C, FIG. 5D and FIG. 5E. As shown in FIG. 5A, a base layer 82 is formed on the carrier 80. The base layer 82 may be configured as a seed layer, and/or a bonding enhancing layer. In some embodiments, the base layer 82 may include a stack of a bonding enhancing material having better adhesion to the carrier 80, and a seed layer. For example, the bonding enhancing layer may include a titanium layer formed by physical vapor deposition (PVD), and the seed layer may include copper. A dielectric layer 422 is formed on the base layer 82, and an opening 422H is formed in the dielectric layer 422 to expose the base layer 82. In some embodiments, the material of the dielectric layer 422 may include photo-sensitive material such as polyimide (PI), and the opening 422H can be formed by exposure and development operation.

Figure 5B:
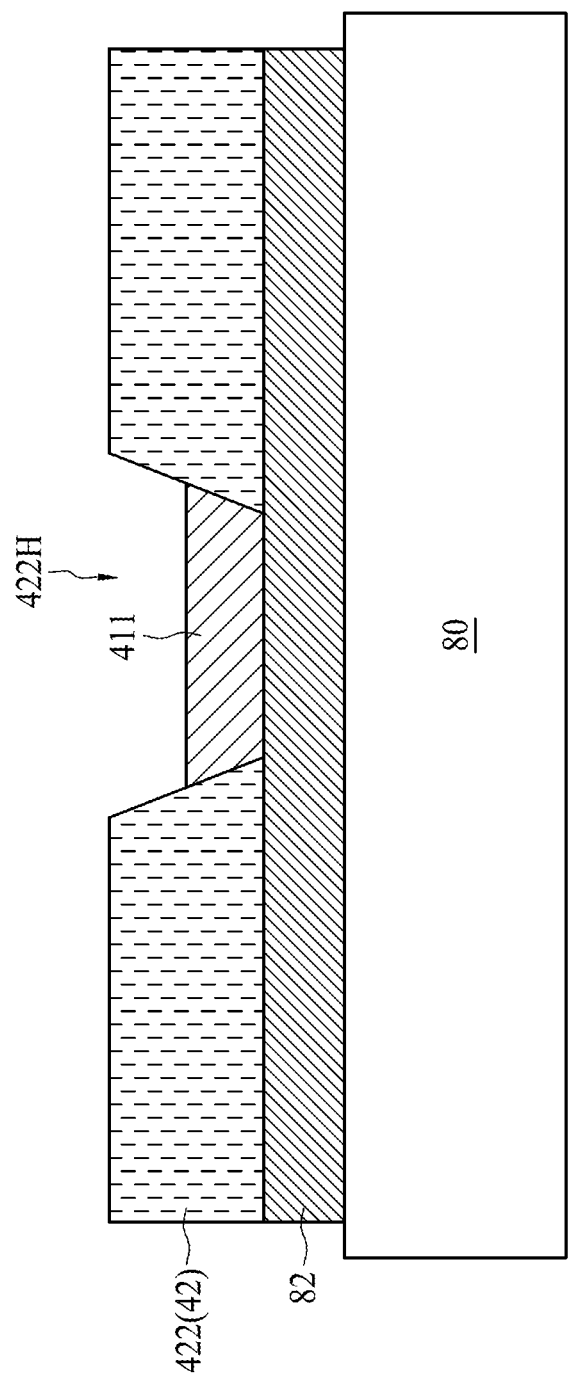
Figure 5C:
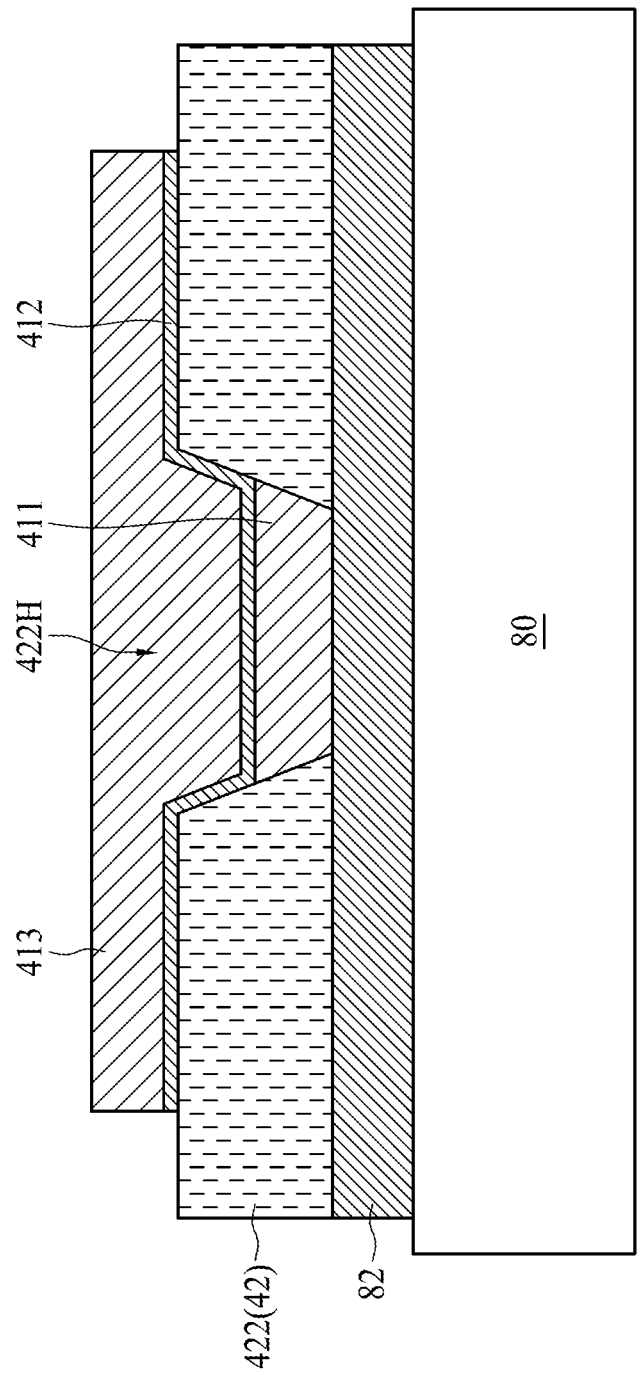

As shown in FIG. 5B, a first conductive material 411 is formed in a bottom portion of the opening 422H. As shown in FIG. 5C, a second conductive material 412 is formed on the dielectric layer 422 and the first conductive material 411. A third conductive material 413 is formed on the second conductive material 412. The material of the second conductive material 412 is selected to provide better adhesion between the dielectric layer 422 and the third conductive material 413 to avoid delamination. In some embodiments, the material of the first conductive material 411 may include for example copper, the material of the second conductive material 412 may include for example titanium formed by PVD, and the material of the third conductive material 413 may include for example copper.

Figure 5D:
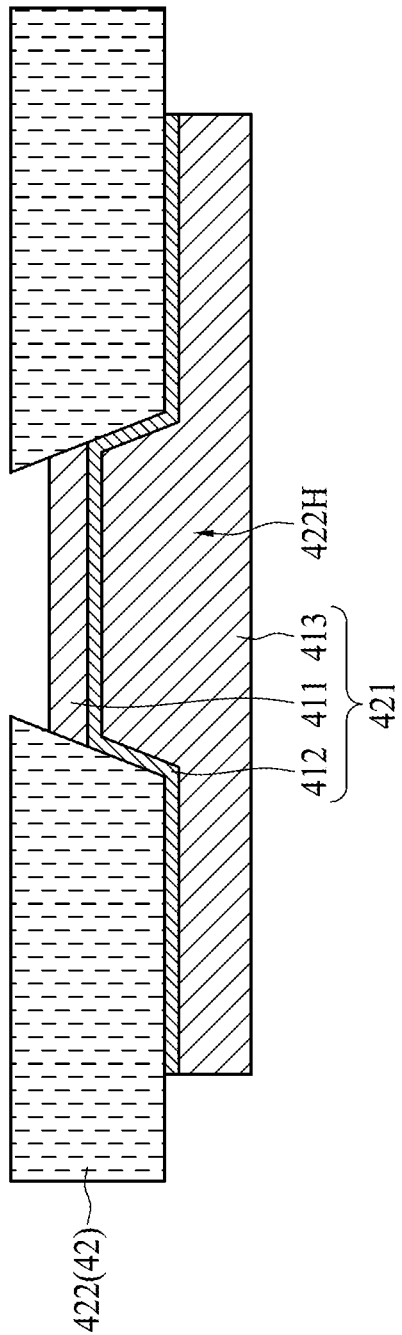

As shown in FIG. 5D, the carrier 80 is then removed from the dielectric layer 422 after the circuit layer 42 is accomplished and bonded to the first conductive structure 10 as shown in FIG. 4D. The base layer 82 is removed by for example etching to expose the first conductive material 411. In some embodiments, the conductive material 411 may be partially removed and recessed from the dielectric layer 422 such that a portion of the opening 422H is exposed. As shown in FIG. 5E and FIG. 4F, the second electronic component 50 is formed on the dielectric layer 422 and electrically connected to the conductive wiring pattern 421 with the conductive bumps 52. The conductive bump 52 is inserted into the opening 422H to enhance bonding between the second electronic component 50 and the conductive wiring pattern 421. The opening 422H may be partially or entirely filled with the conductive bump 52.

Figure 6A:
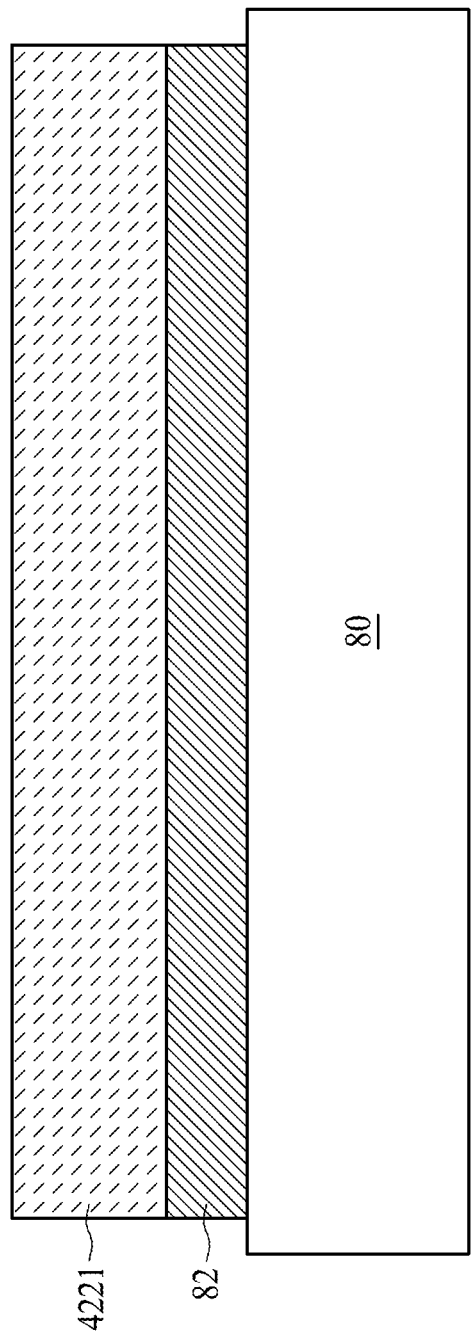
FIG. 6A, FIG. 6B, FIG. 6C, FIG. 6D and FIG. 6E illustrate sub-operations of manufacturing a semiconductor device package in accordance with some embodiments of the present disclosure.
Figure 6B:
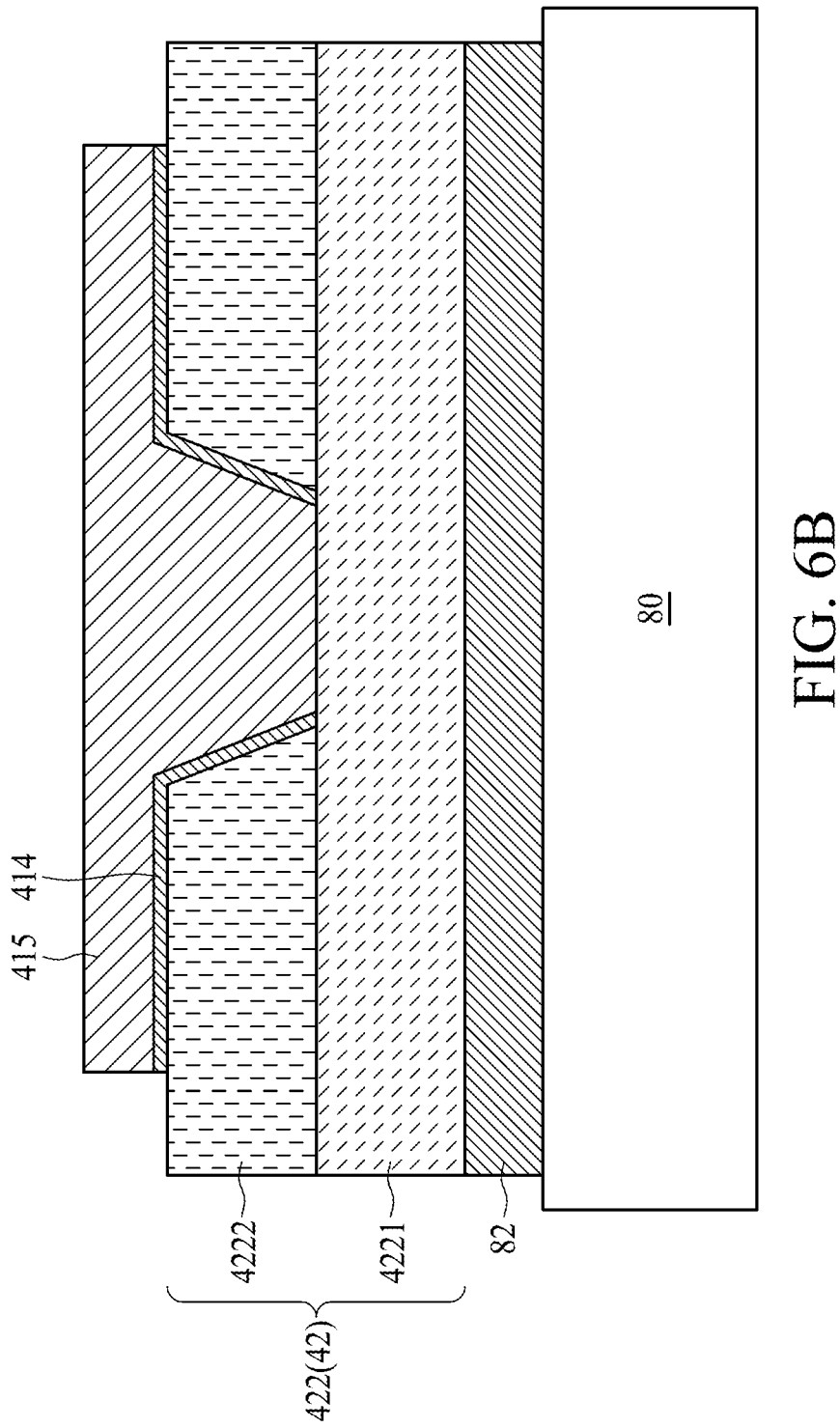

FIG. 6A, FIG. 6B, FIG. 6C, FIG. 6D and FIG. 6E illustrate sub-operations of manufacturing a semiconductor device package 2 in accordance with some embodiments of the present disclosure. In some embodiments, the manufacturing operations of the conductive wiring pattern 421 and the dielectric layer 422 may include sub-operations as illustrated in FIG. FIG. 6A, FIG. 6B, FIG. 6C, FIG. 6D and FIG. 6E. As shown in FIG. 6A, a base layer 82 is formed on the carrier 80. The base layer 82 may be configured as a seed layer, and/or a bonding enhancing layer. In some embodiments, the base layer 82 may include a stack of a bonding enhancing material having better adhesion to the carrier 80, and a seed layer. For example, the bonding enhancing layer may include a titanium layer formed by physical vapor deposition (PVD), and the seed layer may include copper. A first sub-layer 4221 of a dielectric layer 422 is formed on the base layer 82. As shown in FIG. 6B, a second sub-layer 4222 of the dielectric layer 422 is formed on the first sub-layer 4221. The second sub-layer 4222 is then patterned by for example etching, to expose the first sub-layer 4221. A fourth conductive material 414 and a fifth conductive material 415 are formed on the second sub-layer 4222 and the exposed first sub-layer 4221. In some embodiments, the material of the fourth conductive material 414 may include for example titanium formed by PVD for enhancing adhesion, and the material of the fifth conductive material 413 may include for example copper.

Figure 6C:
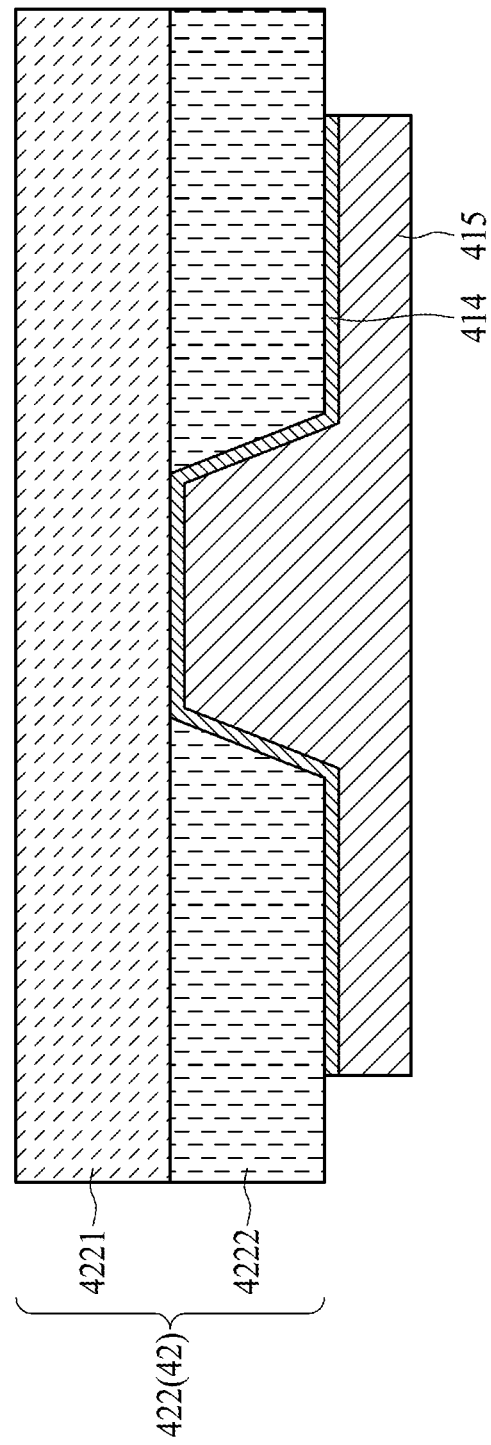
Figure 6D:
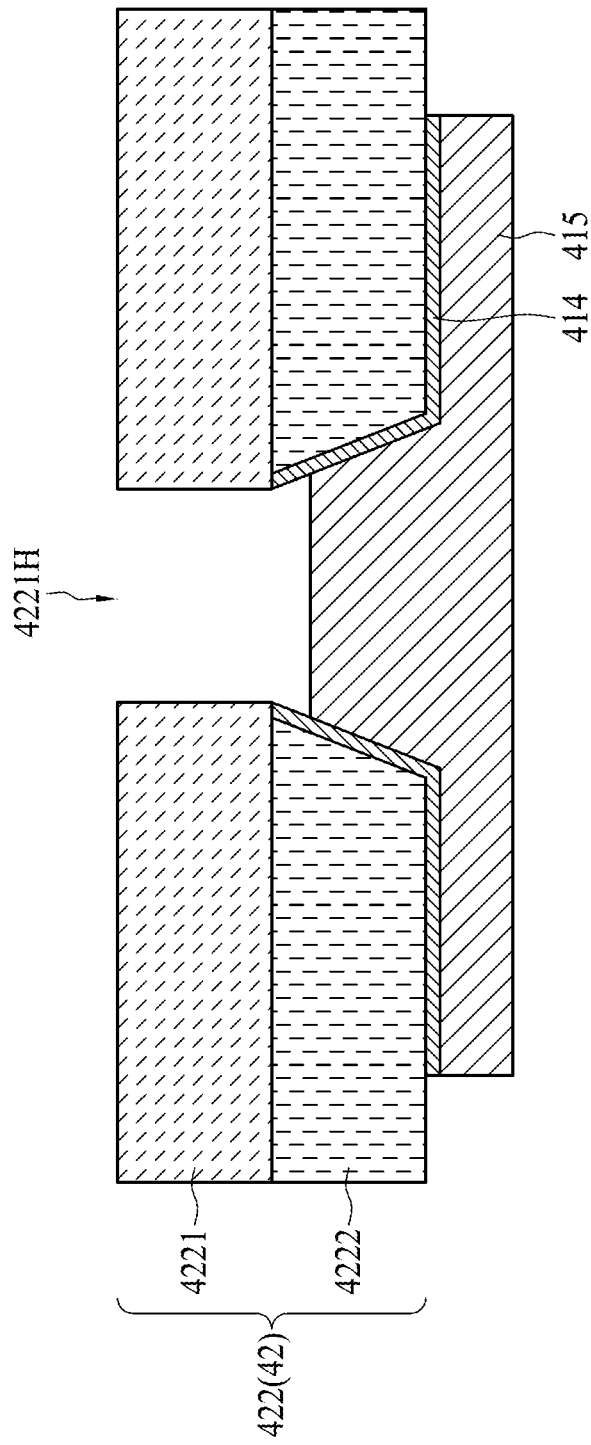
Figure 6E:
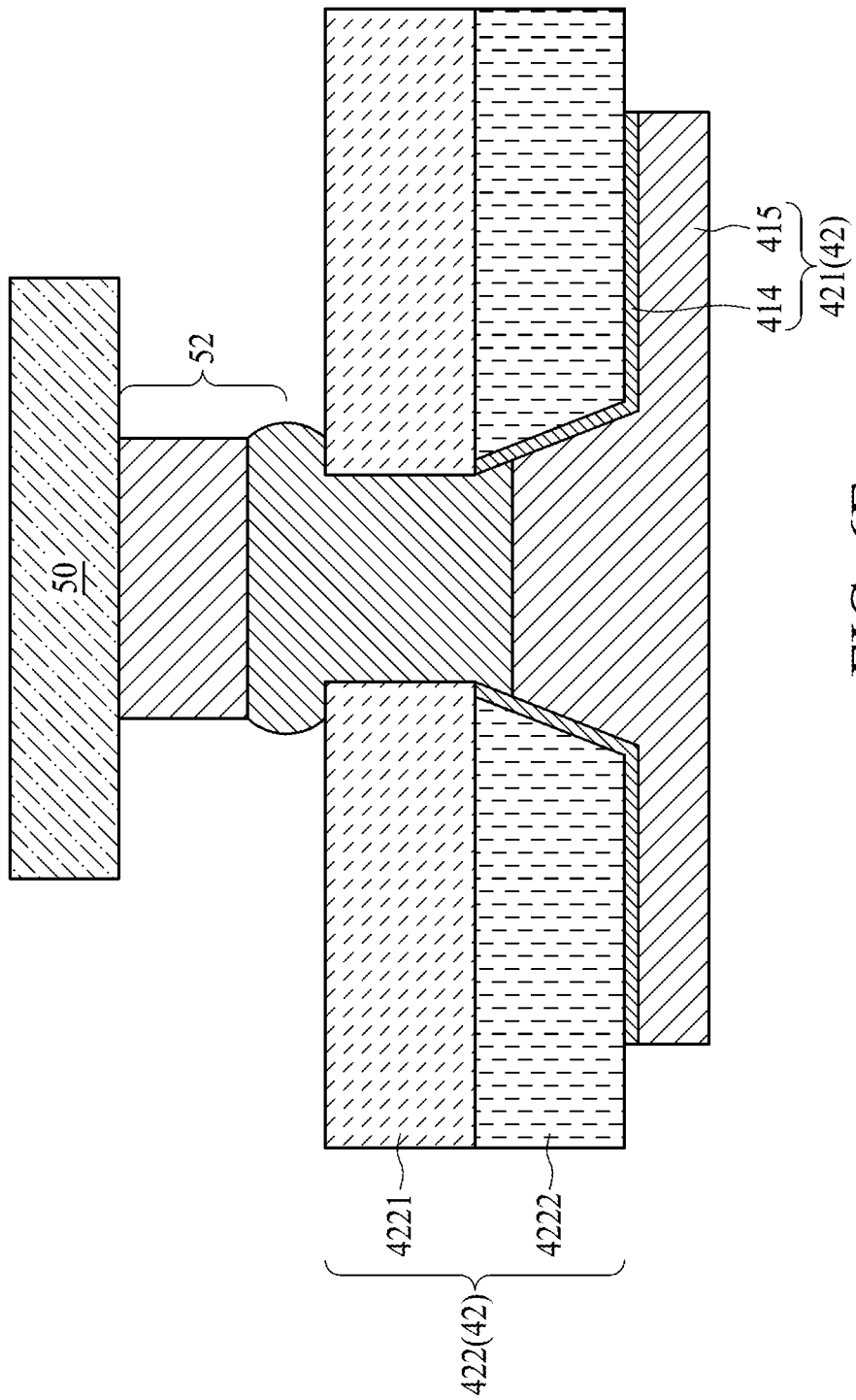

As shown in FIG. 6C, the carrier 80 is then removed from the dielectric layer 422 after the circuit layer 42 is accomplished and bonded to the first conductive structure 10 as shown in FIG. 4D. The base layer 82 is then removed by for example etching to expose the first sub-layer 4221. As shown in FIG. 6D, an opening 4221H is formed in the first sub-layer 4221 by for example etching. The fourth conductive material 414 exposed from the opening 4221H is then removed. As shown in FIG. 6E and FIG. 4F, the second electronic component 50 is formed on the dielectric layer 422 and electrically connected to the conductive wiring pattern 421 with the conductive bumps 52. In some embodiments, the conductive bump 52 is inserted into the opening 4221H to enhance bonding between the second electronic component 50 and the conductive wiring pattern 421. The opening 4221H may be partially or entirely filled with the conductive bump 52.

Figure 7:
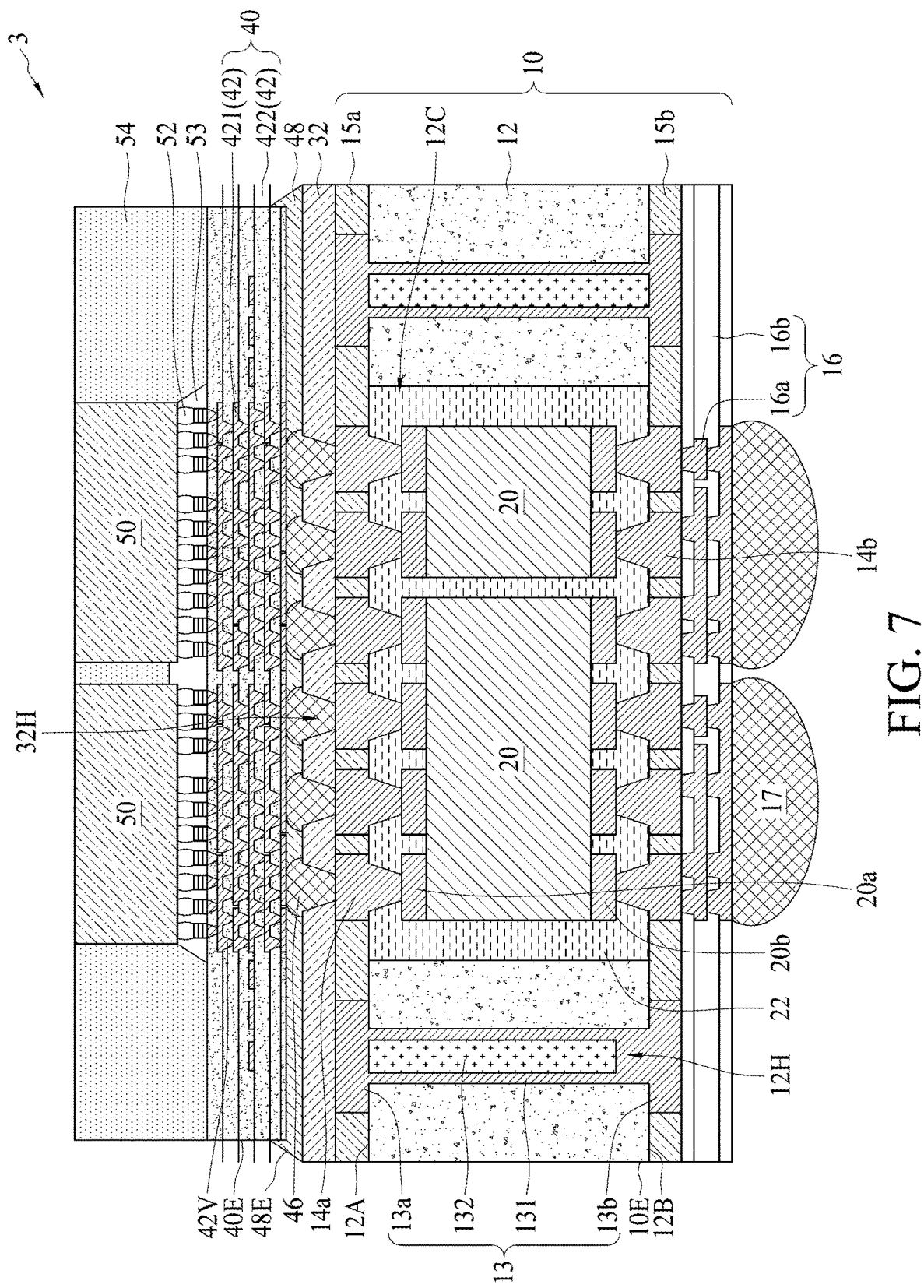
FIG. 7 is a cross-sectional view of a semiconductor device package in accordance with some embodiments of the present disclosure.

FIG. 7 is a cross-sectional view of a semiconductor device package 3 in accordance with some embodiments of the present disclosure. As shown in FIG. 7, the semiconductor device package 3 includes a first conductive structure 10, a passivation layer 32, and a second conductive structure 40. The passivation layer 32 is disposed on the upper circuit layer 14a of the first conductive structure 10. The passivation layer 32 includes a plurality of openings 32H partially exposing the upper circuit layer 14a. The second conductive structure 40 further includes a plurality of conductive bumps 46 electrically connected to the upper circuit layer 14a. The conductive bumps 46 extend into the openings 32H of the passivation layer 32 to enhance the robustness of bonding between the second conductive structure 40 and the first conductive structure 10. The conductive bumps 46 may include solders such as solder balls or solder paste, metal connectors such as metal pillars, or other suitable conductive bumps. In contrast to the semiconductor device package 2 of FIG. 3, the edge 48E of the underfill layer 48 of the semiconductor device package 3 may protrude out from the edge 40E of the second conductive structure 40. In some embodiments, the conductive via 42V may, but is not limited to, have an inversed trapezoid cross-sectional shape.

FIG. 8A, FIG. 8B, FIG. 8C, FIG. 8D and FIG. 8E illustrate operations of manufacturing a semiconductor device package 3 in accordance with some embodiments of the present disclosure. The manufacturing operation of the semiconductor device package 3 may be performed subsequent to the manufacturing operation illustrated in FIG. 4A. As shown FIG. 8A, a plurality of second conductive structures 40 are formed on a carrier 80. The second conductive structures 40 may include at least one circuit layer 42 including a plurality of conductive wiring patterns 421 and a plurality of dielectric layers 422. The conductive wiring patterns 421 and the dielectric layers 422 can be formed by alternately forming dielectric material layers and conductive layers on the carrier 80.

Figure 8A:
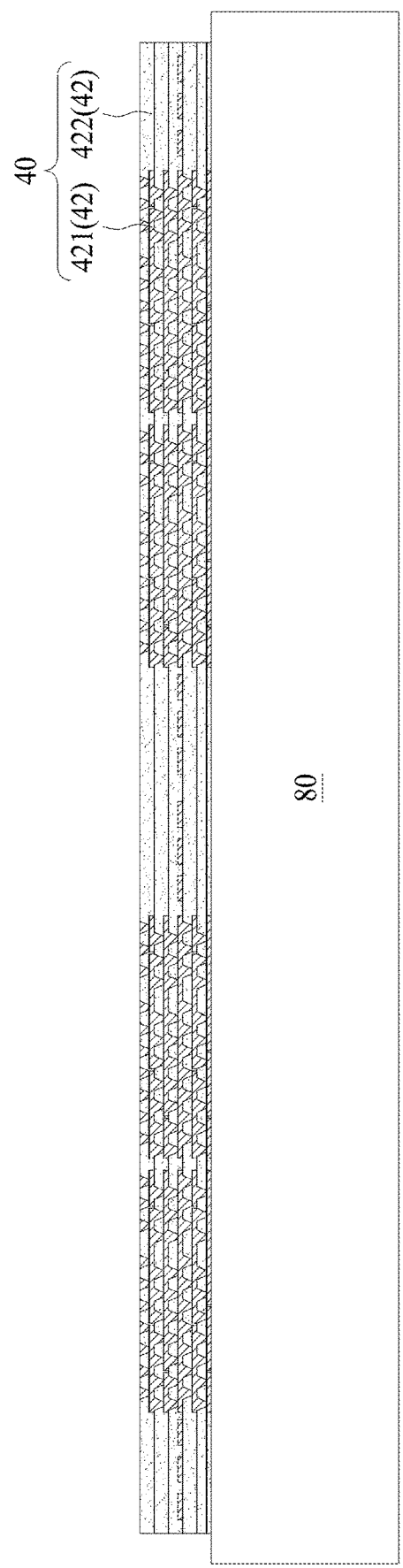
FIG. 8A, FIG. 8B, FIG. 8C, FIG. 8D and FIG. 8E illustrate operations of manufacturing a semiconductor device package in accordance with some embodiments of the present disclosure.
Figure 8B:
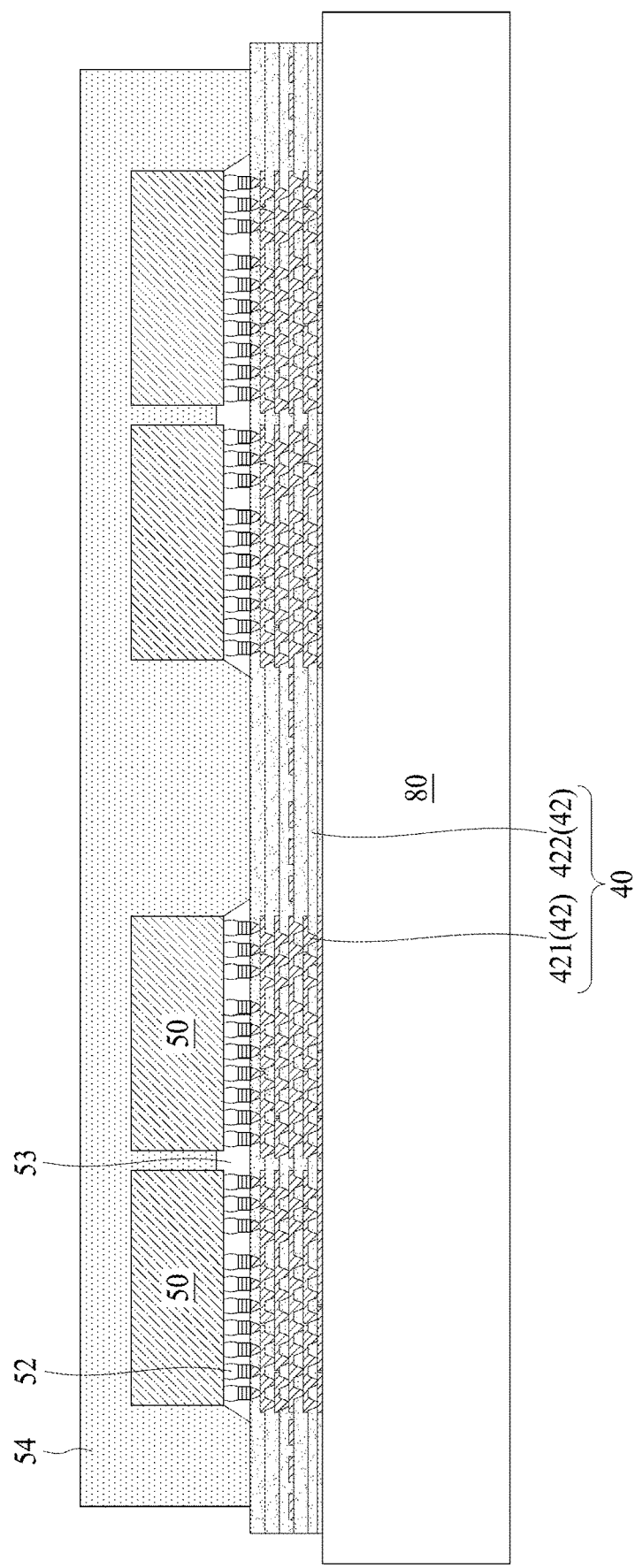

As shown in FIG. 8B, a plurality of second electronic components 50 are bonded to the second conductive structure 40. In some embodiments, conductive bumps 52 such as solder bumps or the like are used to bond the second electronic components 50 to the second conductive structures 40. In some embodiments, underfill layers 53 may be formed between the second electronic components 50 and the second conductive structures 40, surrounding the conductive bumps 52. An encapsulation layer 54 is formed on the second conductive structures 40 to encapsulate the second electronic components 50. In some embodiments, the encapsulation layer 54 may encapsulate sidewalls and upper surface of the second electronic components 50. The encapsulation layer 54 may be grinded to expose the upper surfaces of the second electronic components 50. The encapsulation layer 54 may further cover the edges 40E of the second conductive structures 40 and the edges 48E of the underfill layers 48.

Figure 8C:
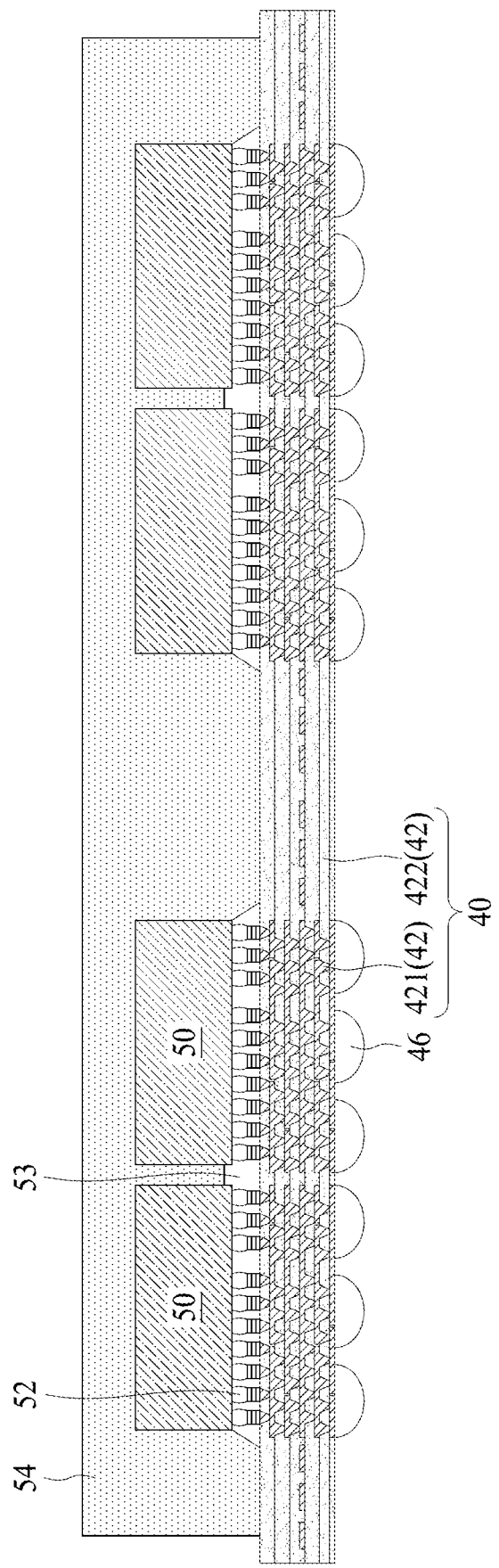
Figure 8D:
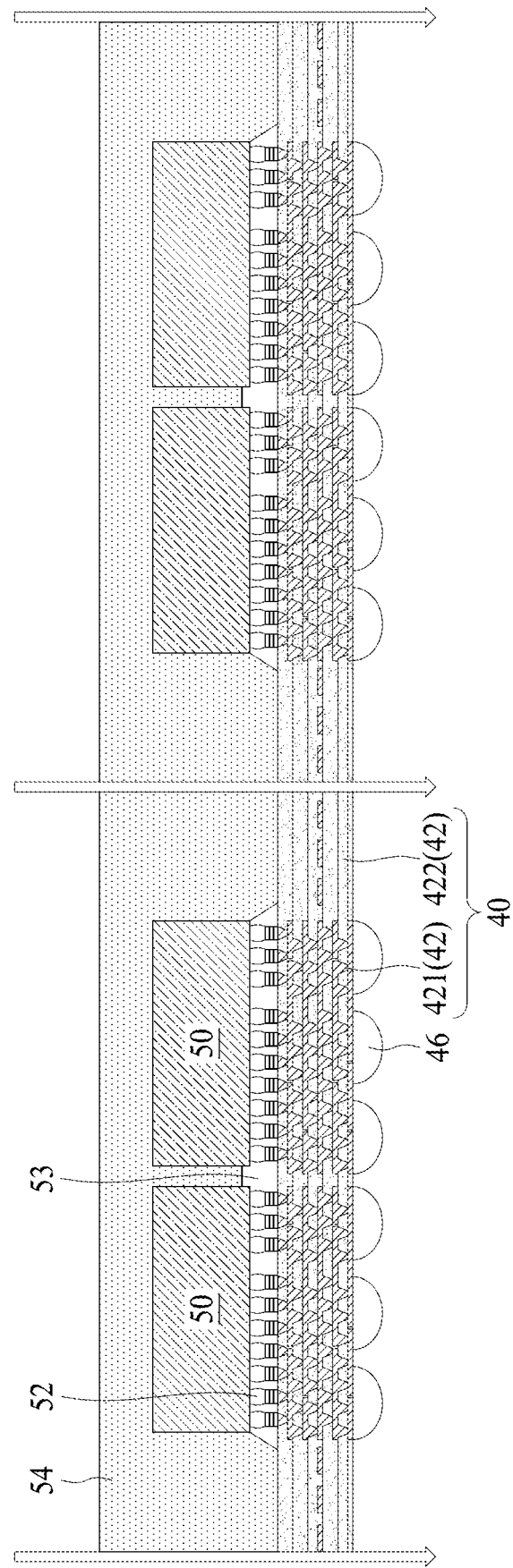
Figure 8E:
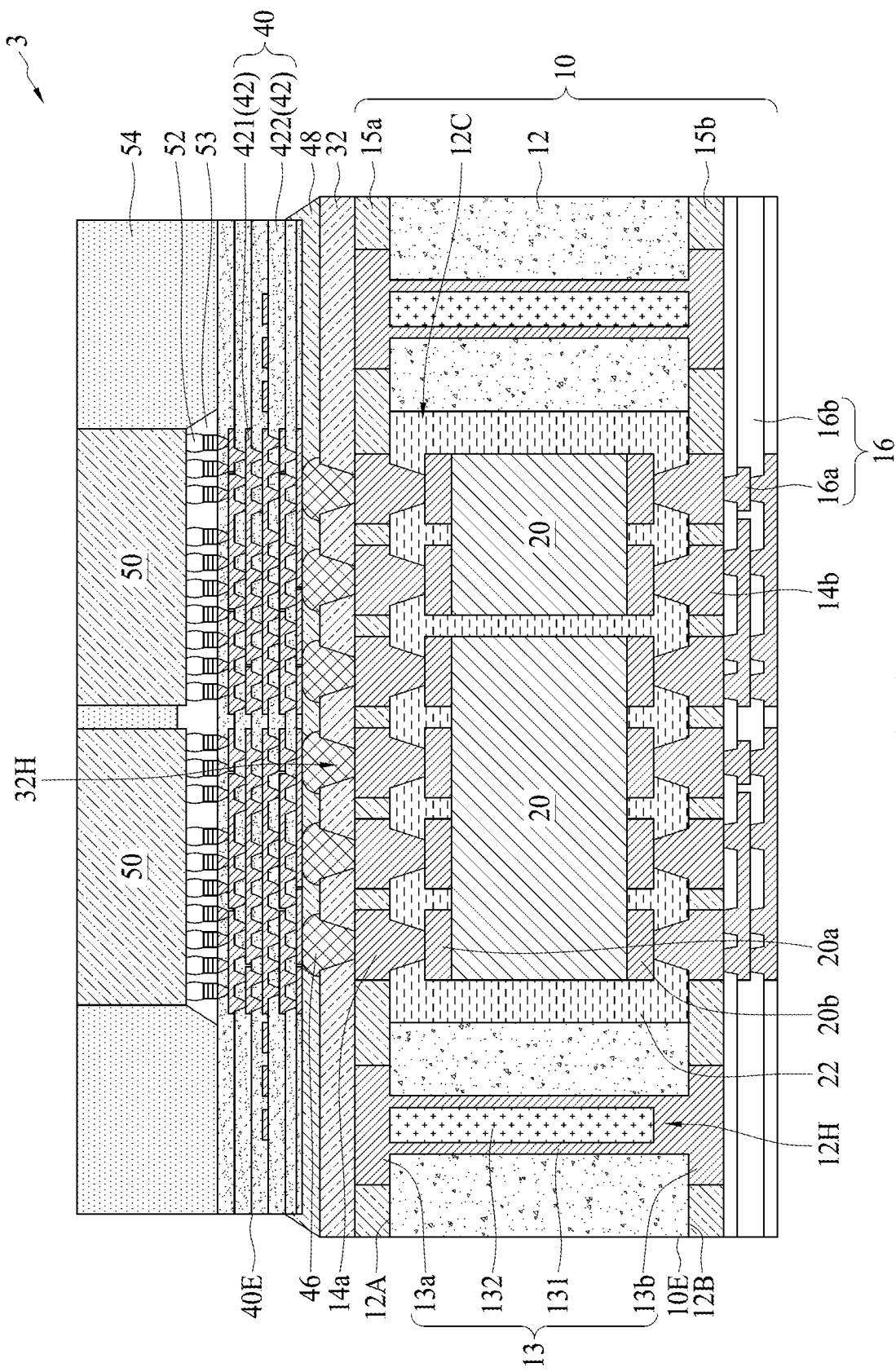

As shown in FIG. 8C, the carrier 80 is removed. A plurality of conductive bumps 46 are formed on the circuit layer 42 of the second conductive structures 40. As shown in FIG. 8D, the second conductive structures 40 and the second electronic components 50 are singulated. As shown in FIG. 8E, the singulated second conductive structure 40 is bonded to the first conductive structure 10 with the conductive bumps 46 inserting into the openings 32H of the passivation layer 32 and electrically connecting the upper circuit layer 14a. An underfill layer 48 is then formed between the passivation layer 32 and the second conductive structure 40, and surrounding the conductive bumps 46. Electrical conductors 17 such as solder balls are formed on the bottom RDL 16 to form the semiconductor device package 3 as illustrated in FIG. 7.

Figure 9:
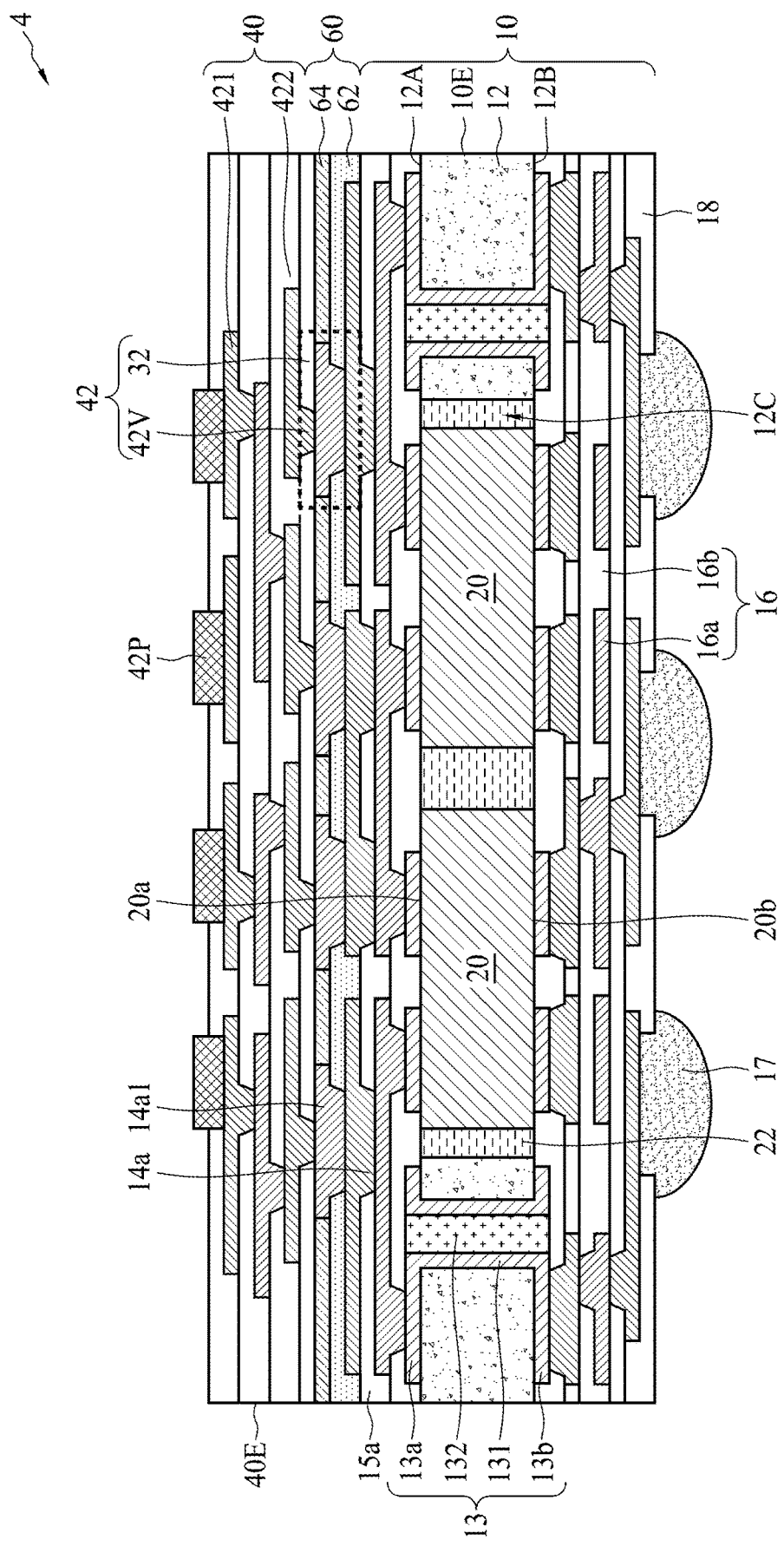
FIG. 9 is a cross-sectional view of a semiconductor device package in accordance with some embodiments of the present disclosure.
Figure 9A:
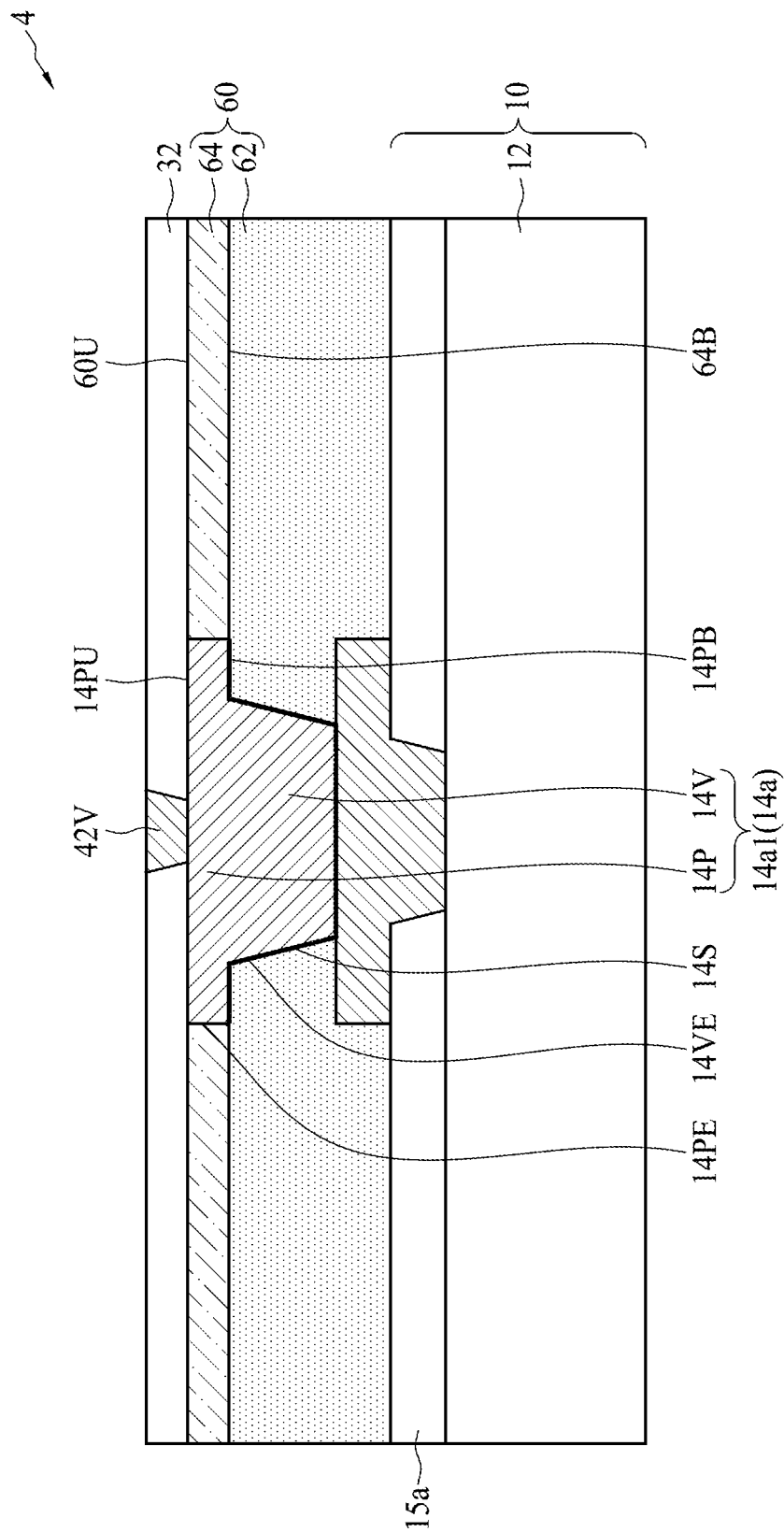
FIG. 9A is an enlarged view of a semiconductor device package in FIG. 9.

FIG. 9 is a cross-sectional view of a semiconductor device package 4 in accordance with some embodiments of the present disclosure, and FIG. 9A is an enlarged view of a semiconductor device package 4 in FIG. 9. As shown in FIG. 9 and FIG. 9A, the semiconductor device package 4 includes a first conductive structure 10, a stress buffering structure 60 and a second conductive structure 40. The first conductive structure 10 includes a substrate 12, and an upper circuit layer (also referred to as first circuit layer) 14a. The upper circuit layer 14a is disposed on the substrate 12, and the upper circuit layer 14a includes a conductive wiring pattern 14a1. In some embodiments, the first conductive structure 10 may further include a passivation layer 18 such as a solder resist layer disposed on the dielectric layer 16b of the bottom RDL 16 for defining the locations of the electrical conductors 17. The stress buffering structure 60 is disposed on the first conductive structure 10. The second conductive structure 40 is disposed over the stress buffering structure 60. In some embodiments, the second conductive structure 40 may further include bonding pads 42P electrically connected to the conductive wiring pattern 421 and exposed from the dielectric layer 422 of the circuit layer 42 for receiving other electronic component(s) such as the second electronic component 50 shown in FIG. 1.

In some embodiments, the conductive wiring pattern 14a1 is an uppermost conductive pattern of the upper circuit layer 14a. The conductive wiring pattern 14a1 extends through the stress buffering structure 60 and electrically connected to the second conductive structure 40, and an upper surface 14PU of the conductive wiring pattern 14a1 is substantially coplanar with an upper surface 60U of the stress buffering structure 60. In some embodiments, the characteristics of the stress buffering layer 60 may be similar to or identical to the stress buffering layer 30. By way of example, the CTE of the stress buffering layer 60 is between the CTE of the first conductive structure 10 and the CTE of the second conductive structure 40 such that warpage and delamination issue can be alleviated. The stress buffering layer 60 can also be configured as a planarization layer for the first conductive structure 10, and thus the second conductive structure 40 can be directly fabricated on the first conductive structure 40 without requiring large-size solder balls. Furthermore, the stress buffering layer 60 is softer than the upper dielectric layer 15a and the conductive wiring pattern 14a1. In some embodiments, the stress buffering layer 60 may include a non optical-sensitive and non optical-cured material. By way of example, the non optical-sensitive and non optical-cured material includes resin e.g. ABF ink.

In some embodiments, the conductive wiring pattern 14a1 includes a via portion 14V and a pad portion 14P disposed on the via portion 14V, and an edge 14PE of the pad portion 14P is protruding out from an edge 14VE of the via portion 14V. In some embodiments, a seed layer 14S may cover a bottom surface of the conductive wiring pattern 14a1. The via portion 14V and the pad portion 14P both extend through the stress buffering structure 60. The upper surface 14PU of the pad portion 14P is the upper surface of the conductive wiring pattern 14a1, and the upper surface 14PU of the pad portion 14P is substantially coplanar with an upper surface 60U of the stress buffering structure 60. In some embodiments, the height difference between the upper surface 14PU of the pad portion 14P and the upper surface 60U of the stress buffering structure 60 is less than or equal to 4 micrometers such as 4 micrometers, 3 micrometers, 2 micrometers or 1 micrometer. The stress buffering structure 60 can be planarized to increase the surface uniformity between the upper surface 60U and the upper surface 14PU. The substantially coplanar profile of the upper surface 60U and the upper surface 14PU allows building up the bumping-level circuit layer 42 which is a high-density circuit layer with narrower L/S.

In some embodiments, the stress buffering structure 60 may include a multi-layered stress buffering structure. For example, the stress buffering structure 60 may include a first stress buffering layer 62 surrounding the edge 14VE of the via portion 14V, and a second stress buffering layer 64 surrounding the edge 14PE of the pad portion 14P. In some embodiments, the CTE of the second stress buffering layer 64 is between the CTE of the first stress buffering layer 62 and the CTE of the second conductive structure 40 such that warpage and delamination issue can be alleviated. The second stress buffering layer 64 is softer than the pad portion 14P. The upper surface of the second stress buffering layer 64 is the upper surface 60U of the stress buffering structure 60, and a bottom surface 14PB of the pad portion 14P is substantially coplanar with a bottom surface 64B of the second stress buffering layer 64. In some other embodiments, the stress buffering structure 60 may include a single-layered stress buffering structure. The circuit layer 42 includes a passivation layer 32 disposed on the stress buffering structure 60, and a plurality of conductive vias 42V through the passivation layer 32. In some embodiments, one conductive vias 42V is connected to the conductive wiring pattern 14a1 as shown in FIG. 9A.

Figure 9B:
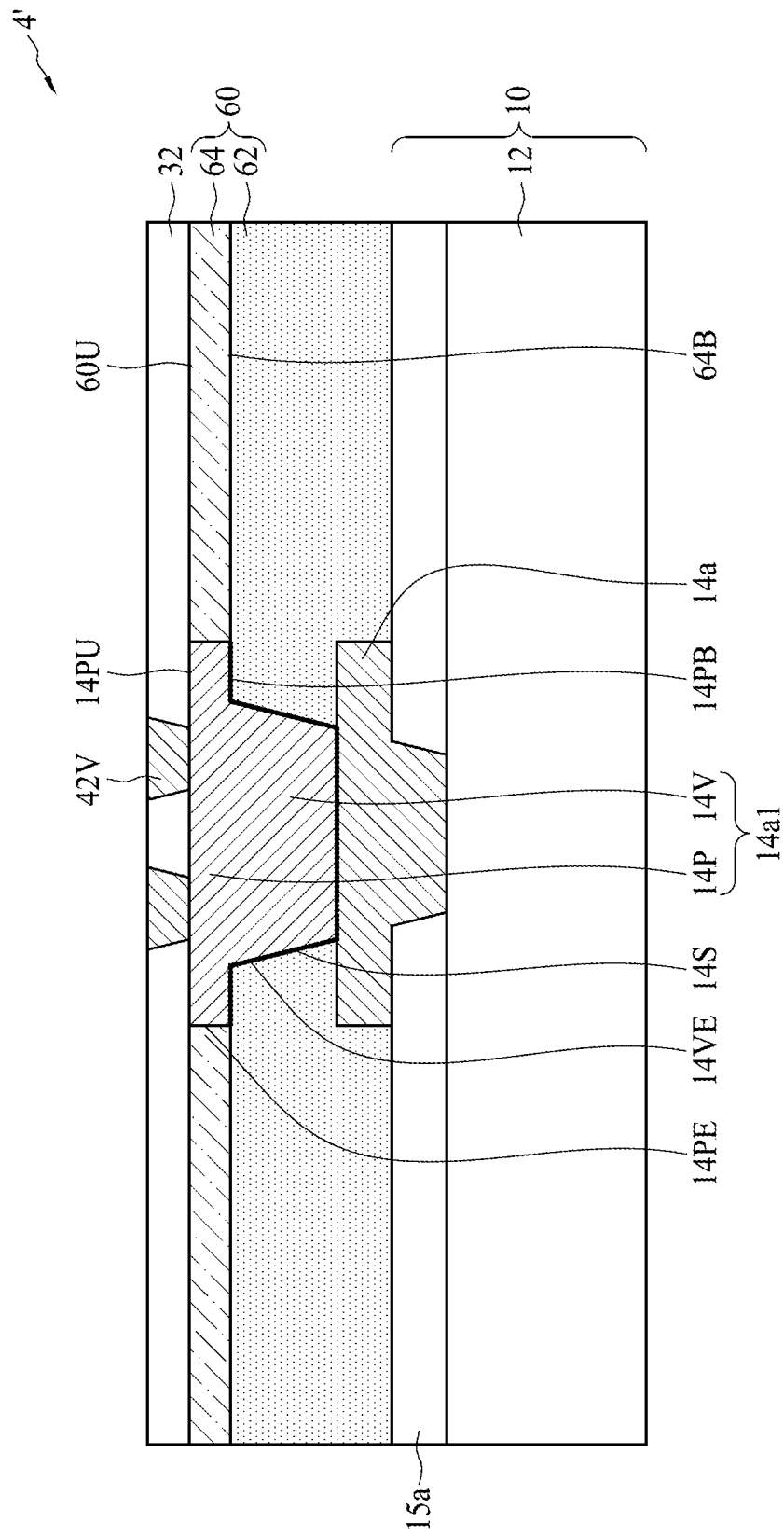
FIG. 9B is an enlarged cross-sectional view of a semiconductor device package in accordance with some embodiments of the present disclosure.

Refer to FIG. 9 and FIG. 9B. FIG. 9B is an enlarged cross-sectional view of a semiconductor device package 4' in accordance with some other embodiments of the present disclosure. In some other embodiments, the surface uniformity between the upper surface 60U and the upper surface 14PU is increased, therefore the landing area of the pad portion 14P can be increased, and two or more conductive vias 42V can be connected to the conductive wiring pattern 14a1 as shown in FIG. 9B. The increased pad area of the pad portion 14P allows electrically connecting signal from the pad portion 14P to two or more different terminals of the circuit layer 42, such that circuit design flexibility can be increased.

Figure 10A:
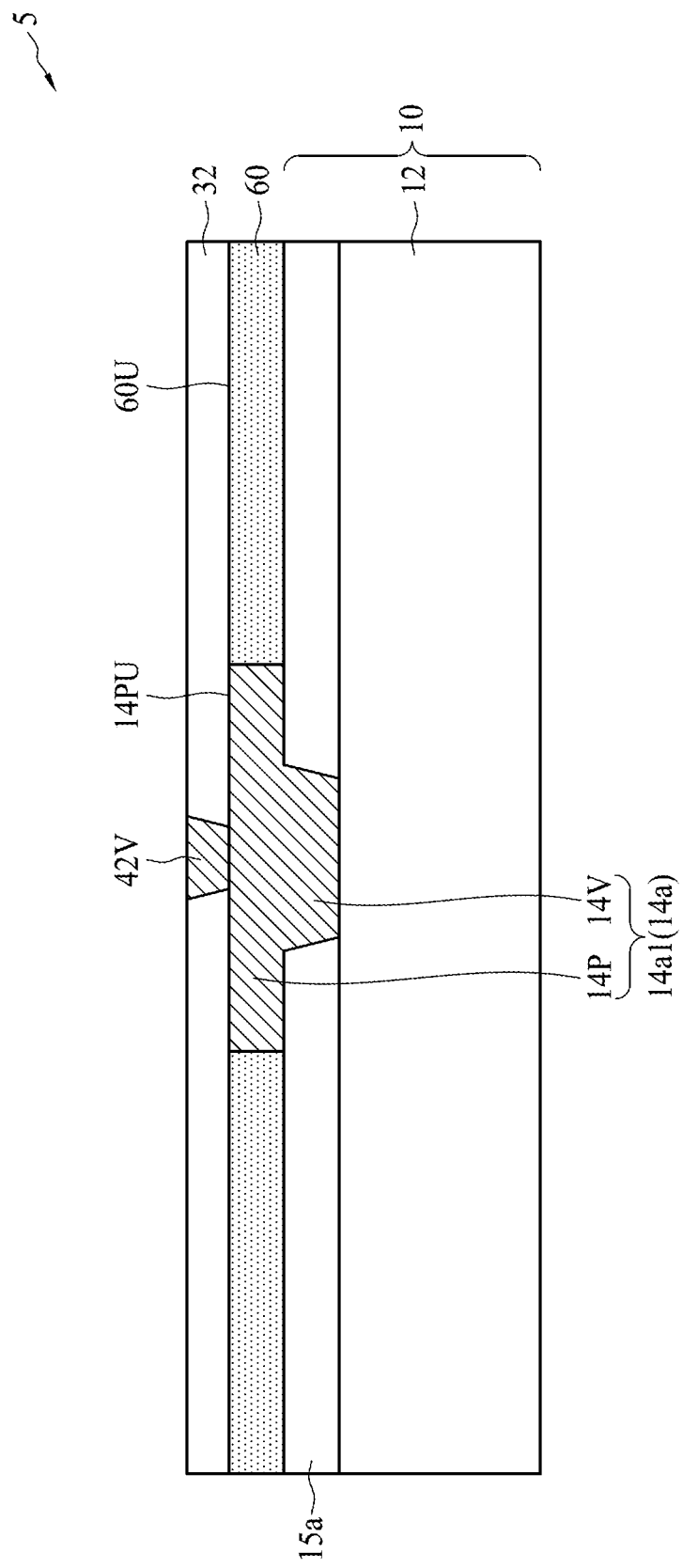
FIG. 10A is an enlarged cross-sectional view of a semiconductor device package in accordance with some embodiments of the present disclosure.

Refer to FIG. 9 and FIG. 10A. FIG. 10A is an enlarged cross-sectional view of a semiconductor device package 5 in accordance with some embodiments of the present disclosure. As shown in FIG. 10A, in contrast to the semiconductor device package 4, the stress buffering structure 60 may include a single-layered stress buffering structure. The conductive wiring pattern 14a1 includes a via portion 14V extending through the upper dielectric layer 15a, and a pad portion 14P extending through the stress buffering structure 60. The edge 14PE of the pad portion 14P is protruding out from the edge 14VE of the via portion 14V, and the upper surface 14PU of the pad portion 14P is substantially coplanar with the upper surface 60U of the stress buffering structure 60. In some embodiments, the height difference between the upper surface 14PU of the pad portion 14P and the upper surface 60U of the stress buffering structure 60 is less than or equal to 4 micrometers such as 4 micrometers, 3 micrometers, 2 micrometers or 1 micrometer. The stress buffering structure 60 can be planarized to increase the surface uniformity between the upper surface 60U and the upper surface 14PU. The substantially coplanar profile of the upper surface 60U and the upper surface 14PU allows building up the bumping-level circuit layer 42 which is a high-density circuit layer with narrower L/S.

Figure 10B:
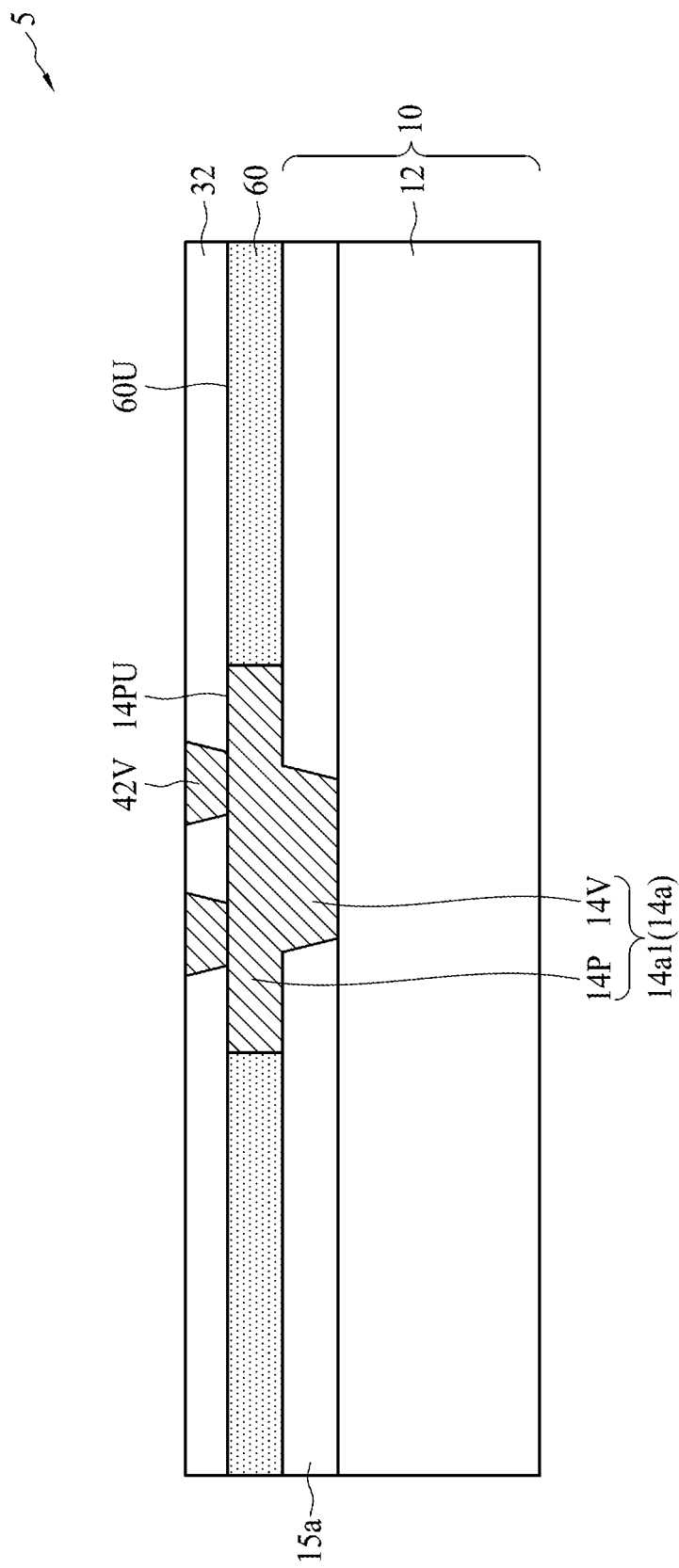
FIG. 10B is an enlarged cross-sectional view of a semiconductor device package in accordance with some embodiments of the present disclosure.

Refer to FIG. 9 and FIG. 10B. FIG. 10B is an enlarged cross-sectional view of a semiconductor device package 5' in accordance with some embodiments of the present disclosure. In some other embodiments, the surface uniformity between the upper surface 60U and the upper surface 14PU is increased, therefore the area of the pad portion 14P can be increased, and two or more conductive vias 42V can be connected to the conductive wiring pattern 14a1 as shown in FIG. 10B. The increased pad area of the pad portion 14P allows electrically connecting signal from the pad portion 14P to two or more different terminals of the circuit layer 42, such that circuit design flexibility can be increased.

FIG. 11A, FIG. 11B, FIG. 11C, FIG. 11D, FIG. 11E and FIG. 11F illustrate operations of manufacturing a semiconductor device package 4 in accordance with some embodiments of the present disclosure. As shown FIG. 11A, a substrate 12 is provided. An upper circuit layer 14a is formed on the substrate 12. In some embodiments, a first stress buffering layer (also referred to as a bottom stress buffering layer) 62 is formed on the substrate 12 to cover the upper circuit layer 14a.

Figure 11A:
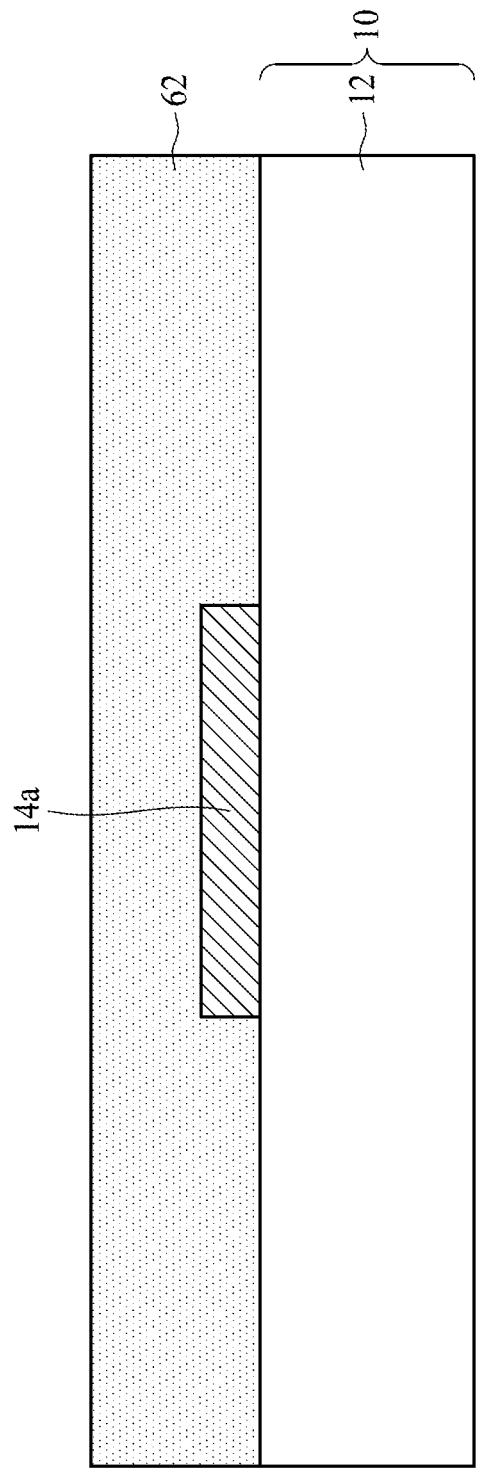
FIG. 11A, FIG. 11B, FIG. 11C, FIG. 11D, FIG. 11E and FIG. 11F illustrate operations of manufacturing a semiconductor device package in accordance with some embodiments of the present disclosure.
Figure 11B:
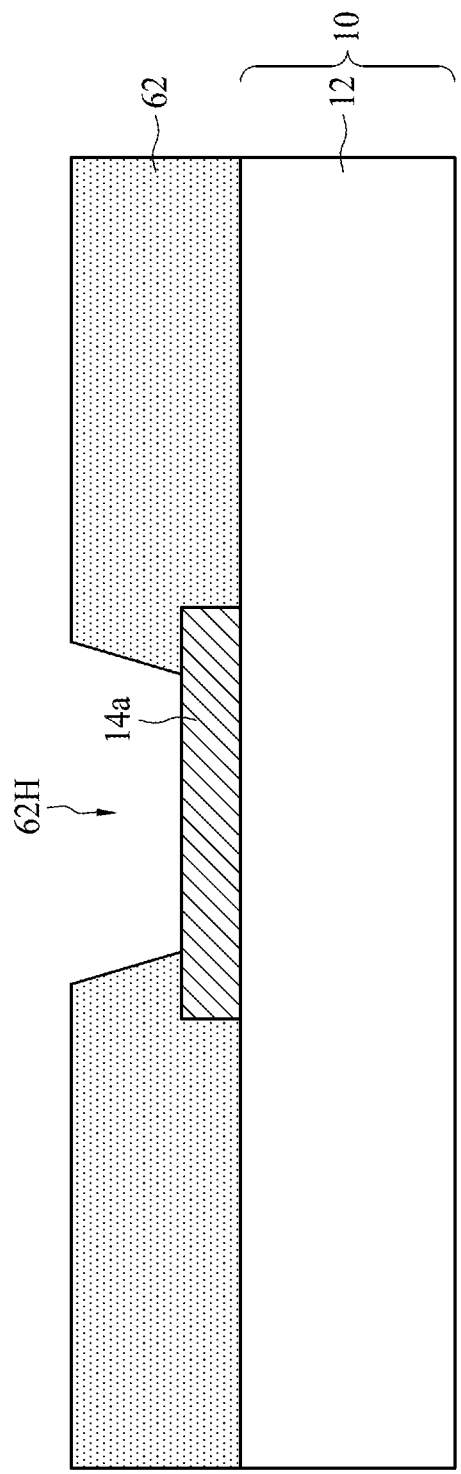

As shown in FIG. 11B, the first stress buffering layer 62 is perforated to form a hole 62H partially exposing the upper circuit layer 14a. In some embodiments, the first stress buffering layer 62 may include a non optical-sensitive and non optical-cured material including resin e.g. ABF ink, and can be perorated in an optical manner such as laser drilling or in a mechanical manner such as mechanical drilling.

Figure 11C:
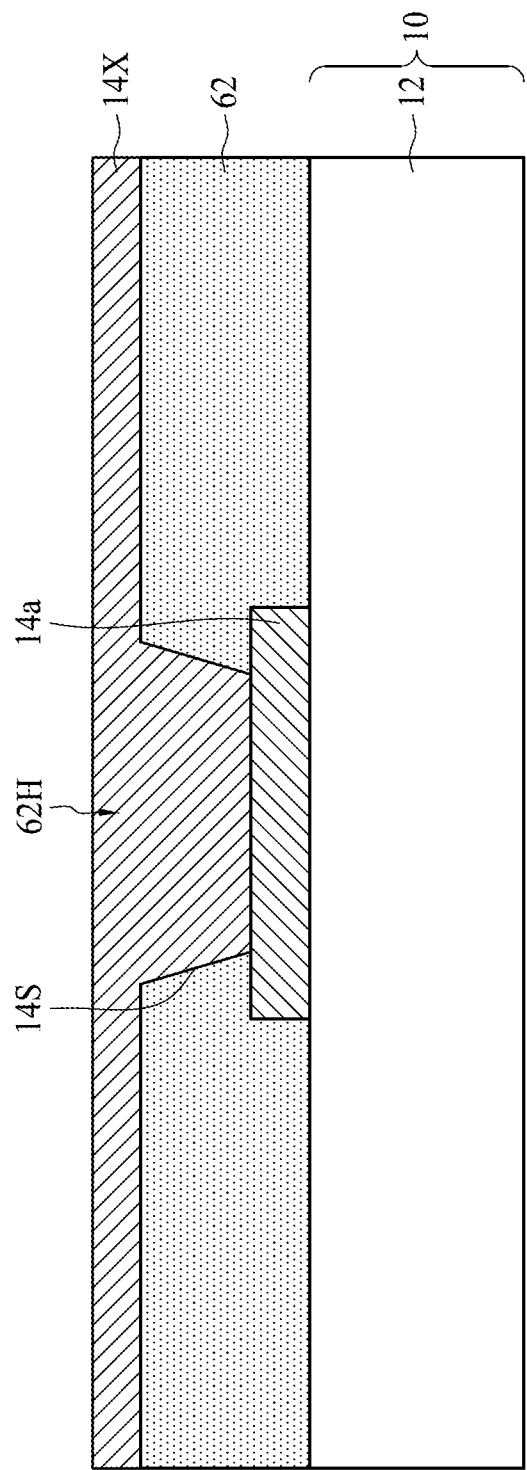
Figure 11D:
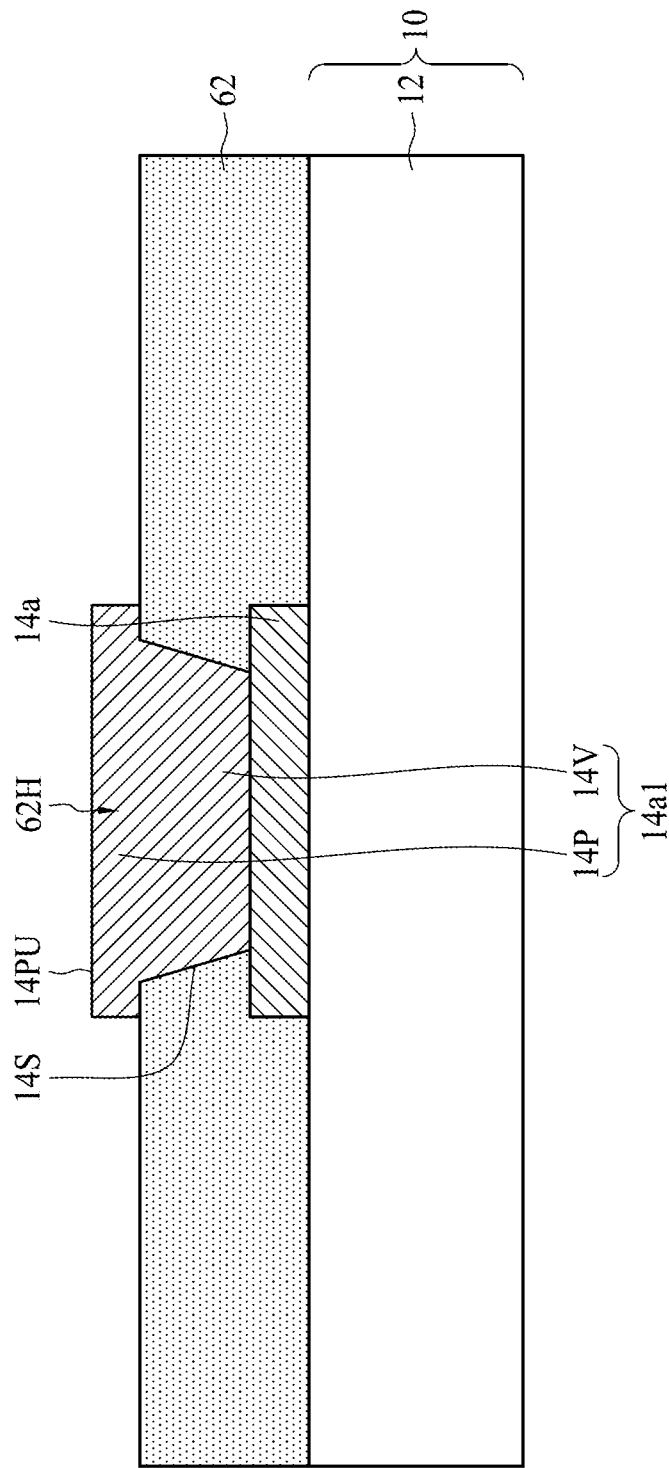

As shown in FIG. 11C, a conductive material 14X is formed on the first stress buffering layer 62 and filling in the hole 62H. In some embodiments, a seed layer 14S is formed on the first stress buffering layer 62 and in the hole 62H prior to forming the conductive material 14X, and the conductive material 14X such as copper or the like is electroplated on the seed layer 14P. As shown in FIG. 11D, the conductive material 14X is patterned by, e.g., photolithography and etching, to form the conductive wiring pattern 14a1. The conductive wiring pattern 14a1 includes a via portion 14V in the hole 62H, and a pad pattern 14P on the first stress buffering layer 62. In some other embodiments, a resist pattern such as a photoresist pattern can be formed on the first stress buffering layer 62 to define the location of the conductive wiring pattern 14a1 prior to electroplating the conductive material 14X.

Figure 11E:
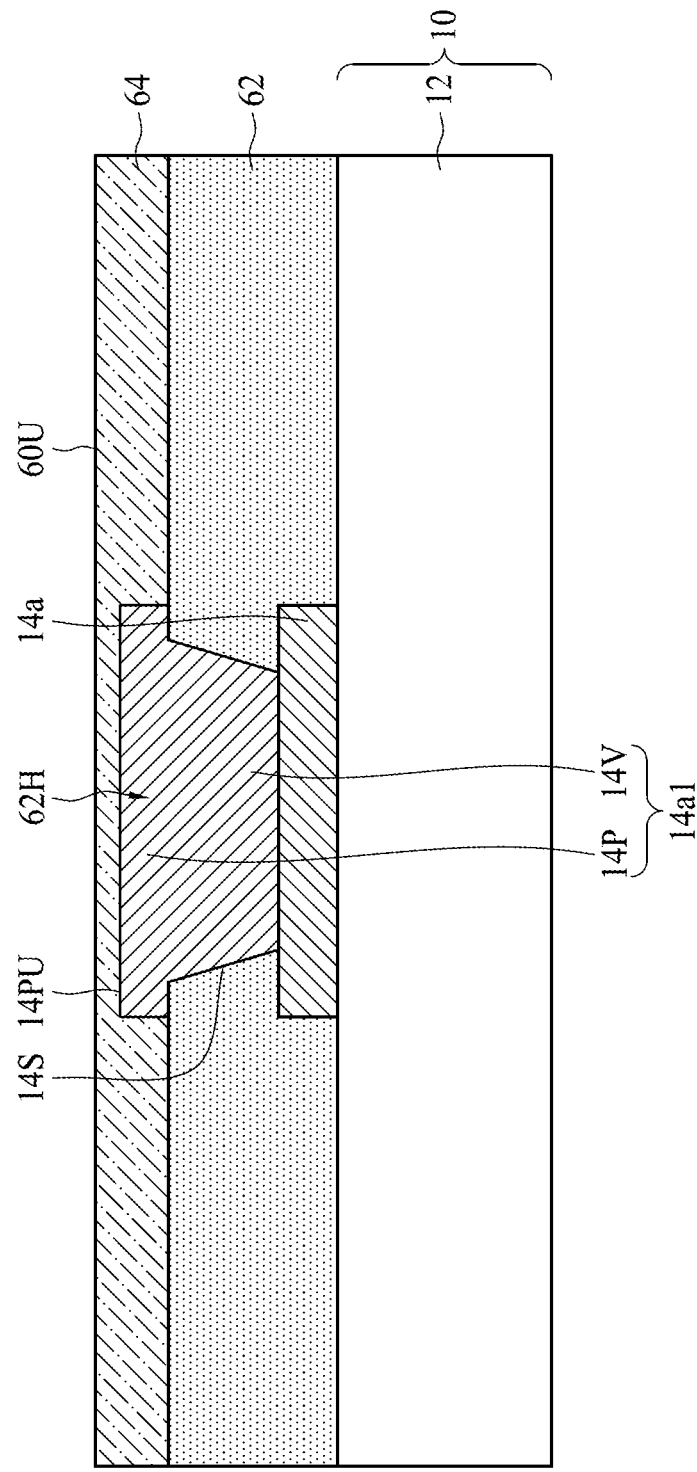
Figure 11F:
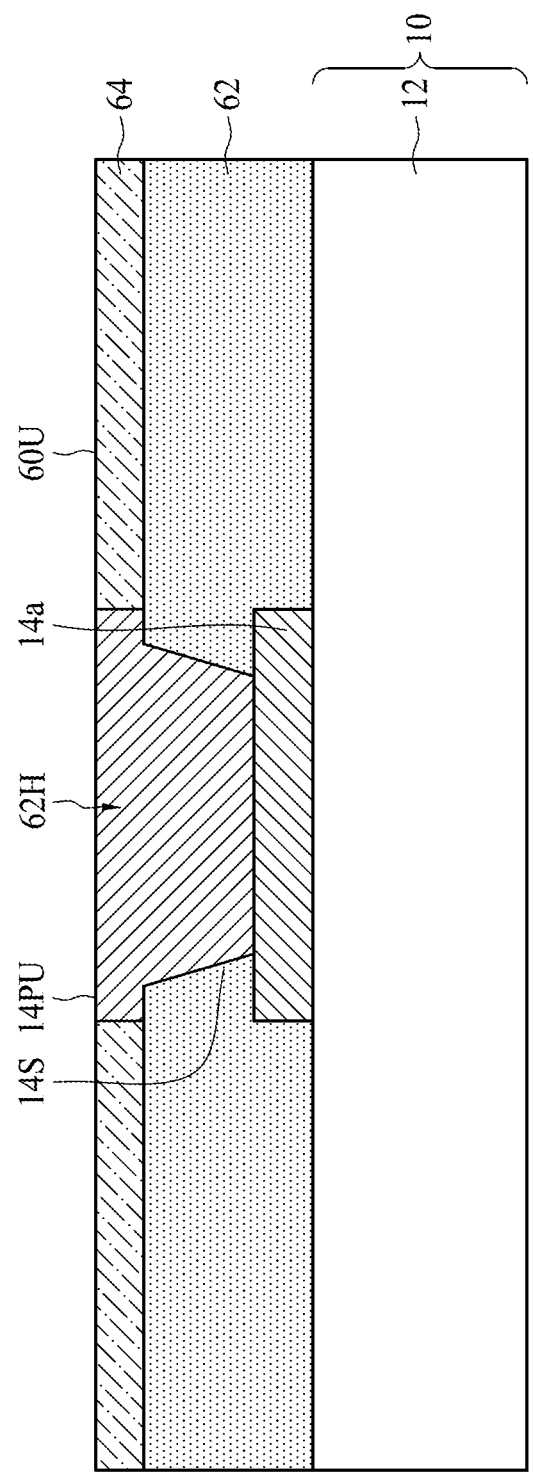

As shown in FIG. 11E, a second stress buffering layer (also referred to a stress buffering layer or an upper stress buffering layer) 64 is formed on the substrate to cover the conductive wiring pattern 14a1. In some embodiments, the second stress buffering layer 64 may include a non optical-sensitive and non optical-cured material including resin e.g. ABF ink. As shown in FIG. 11F, the second stress buffering layer 64 is thinned to expose an upper surface 14PU of the conductive wiring pattern 14a1. In some embodiments, the second stress buffering layer 64 is grinded to form a height difference between the upper surface 14PU of the pad portion 14P and the upper surface 60U of the stress buffering structure 60 less than or equal to 4 micrometers. A passivation layer 32 is formed on the second stress buffering layer 64 and the conductive wiring pattern 14a1, and one or more openings are formed in the passivation layer 32 exposing the upper surface 14PU of the conductive wiring pattern 14a1. Then, a circuit layer 42 is then built up on the second stress buffering layer 64 and electrically connected to the conductive wiring pattern 14a1 to form the semiconductor device package as shown in FIG. 9.

Figure 12A:
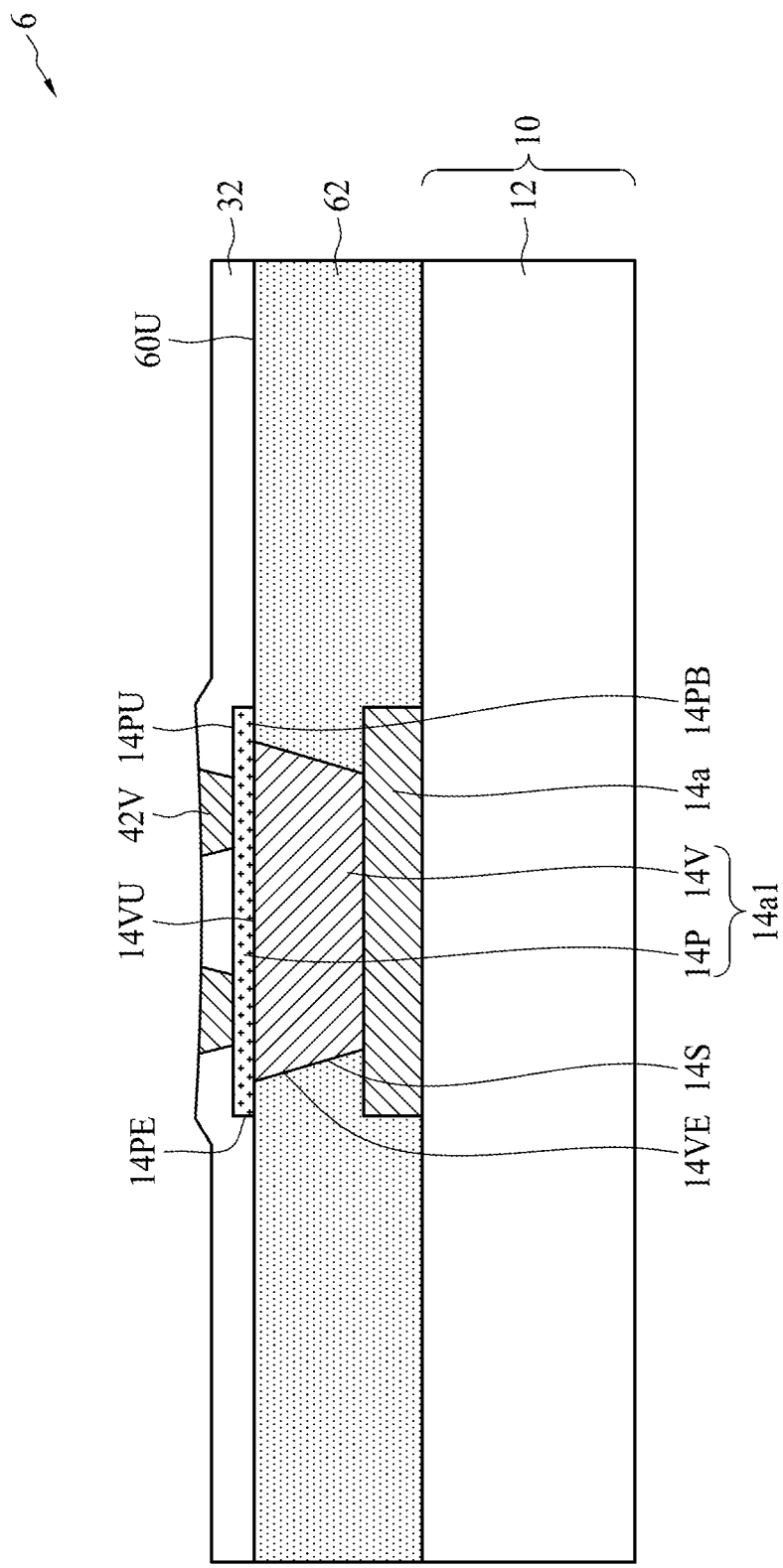
FIG. 12A is an enlarged cross-sectional view of a semiconductor device package in accordance with some embodiments of the present disclosure.

Refer to FIG. 9 and FIG. 12A. FIG. 12A is an enlarged cross-sectional view of a semiconductor device package 6 in accordance with some embodiments of the present disclosure. As shown in FIG. 12A, in contrast to the semiconductor device package 4 of FIG. 9, the conductive wiring pattern 14a1 of the semiconductor device package 6 includes a via portion 14V including an edge 14VE surrounded by the stress buffering structure 60, and a pad portion 14P disposed on the stress buffering structure 60. The upper surface 14VU of the via portion 14V is substantially coplanar with the upper surface 60U of the stress buffering structure 60. A height difference between an upper surface 14PU of the pad portion 14P and the upper surface 60U of the stress buffering structure 60 is less than or equal to 4 micrometers. The circuit layer 42 includes a passivation layer 32 disposed on the stress buffering structure 60, and one or more conductive vias 42V through the passivation layer 32 and connected to the conductive wiring pattern 14a1. Since the height difference between an upper surface 14PU of the pad portion 14P and the upper surface 60U of the stress buffering structure 60 is less than or equal to 4 micrometers, this substantially coplanar profile of the upper surface 60U and the upper surface 14PU allows building up the bumping-level circuit layer 42 which is a high-density circuit layer with narrower L/S.

Figure 12B:
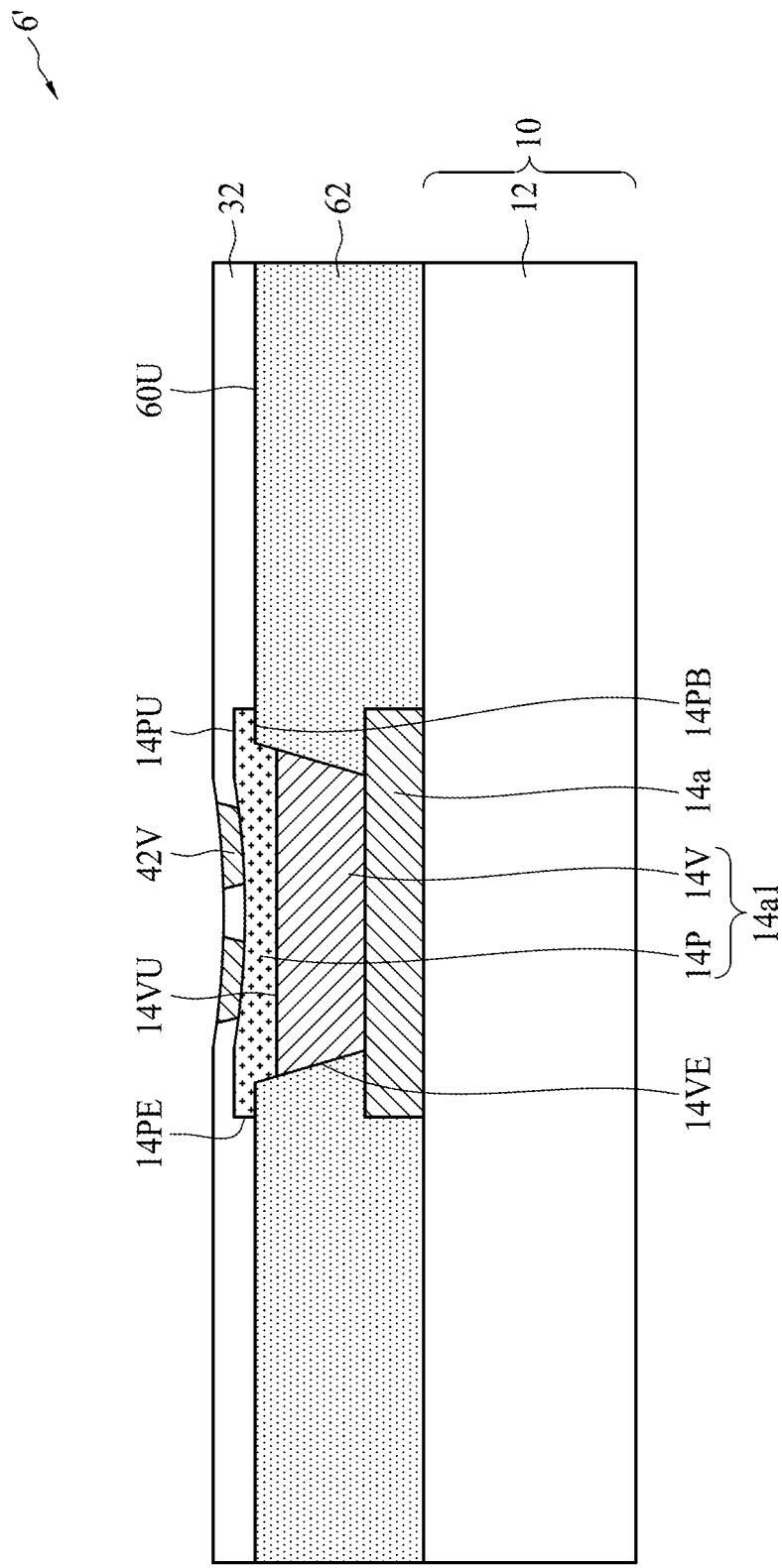
FIG. 12B is an enlarged cross-sectional view of a semiconductor device package in accordance with some embodiments of the present disclosure.

Refer to FIG. 9 and FIG. 12B. FIG. 12B is an enlarged cross-sectional view of a semiconductor device package 6' in accordance with some embodiments of the present disclosure. As shown in FIG. 12B, in contrast to the semiconductor device package 6 of FIG. 12A, the upper surface 14VU of the via portion 14V of the semiconductor device package 6' is lower than the upper surface 60U of the stress buffering structure 60. In some embodiments, at least a portion of a bottom surface 14PB of the pad portion 14P is lower than the upper surface 60U of the stress buffering structure 60.

Figure 13A:
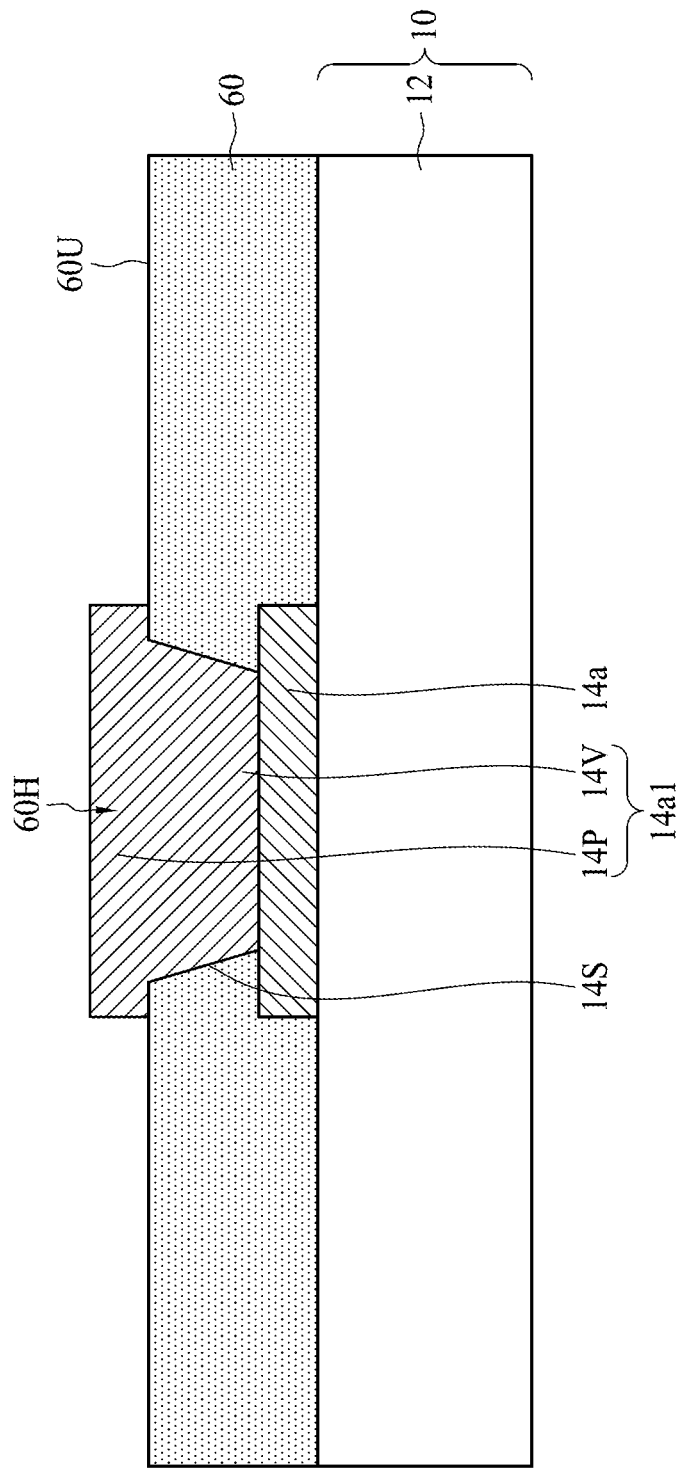
FIG. 13A, FIG. 13B and FIG. 13C illustrate operations of manufacturing a semiconductor device package in accordance with some embodiments of the present disclosure.
Figure 13B:
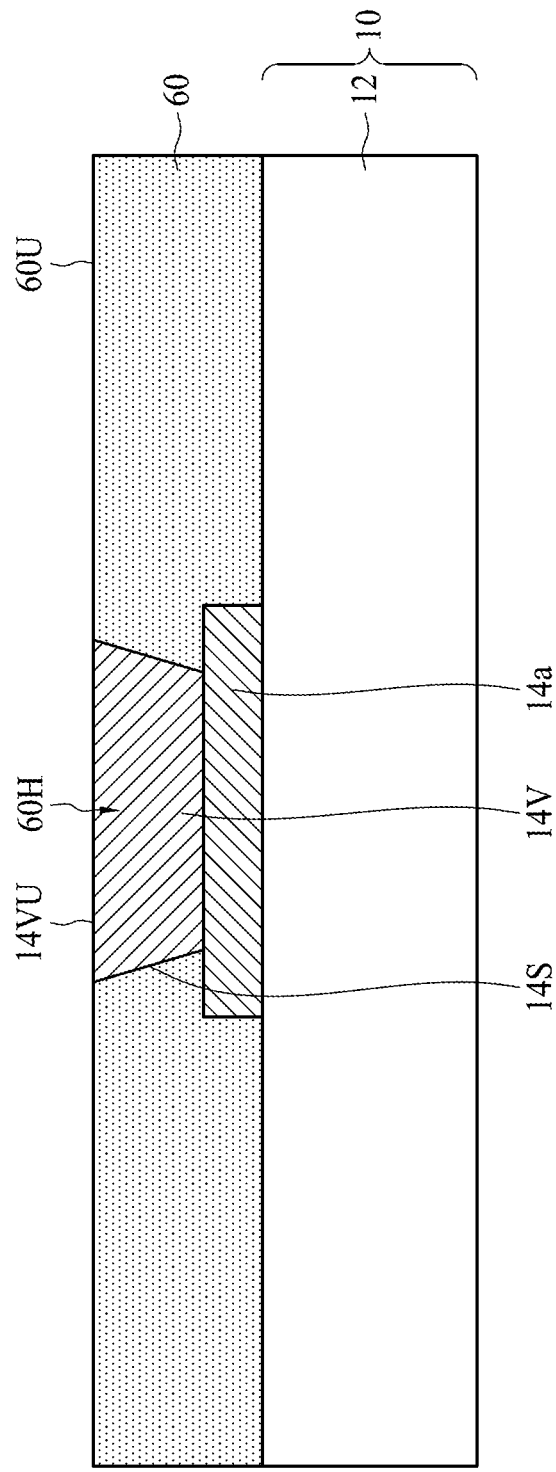
Figure 13C:
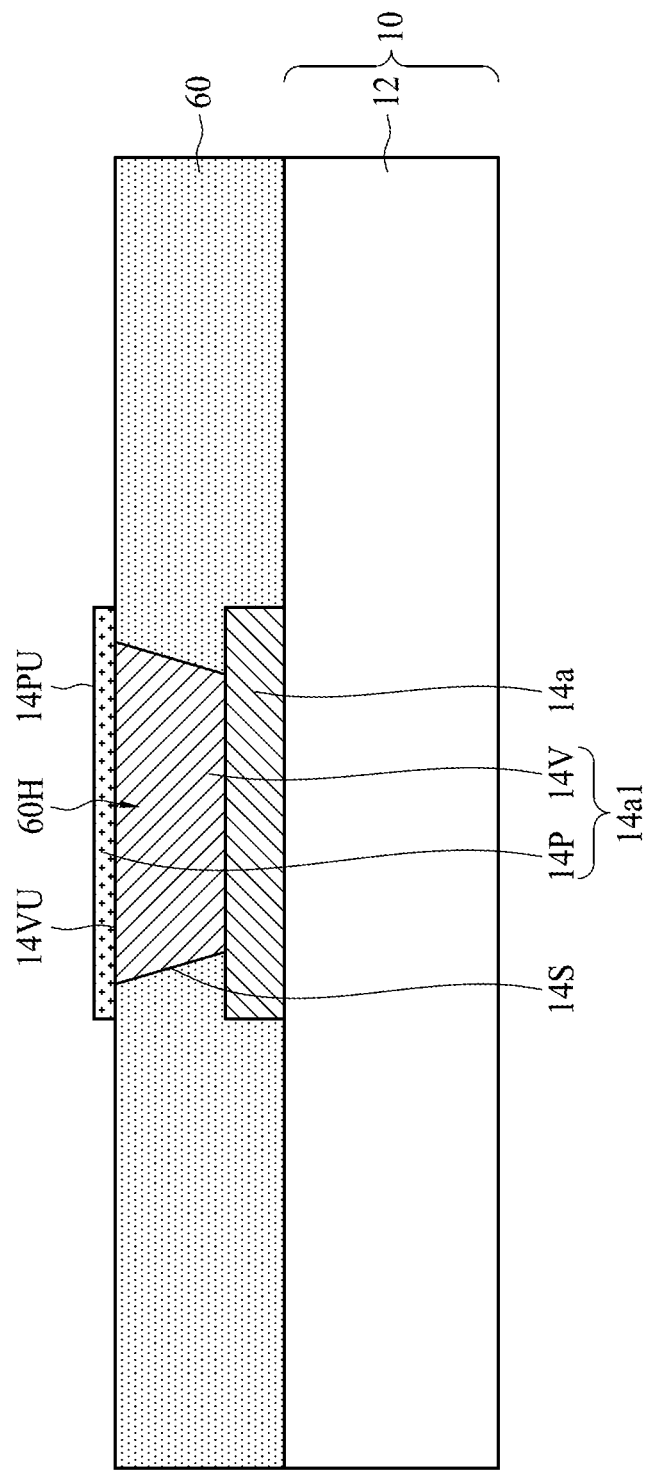

FIG. 13A, FIG. 13B and FIG. 13C illustrate operations of manufacturing a semiconductor device package 6 in accordance with some embodiments of the present disclosure. As shown FIG. 13A, a substrate such as a first conductive structure 10 is provided. A stress buffering structure 60 is formed on the substrate. The stress buffering structure 60 is perforated to form a hole 60H exposing the upper circuit layer 14a. The conductive wiring pattern 14a1 including a via portion 14V in the hole 60H, and a dummy pad pattern 14D on the stress buffering structure 60. In some embodiments, a seed layer 14S may be formed and configured as a seed layer for electroplating the conductive wiring pattern 14a1. As shown in FIG. 13B, the dummy pad portion 14D is removed from the via portion 14V. In some embodiments, the dummy pad portion 14D is removed by grinding, but is not limited thereto. After grinding, the upper surface 14VU of the via portion 14V is substantially coplanar with the upper surface 60U of the stress buffering structure 60 as shown in FIG. 12A. In some other embodiments, the dummy pad portion 14D is removed by etching. After etching, the upper surface 14VU of the via portion 14V is lower than the upper surface 60U of the stress buffering structure 60 as shown in FIG. 12B.

As shown in FIG. 13C, a new pad portion (also referred to a replacing pad portion) 14P is formed on the via portion 14V. The replacing pad portion 14P and the via portion 14V collectively form the conductive wiring pattern 14a1. The replacing pad portion 14P and the via portion 14V may be made of the same conductive material or different conductive materials, and an interface may exist between the replacing pad portion 14P and the via portion 14V. A passivation layer 32 is formed on the stress buffering structure 60 and the conductive wiring pattern 14a1, and one or more openings are formed in the passivation layer 32 exposing the upper surface 14PU of the conductive wiring pattern 14a1. Then, a circuit layer 42 is then built up on the second stress buffering layer 64 and electrically connected to the conductive wiring pattern 14a1 to form the semiconductor device package as shown in FIG. 12A or FIG. 12B.

In some embodiments of the present disclosure, the semiconductor device package includes passive electronic component embedded in the substrate, which can reduce overall thickness of the semiconductor device package. The active electronic component is vertically stacked on the passive electronic component. Accordingly, signal transmission path between the passive electronic component and the active electronic component can be shortened, and energy loss during signal transmission can be reduced. In addition, power consumption can be lowered, and performance can be improved. The semiconductor device package further includes a stress buffering layer disposed between the first conductive structure and the second conductive structure. The CTE of the stress buffering layer is between the CTE of the first conductive structure and the CTE of the second conductive such that warpage and delamination issue can be alleviated. The stress buffering layer can also be configured as a planarization layer for the first conductive structure, and thus the second conductive structure can be directly fabricated on the first conductive structure without requiring large-size solder balls. Accordingly, electric performance can be improved. The semiconductor device package further includes a patterned passivation layer disposed between the first conductive structure and the second conductive structure. The openings of the passivation layer allow conductive bumps of the second conductive structure to insert, and thus the robustness of bonding between the second conductive structure and the first conductive structure can be enhanced.

The passivation layer may be a photo-sensitive passivation layer, which can be patterned by photolithography operation, and thus the dimension of the opening can be minimized to for example lower than 50 micrometers. According, the number of I/O connections can be increased. In conclusion, the semiconductor device package of the present disclosure is a hybrid device package providing a solution to integrating low-density conductive structure such as conductive substrate, passive electronic component such as capacitor, high-density conductive structure such as fan-out circuit, and active electronic component such as ASIC component or memory component.

As used herein, the singular terms "a," "an," and "the" may include a plurality of referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if the difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein are described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations on the present disclosure.

What is claimed is:

1. A semiconductor device package, comprising:
   a carrier;
   a passive electronic component embedded in the carrier;
   a first conductive layer disposed over the carrier;
   a first dielectric layer disposed on the first conductive layer;
   a second dielectric layer arranged on the first dielectric layer; and
   a second conductive layer disposed over and electrically connected to the first conductive layer, wherein the second conductive layer extends through the first dielectric layer and the second dielectric layer, wherein the second conductive layer has a lower surface contacting the first dielectric layer, and the lower surface of the second conductive layer is closer to a top surface of the second dielectric layer than to a bottom surface of the first dielectric layer.

2. A semiconductor device package, comprising:
   a carrier;
   a conductive layer disposed over the carrier, wherein the conductive layer comprises a via portion and a pad portion, and the pad portion has a substantially consistent width greater than a width of the via portion;
   a first dielectric layer disposed over the carrier; and
   a second dielectric layer arranged over the first dielectric layer,
   wherein the first dielectric layer is around the via portion, and the second dielectric layer is around the pad portion; and
   wherein the pad portion of the conductive layer has a top surface facing away from the via portion and substantially co-level with a top surface of the second dielectric layer.

3. A method of manufacturing a semiconductor device package, comprising:
   providing a carrier;
   forming a first conductive layer on the carrier;
   forming a first dielectric layer on the first conductive layer;
   forming a conductive structure on the first dielectric layer;
   forming a second dielectric layer on the first dielectric layer and the conductive structure; and
   thinning the second dielectric layer to form a top surface of the second dielectric layer to expose the conductive structure, such that the top surface of the second dielectric layer is substantially co-level with a top surface of the conductive structure.

4. The semiconductor device package of claim 1, wherein the passive electronic component comprises a capacitor.

5. The semiconductor device package of claim 1, wherein the carrier defines a cavity, the passive electronic component is in the cavity, the semiconductor device package further comprises a filling material in the cavity and encapsulating the passive electronic component, and a top surface of the filling material substantially co-levels with a top surface of the carrier.

6. The semiconductor device package of claim 5, wherein the passive electronic component has a first lateral surface and a second lateral surface, the carrier has a first inner sidewall exposed to the cavity and facing the first lateral surface, the carrier further has a second inner sidewall exposed to the cavity and facing the second lateral surface, and a first distance between the first lateral surface and the first inner sidewall is less than a second distance between the second lateral surface and the second inner sidewall.

7. The semiconductor device package of claim 5, wherein the cavity penetrates the carrier.

8. The semiconductor device package of claim 5, wherein the carrier has a bottom surface opposite to the top surface of the carrier, and the filling material has a bottom surface opposite to the top surface of the filling material and substantially co-level with the bottom surface of the carrier.

9. The semiconductor device package of claim 1, wherein the first dielectric layer comprises a first portion without vertically overlapping the first conductive layer, the second dielectric layer comprises a second portion without vertically overlapping the second conductive layer, and the first portion is thicker than the second portion.

10. The semiconductor device package of claim 1, further comprising a low-density conductive structure including the second conductive layer and a high-density conductive structure on the first conductive layer.

11. The semiconductor device package of claim 2, wherein a bottom surface of the pad portion contacts the first dielectric layer, and a distance between the bottom surface of the pad portion and a bottom surface of the via portion in a first direction substantially perpendicular to the bottom surface of the pad portion is greater than a distance between the bottom surface of the pad portion and the top surface of the second dielectric layer in the first direction.

12. The semiconductor device package of claim 11, further comprising a first conductive via disposed over the top surface of the pad portion and having a bottom surface facing the via portion, wherein a width of the bottom surface of the first conductive via is less than a width of the bottom surface of the via portion in a cross-sectional view.

13. The semiconductor device package of claim 12, wherein the first conductive via is spaced apart from the second dielectric layer.

14. The semiconductor device package of claim 13, further comprising a second conductive via disposed over the top surface of the pad portion, and both the first conductive via and the second conductive via contact the pad portion.

15. The semiconductor device package of claim 12, wherein the pad portion has a center axis extending in the first direction, and the first conductive via has a center axis extending in the first direction and misaligned with the center axis of the pad portion in the cross-sectional view.

16. The semiconductor device package of claim 11, further comprising a circuit layer disposed under the via portion and horizontally overlapped with the first dielectric layer, wherein a thickness of the pad portion is less than a thickness of the circuit layer.

17. The method of claim 3, wherein thinning the second dielectric layer comprises grinding the second dielectric layer.

18. The method of claim 3, wherein thinning the second dielectric layer comprises removing an upper portion of the second dielectric layer, and a thickness of the upper portion is less than a thickness of a thinned second dielectric layer.

19. The method of claim 3, further comprising embedding a passive electronic component in the carrier earlier than thinning the second dielectric layer.

20. The method of claim 19, further comprising forming a cavity penetrating the carrier to accommodate the passive electronic component.

* * * * *